(12) United States Patent
Mihara

(10) Patent No.: US 10,211,213 B2
(45) Date of Patent: Feb. 19, 2019

(54) SEMICONDUCTOR DEVICE AND A MANUFACTURING METHOD THEREOF

(71) Applicant: Renesas Electronics Corporation, Koutou-ku, Tokyo (JP)

(72) Inventor: Tatsuyoshi Mihara, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/948,339

(22) Filed: Nov. 22, 2015

(65) Prior Publication Data

US 2016/0155747 A1 Jun. 2, 2016

(30) Foreign Application Priority Data

Nov. 27, 2014 (JP) .................................. 2014-240164

(51) Int. Cl.
  *H01L 27/115* (2017.01)
  *H01L 27/11517* (2017.01)
  (Continued)

(52) U.S. Cl.
  CPC .... *H01L 27/11517* (2013.01); *H01L 27/1157* (2013.01); *H01L 27/11563* (2013.01);
  (Continued)

(58) Field of Classification Search
  None
  See application file for complete search history.

(56) References Cited

U.S. PATENT DOCUMENTS 7,807,530 B2 * 10/2010 Shukuri ................. B82Y 10/00
                                                          438/257
9,520,504 B2    12/2016 Toba et al.
                (Continued)

FOREIGN PATENT DOCUMENTS

JP    2003-309193 A    10/2003
JP    2012-248652 A    12/2012
                  (Continued)

OTHER PUBLICATIONS

Extended European search report for European Patent Application No. 15191735.8, dated Sep. 23, 2016.
(Continued)

*Primary Examiner* — Ermias T Woldegeorgis
(74) *Attorney, Agent, or Firm* — Shapiro, Gabor and Rosenberger, PLLC

(57) ABSTRACT

The reliability and performances of a semiconductor device having a nonvolatile memory are improved. A selection gate electrode is formed over a semiconductor substrate via a first insulation film. Over the opposite side surfaces of the selection gate electrode, second insulation films of sidewall insulation films are formed. Over the semiconductor substrate, a memory gate electrode is formed via a third insulation film having a charge accumulation part. The selection gate electrode and the memory gate electrode are adjacent to each other via the second insulation film and the third insulation film. The second insulation film is not formed under the memory gate electrode. The total thickness of the second insulation film and the third insulation film interposed between the selection gate electrode and the memory gate electrode is larger than the thickness of the third insulation film interposed between the semiconductor substrate and the memory gate electrode.

20 Claims, 34 Drawing Sheets

(51) Int. Cl.
   *H01L 27/11563* (2017.01)
   *H01L 29/423* (2006.01)
   *H01L 29/66* (2006.01)
   *H01L 29/792* (2006.01)
   *H01L 27/11565* (2017.01)
   *H01L 27/1157* (2017.01)

(52) U.S. Cl.
   CPC .. *H01L 27/11565* (2013.01); *H01L 29/42344* (2013.01); *H01L 29/66833* (2013.01); *H01L 29/792* (2013.01)

(56) References Cited

U.S. PATENT DOCUMENTS

2003/0166320 A1* 9/2003 Kasuya ............... H01L 27/105
                                                       438/257
2003/0198086 A1* 10/2003 Shukuri ............... B82Y 10/00
                                                       365/185.18
2009/0090962 A1   4/2009 Kikuchi
2012/0299084 A1* 11/2012 Saito ................ H01L 21/28282
                                                       257/324
2013/0082315 A1   4/2013 Hosoda et al.

FOREIGN PATENT DOCUMENTS

JP   2013-93546 A    5/2013
JP   2014-168002 A   9/2014

OTHER PUBLICATIONS

Office Action, dated May 23, 2017, in European Patent Application No. 15191735.8.
Office Action, issued Feb. 27, 2018, in Japanese Application No. 2014-240164.

* cited by examiner

FIG. 6

| | OPERATION METHOD WRITE/ERASE | WRITE OPERATION VOLTAGE (V) Vmg/Vs/Vsg/Vd/Vb | ERASE OPERATION VOLTAGE (V) Vmg/Vs/Vsg/Vd/Vb | READ OPERATION VOLTAGE (V) Vmg/Vs/Vsg/Vd/Vb |
|---|---|---|---|---|
| A | SSI (WRITE)/BTBT (ERASE) | 10/5/1/0.5/0 | -6/6/0/open/0 | 0/0/1.5/1.5/0 |
| B | SSI (WRITE)/FN (ERASE) | 10/5/1/0.5/0 | 12/0/0/0/0 | 0/0/1.5/1.5/0 |
| C | FN (WRITE)/BTBT (ERASE) | -12/0/0/0/0 | -6/6/0/open/0 | 0/0/1.5/1.5/0 |
| D | FN (WRITE)/FN (ERASE) | -12/0/0/0/0 | 12/0/0/0/0 | 0/0/1.5/1.5/0 |

SEMICONDUCTOR DEVICE AND A MANUFACTURING METHOD THEREOF

CROSS-REFERENCE TO RELATED APPLICATIONS

The disclosure of Japanese Patent Application No. 2014-240164 filed on Nov. 27, 2014 including the specification, drawings, and abstract is incorporated herein by reference in its entirety.

BACKGROUND

The present invention relates to a semiconductor device and a manufacturing method thereof. More particularly, the present invention is preferably applicable to a semiconductor device having a nonvolatile memory, and a manufacturing method thereof.

As electrically writable/erasable nonvolatile semiconductor storage devices, EEPROMs (Electrically Erasable and Programmable Read Only Memories) have been widely used. The storage devices typified by currently and widely used flash memories have conductive floating gate electrodes surrounded by an oxide film, or trapping insulation films under gate electrodes of MISFETs. The storage devices use charge accumulation states at the floating gates and the trapping insulation film as stored information, and read out the information as a threshold value of each transistor. The trapping insulation film denotes an insulation film capable of accumulating electric charges. As one example thereof, mention may be made of a silicon nitride film. Implantation/discharge of charges into such charge accumulation regions causes each MISFET to be shifted in threshold value and to operate as a storage element. The flash memories include a split gate type cell using a MONOS (Metal-Oxide-Nitride-Oxide-Semiconductor) film. Such a memory has the following advantages: use of a silicon nitride film as a charge accumulation region leads to an excellent data holding reliability because electric charges are accumulated discretely as compared with a conductive floating gate, and the excellent data holding reliability can reduce the film thickness of the oxide films over and under the silicon nitride film, which enables a lower voltage for write/erase operation; and other advantages.

Japanese Unexamined Patent Application Publication No. 2013-93546 (Patent Document 1) describes the technology regarding a split gate type memory.

PATENT DOCUMENT

[Patent Document 1] Japanese Unexamined Patent Application Publication No. 2013-93546

SUMMARY

A semiconductor device having a nonvolatile memory is also expected to be improved in reliability as much as possible. Alternatively, the semiconductor device is expected to be improved in performances. Still alternatively, the semiconductor device is expected to be improved in reliability, and to be improved in performances.

Other objects and novel features of the present invention will be apparent from the description of this specification and the accompanying drawings.

In accordance with one embodiment, a semiconductor device has a semiconductor substrate, a first gate electrode formed over the semiconductor substrate, a first sidewall insulation film formed over a first side surface of the first gate electrode, a second sidewall insulation film formed over a second side surface of the first gate electrode opposite to the first side surface thereof, and a first gate insulation film formed between the first gate electrode and the semiconductor substrate. The semiconductor device further has a second gate electrode formed on the first side surface side of the first gate electrode, and extending together with the first gate electrode over the semiconductor substrate, and a second gate insulation film having a charge accumulation part formed between the second gate electrode and the semiconductor substrate. The first gate electrode and the second gate electrode are adjacent to each other via the first sidewall insulation film and the second gate insulation film. The first sidewall insulation film is situated on the first gate electrode side, and the second gate insulation film is situated on the second gate electrode side. The first sidewall insulation film is not formed under the second gate electrode. The first sidewall insulation film and the second sidewall insulation film are integrally formed. Then, a total second thickness of the first sidewall insulation film and the second gate insulation film interposed between the first gate electrode and the second gate electrode is larger than a first thickness of the second gate insulation film interposed between the semiconductor substrate and the second gate electrode.

Further, in accordance with another embodiment, a method for manufacturing a semiconductor device includes the steps of: forming a first gate electrode over a semiconductor substrate via a first gate insulation film; and forming a first sidewall insulation film over a first side surface of the first gate electrode, and forming a second sidewall insulation film over a second side surface of the first gate electrode opposite to the first side surface thereof. The method for manufacturing a semiconductor device further includes a step of forming a second gate electrode over the semiconductor substrate via a second gate insulation film having a charge accumulation part. In this step, the second gate electrode is formed on the first side surface side of the first gate electrode in such a manner as to be adjacent to the first gate electrode via the first sidewall insulation film and the second gate insulation film. The method for manufacturing a semiconductor device further includes the steps of: performing ion implantation using the first gate electrode and the second sidewall insulation film as a mask, and thereby forming a first semiconductor region of a first conductivity type in the semiconductor substrate; and forming a first sidewall spacer over the second side surface of the first gate electrode via the second sidewall insulation film. The method for manufacturing a semiconductor device further includes a step of performing ion implantation using the first sidewall spacer as a mask, and thereby forming a second semiconductor region with a higher impurity concentration than that of the first semiconductor region, and of the first conductivity type in the semiconductor substrate. Then, a total second thickness of the first sidewall insulation film and the second gate insulation film interposed between the first gate electrode and the second gate electrode is larger than a first thickness of the second gate insulation film interposed between the semiconductor substrate and the second gate electrode.

Still further, in accordance with a still other embodiment, the method for manufacturing a semiconductor device includes the steps of: forming a first dummy gate electrode over a semiconductor substrate via a first gate insulation film; and forming a first sidewall insulation film over a first side surface of the first dummy gate electrode, and forming a second sidewall insulation film over a second side surface of the first dummy gate electrode opposite to the first side surface thereof. The method for manufacturing a semiconductor device further includes a step of forming a second dummy gate electrode over the semiconductor substrate via a second gate insulation film having a charge accumulation part. In this step, the second dummy gate electrode is formed on the first side surface side of the first dummy gate electrode in such a manner as to be adjacent to the first dummy gate electrode via the first sidewall insulation film and the second gate insulation film. The method for manufacturing a semiconductor device further includes the steps of: performing ion implantation using the first dummy gate electrode and the second sidewall insulation film as a mask, and thereby forming a first semiconductor region of a first conductivity type in the semiconductor substrate; and forming a first sidewall spacer over the second side surface of the first dummy gate electrode via the second sidewall insulation film. The method for manufacturing a semiconductor device further includes a step of performing ion implantation using the first sidewall spacer as a mask, and thereby forming a second semiconductor region with a higher impurity concentration than that of the first semiconductor region, and of the first conductivity type in the semiconductor substrate. The method for manufacturing a semiconductor device further includes the steps of: forming an interlayer insulation film over the semiconductor substrate in such a manner as to cover the first dummy gate electrode, the second dummy gate electrode, the first sidewall insulation film, the second sidewall insulation film, and the first sidewall spacer; and polishing the interlayer insulation film, and removing the first dummy gate electrode and the second dummy gate electrode. The method for manufacturing a semiconductor device further includes a step of a first gate electrode in a first trench of a region resulting from removal of the first dummy gate electrode, and forming a second gate electrode in a second trench of a region resulting from removal of the second dummy gate electrode. Then, a total second thickness of the first sidewall insulation film and the second gate insulation film interposed between the first dummy gate electrode and the second dummy gate electrode is larger than a first thickness of the second gate insulation film interposed between the semiconductor substrate and the second dummy gate electrode.

In accordance with one embodiment, it is possible to improve the reliability of a semiconductor device.

Alternatively, it is possible to improve the performances of the semiconductor device.

Still alternatively, it is possible to improve the reliability of a semiconductor device, and to improve the performances thereof.

BRIEF DESCRIPTION OF THE DRAWINGS

FIG. 6 is a table showing one example of the application conditions of a voltage to each part of a selection memory cell at the times of "write", "erase", and "read";

DETAILED DESCRIPTION

Figure 1:
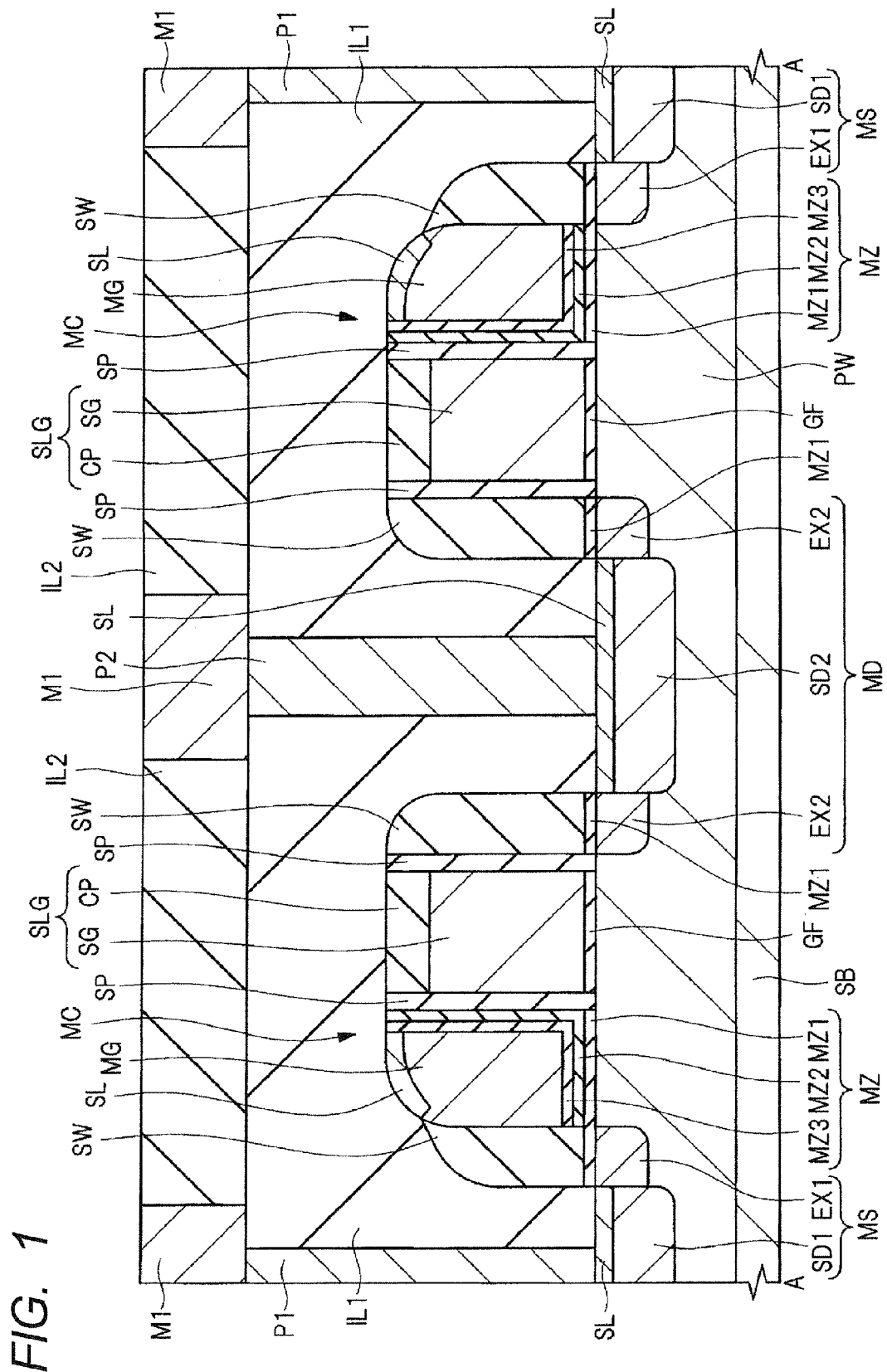
FIG. 1 is an essential part cross sectional view of a semiconductor device of one embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases. Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the following embodiments, those having the same function are given the same reference signs and numerals, and a repeated description thereon is omitted. Further, in the following embodiments, a description on the same or similar part will not be repeated in principle unless otherwise required.

Further, in drawings for use in the embodiments, hatching may be omitted even in cross section for ease of understanding of the drawing. Whereas, hatching may be added even in plan view for ease of understanding of the drawing.

First Embodiment

<Regarding a Structure of a Semiconductor Device>

Each semiconductor device of the present embodiment and the following embodiments is a semiconductor device including a nonvolatile memory (nonvolatile storage element, flash memory, or nonvolatile semiconductor storage device). The nonvolatile memory mainly uses a trapping insulation film (charge accumulable insulation film) as a charge accumulation part. In the present embodiment and the following embodiments, a nonvolatile memory will be described with reference to a memory cell based on an n channel type MISFET (MISFET: Metal Insulator Semiconductor Field Effect Transistor). Further, the polarities (the polarity of applied voltage and the polarity of carriers for write/erase/read) in the present embodiment and the following embodiments are for describing the operation in the case of a memory cell based on an n channel type MISFET. When a memory cell is based on a p channel type MISFET, by inverting all the polarities of applied potentials, the conductivity type of carriers, and the like, it is possible to obtain the same operation in principle.

Figure 2:
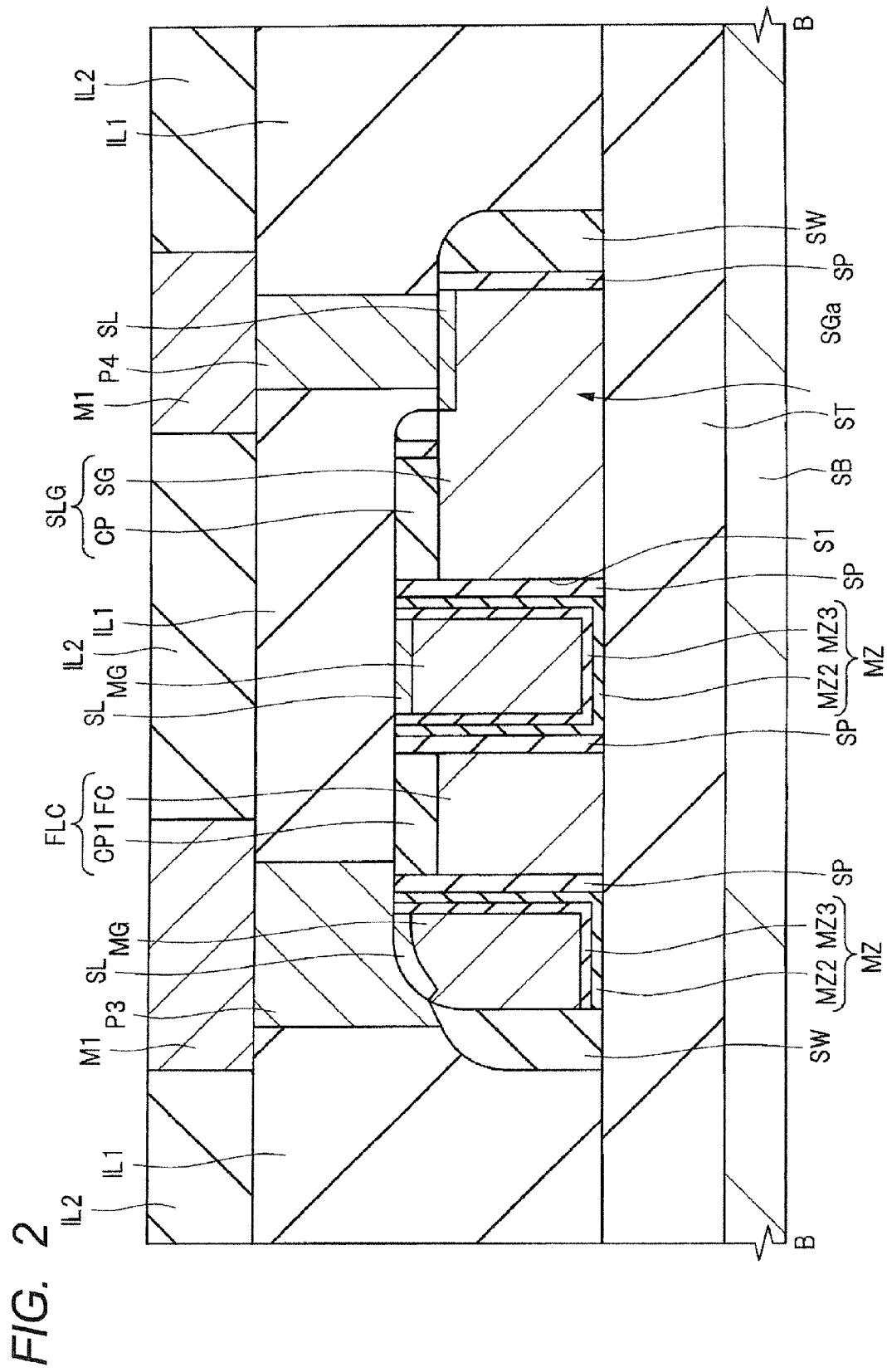
FIG. 2 is an essential part cross sectional view of the semiconductor device of one embodiment.
Figure 3:
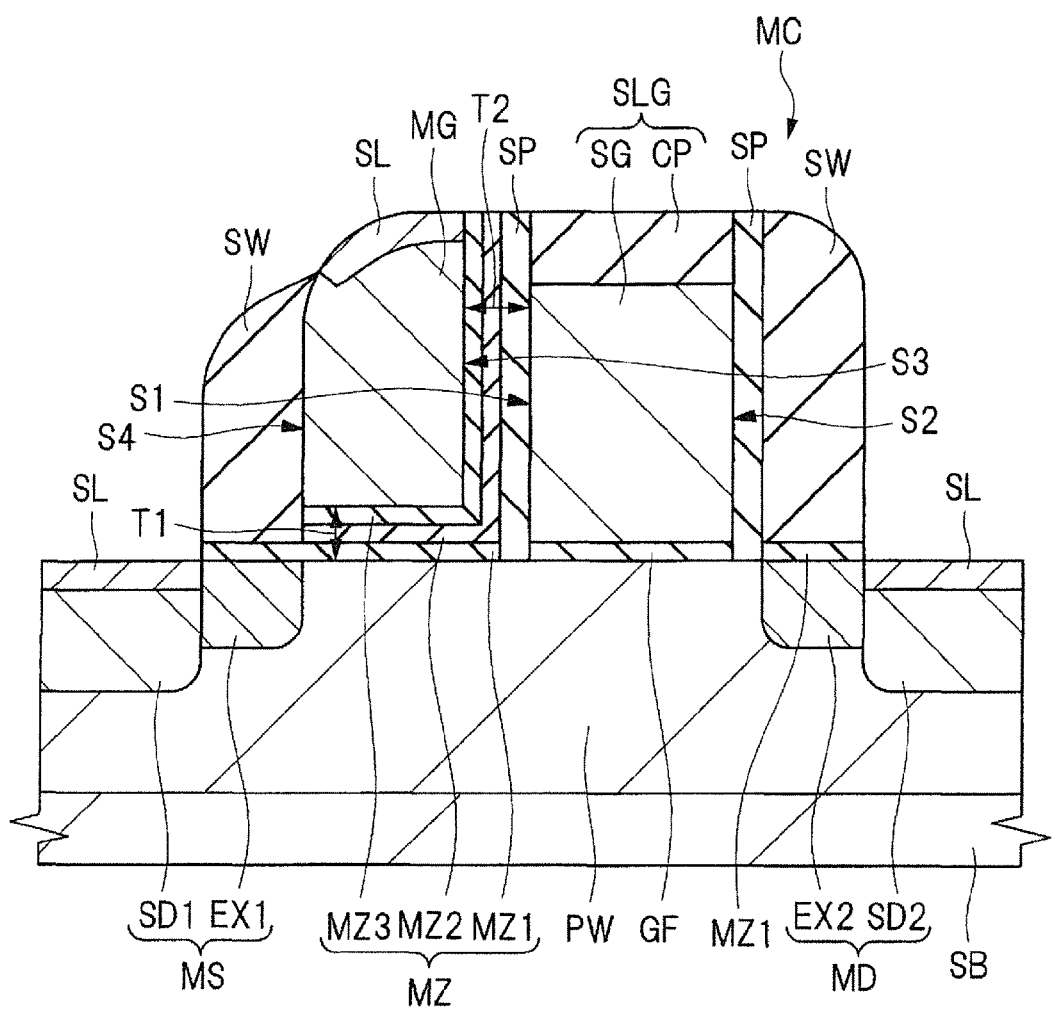
FIG. 3 is an essential part cross sectional view of the semiconductor device of one embodiment.
Figure 4:
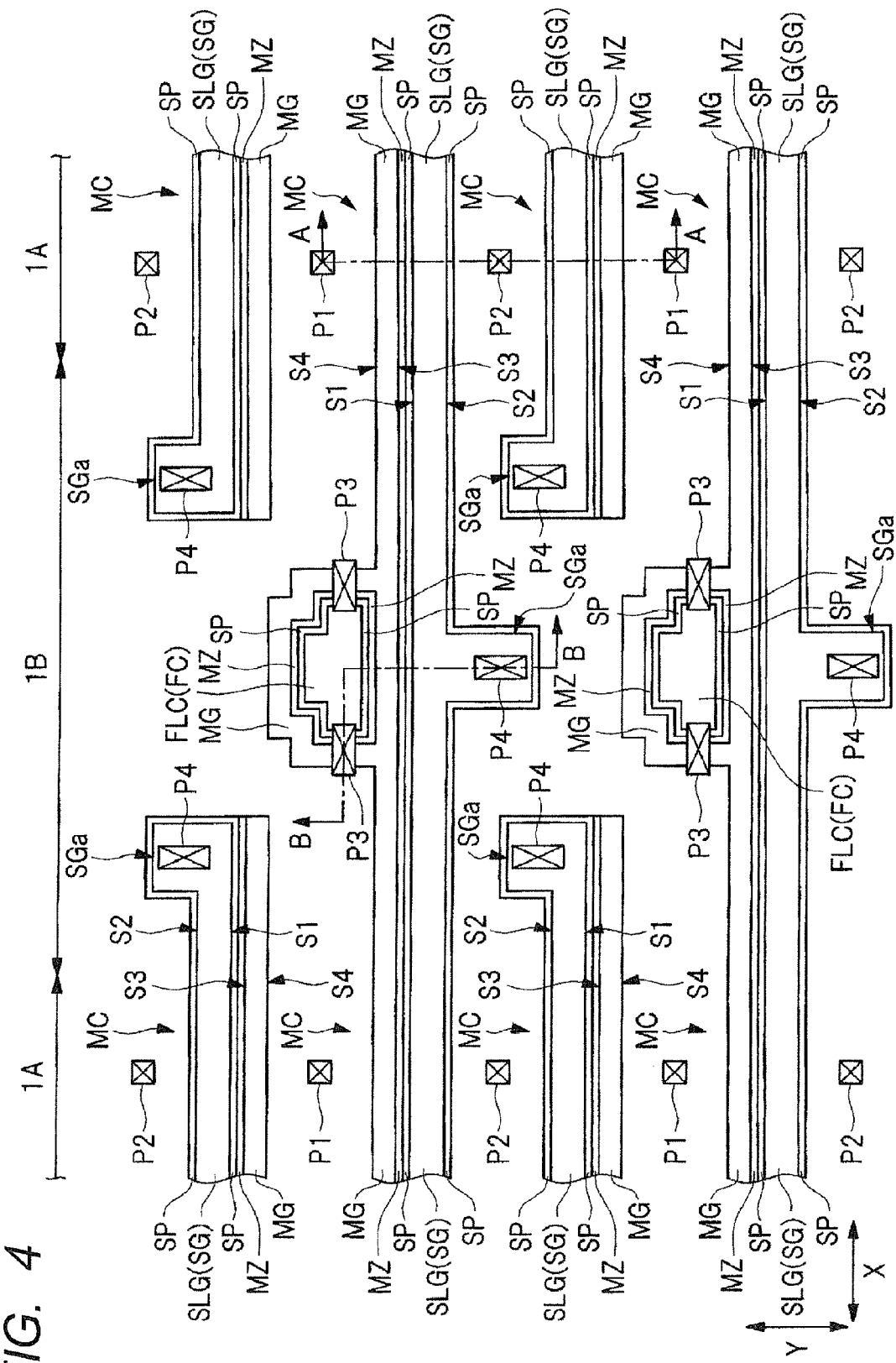
FIG. 4 is an essential part plan view of the semiconductor device of one embodiment.

The semiconductor device of the present embodiment will be described by reference to the accompanying drawings. FIGS. 1 to 3 are each an essential part cross sectional view of the semiconductor device of the present embodiment. FIG. 4 is an essential part plan view of the semiconductor device of the present embodiment. The cross section along line A-A of FIG. 4 roughly corresponds to FIG. 1. The cross section along line B-B of FIG. 4 roughly corresponds to FIG. 2. Whereas, FIG. 3 shows a cross sectional region (a cross sectional region for one memory cell) corresponding to the left half part of FIG. 1. However, FIG. 3 shows a semiconductor substrate SB, a p type well PW, insulation films GF, MZ, and SP, a selection gate electrode SG, a memory gate electrode MG, a cap insulation film CP, semiconductor regions MS and MD, sidewall spacers SW, and a metal silicide layer SL, but does not show an interlayer insulation film IL1, plugs P1 and P2, an insulation film IL2, and a wire M1. Further, for ease of understanding, the plan view of FIG. 4 shows a planar layout of a selection gate SLG (selection gate electrode SG), a memory gate electrode MG, a selection gate FLC (selection gate electrode FC), insulation films SP and MZ, and plugs P1, P2, P3, and P4, and does not show other constituent elements.

The semiconductor device of the present embodiment shown in FIGS. 1 to 4 is a semiconductor device including a nonvolatile memory.

MISFETs forming the memory cell of the nonvolatile memory are formed in a memory cell region 1A of a semiconductor substrate (semiconductor wafer) SB formed of a p type single crystal silicon having a specific resistance of, for example, about 1 to 10 Ωcm.

Element isolation regions ST for isolating elements are formed in the semiconductor substrate SB. A p type well PW is formed in an active region separated (defined) by the element isolation regions ST.

In the p type well PW in the memory cell region 1A, a memory cell MC of a nonvolatile memory formed of a memory transistor and a selection transistor (control transistor) is formed. FIG. 1 shows cross sectional views of two memory cells MC having an $n^+$ type semiconductor region SD2 (drain region) in common. The cross sectional view of one memory cell MC of these is shown in FIG. 3. In the memory cell region 1A, a plurality of memory cells MC are formed in an array. The memory cell region 1A is electrically isolated from other regions by the element isolation regions ST. Namely, the memory cell region 1A corresponds to the region in which a plurality of memory cells MC are formed (arranged or arrayed) in an array at the main surface of the semiconductor substrate SB.

The memory cell MC of the nonvolatile memory formed in the memory cell region 1A is a split gate type memory cell, and includes two MISFETs of a selection transistor (control transistor) having a selection gate electrode (control gate electrode) SG, and a memory transistor having a memory gate electrode MG, coupled with each other.

Herein, the MISFET having a gate insulation film including a charge accumulation part (charge accumulation layer), and the memory gate electrode MG is referred to as a memory transistor (a transistor for storage). Whereas, the MISFET having a gate insulation film and the selection gate electrode SG is referred to as a selection transistor (a transistor for memory cell selection or a control transistor). Therefore, the memory gate electrode MG is the gate electrode of the memory transistor. The selection gate electrode SG is the gate electrode of the selection transistor. The selection gate electrode SG and the memory gate electrode MG are the gate electrodes forming (the memory cell of) the nonvolatile memory.

Below, the configuration of the memory cell MC will be described specifically.

As shown in FIGS. 1 and 3, the memory cell MC of the nonvolatile memory has n type semiconductor regions MS and MD for source or drain formed in the p type well PW of the semiconductor substrate SB, a selection gate electrode SG formed over the semiconductor substrate SB (p type well PW), and a memory gate electrode MG formed over the semiconductor substrate SB (p type well PW), and adjacent to the selection gate electrode SG. The memory cell MC of the nonvolatile memory further has an insulation film (gate insulation film) GF formed between the selection gate electrode SG and the semiconductor substrate SB (p type well PW), an insulation film (sidewall insulation film) SP formed at each opposite side of the selection gate electrode SG, and an insulation film MZ formed between the memory gate electrode MG and the semiconductor substrate SB (p type well PW) and between the memory gate electrode MG and the selection gate electrode SG. The memory cell MC of the nonvolatile memory further has sidewall spacers SW formed over the side surfaces on the sides of the memory gate electrode MG and the selection gate electrode SG not adjacent to each other. The memory gate electrode MG of each memory cell MC forms the word line of each memory cell MC.

Over the selection gate electrode SG, a cap insulation film CP is formed. The lamination body formed of the selection gate electrode SG and the cap insulation film CP over the selection gate electrode SG will be hereinafter referred to as a selection gate SLG. As another form, the cap insulation film CP may not be formed over the selection gate electrode SG. Below, a description will be given to the case where the cap insulation film CP is formed over the selection gate electrode SG. However, when the cap insulation film CP is not formed, the whole selection gate SLG serves as the selection gate electrode SG. Therefore, when the cap insulation film CP is not formed, in the following description, the "selection gate SLG" can be read as the "selection gate electrode SG".

The selection gate SLG and the memory gate electrode MG extend and are arranged side by side along the main surface of the semiconductor substrate SB with the insulation film SP and the insulation film MZ interposed between their respective opposed side surfaces (sidewalls). The direction of extension of the selection gate SLG and the memory gate electrode MG is the direction perpendicular to the paper plane of FIGS. 1 and 3, namely, the X direction shown in FIG. 4. The selection gate SLG and the memory gate electrode MG are formed over the semiconductor substrate SB (p type well PW) between the semiconductor region MD and the semiconductor region MS with the insulation film GF or the insulation film MZ interposed therebetween. The memory gate electrode MG is situated on the semiconductor region MS side, and the selection gate SLG is situated on the semiconductor region MD side. However, the selection gate SLG and the memory gate electrode MG are formed over the semiconductor substrate SB (p type well PW) via the insulation film GF and the insulation film MZ, respectively.

The selection gate SLG and the memory gate electrode MG are adjacent to each other with the insulation film SP and the insulation film MZ interposed therebetween. The memory gate electrode MG is formed in a sidewall spacer form over the side surface (sidewall) of the selection gate SLG via the insulation film SP and the insulation film MZ. Below, the "sidewall spacer form" may be referred to as the "sidewall form". The insulation film MZ extends over both the regions of the region between the memory gate electrode MG and the semiconductor substrate SB (p type well PW), and the region between the memory gate electrode MG and the selection gate SLG.

Incidentally, the insulation film SP and the insulation film MZ are interposed between the memory gate electrode MG and the selection gate SLG. Thus, between the memory gate electrode MG and the selection gate SLG, the insulation film SP is present on the selection gate SLG side, and the insulation film MZ is present on the memory gate electrode MG side. Namely, the lamination structure (lamination film) of the insulation film SP and the insulation film MZ is interposed between the memory gate electrode MG and the selection gate SLG. Thus, the insulation film SP is adjacent to the selection gate SLG, and the insulation film MZ is adjacent to the memory gate electrode MG. For this reason, the insulation film MZ at a portion thereof situated between the memory gate electrode MG and the selection gate SLG is interposed between the insulation film SP and the memory gate electrode MG. The insulation film SP at a portion thereof situated between the memory gate electrode MG and the selection gate SLG is interposed between the insulation film MZ and the selection gate SLG.

The insulation film GF formed between the selection gate SLG and the semiconductor substrate SB (p type well PW), namely, the insulation film GF under the selection gate SLG functions as a gate insulation film of the selection transistor.

The insulation film GF can be formed of, for example, a silicon oxide film or a silicon oxynitride film. Alternatively, for the insulation film GF, other than the silicon oxide film, the silicon oxynitride film, or the like, a high dielectric constant insulation film having a higher dielectric constant than that of a silicon nitride film, such as a hafnium oxide film, an aluminum oxide film (alumina), or a tantalum oxide film may be used.

Whereas, the insulation film MZ extending in the region between the memory gate electrode MG and the semiconductor substrate SB (p type well PW), and the region between the memory gate electrode MG and the selection gate SLG can be regarded as a gate insulation film (a lamination gate insulation film or a gate insulation film of a lamination structure). However, the insulation film MZ between the memory gate electrode MG and the semiconductor substrate SB (p type well PW), namely, the insulation film MZ under the memory gate electrode MG functions as the gate insulation film of the memory transistor. However, the insulation film MZ between the memory gate electrode MG and the selection gate SLG functions as an insulation film for establishing an insulation (electrical isolation) between the memory gate electrode MG and the selection gate SLG.

The insulation film MZ is a lamination insulation film, and is formed of a lamination film having an insulation film MZ1, an insulation film MZ2 over the insulation film MZ1, and an insulation film MZ3 over the insulation film MZ2. Herein, the insulation film MZ1 is formed of a silicon oxide film (oxide film); the insulation film MZ2 is formed of a silicon nitride film (nitride film); and the insulation film MZ3 is formed of a silicon oxide film (oxide film).

Incidentally, of the insulation film MZ, the insulation film MZ at a portion thereof situated between the memory gate electrode MG and the semiconductor substrate SB (p type well PW) is formed of a lamination film of an insulation film MZ1 over the semiconductor substrate SB (p type well PW), an insulation film MZ2 over the insulation film MZ1, and an insulation film MZ3 over the insulation film MZ2. Namely, the insulation film MZ at a portion thereof situated between the memory gate electrode MG and the semiconductor substrate SB (p type well PW) has a structure in which the insulation film MZ2 is interposed between the insulation film MZ1 and the insulation film MZ3. On the other hand, the insulation film MZ at a portion thereof situated between the memory gate electrode MG and the selection gate SLG does not have the insulation film MZ1, and is formed of a lamination film of the insulation film MZ2 and the insulation film MZ3.

In other words, the insulation film MZ2 and the insulation film MZ3 of the insulation film MZ extend over both the regions of the region between the memory gate electrode MG and the semiconductor substrate SB (p type well PW), and the region between the memory gate electrode MG and the selection gate SLG. On the other hand, the insulation film MZ1 of the insulation film MZ is formed between the memory gate electrode MG and the semiconductor substrate SB (p type well PW), but is not formed between the memory gate electrode MG and the selection gate SLG.

Accordingly, a lamination film of the insulation film MZ1, the insulation film MZ2, and the insulation film MZ3 is interposed between the memory gate electrode MG and the semiconductor substrate SB (p type well PW). On the other hand, the insulation film SP and the lamination film of the insulation film MZ2 and the insulation film MZ3 are interposed between the memory gate electrode MG and the selection gate SLG. Between the memory gate electrode MG and the semiconductor substrate SB (p type well PW), the insulation film MZ1, the insulation film MZ2, and the insulation film MZ3 are stacked in this order from the semiconductor substrate SB side to the memory gate electrode MG side. On the other hand, between the selection gate SLG and the memory gate electrode MG, the insulation film SP, the insulation film MZ2, and the insulation film MZ3 are stacked in this order from the selection gate SLG side to the memory gate electrode MG side.

Of the insulation film MZ, the insulation film MZ2 is an insulation film having a charge accumulation function. Namely, of the insulation film MZ, the insulation film MZ2 is an insulation film for accumulating electric charges, and can function as a charge accumulation layer (charge accumulation part). In other words, the insulation film MZ2 is a trapping insulation film. Herein, the trapping insulation film denotes an insulation film capable of accumulating electric charges. Thus, as the insulation film having a trap level, the insulation film MZ2 is used. For this reason, the insulation film MZ can be regarded as an insulation film having a charge accumulation part (herein, the insulation film MZ2).

Of the insulation film MZ, the insulation film MZ3 and the insulation film MZ1 can each function as a charge block layer or a charge confining layer for confining electric charges in the trapping insulation film. By adopting a structure in which the insulation film MZ2 of the trapping insulation film is interposed between the insulation films MZ1 and MZ3 each functioning as a charge block layer, it becomes possible to accumulate electric charges into the insulation film MZ2.

The insulation film MZ functions as the gate insulation film of the memory transistor, and has a charge holding (charge accumulation) function. Therefore, the insulation film MZ between the memory gate electrode MG and the semiconductor substrate SB has a lamination structure of at least three layers so as to function as a gate insulation film having a charge holding function of the memory transistor. As compared with the potential barrier heights of the outer layers (the insulation films MZ1 and MZ3) functioning as charge block layers, the potential barrier height of the inner layer (insulation film MZ2) functioning as a charge accumulation part is lower. This can be implemented in the following manner: the insulation film MZ1 is formed of a silicon oxide film; the insulation film MZ2 is formed of a silicon nitride film; and the insulation film MZ3 is formed of a silicon oxide film.

Respective band gaps of the insulation film MZ3 and the insulation film MZ1 are required to be larger than the band gap of the charge accumulation layer (herein, the insulation film MZ2) between the insulation film MZ3 and the insulation film MZ1. Namely, respective band gaps of the insulation film MZ1 and the insulation film MZ3 are larger than the band gap of the insulation film MZ2 of the trapping insulation film. With such a configuration, the insulation film MZ3 and the insulation film MZ1 interposing the insulation film MZ2 as a charge accumulation layer can each function as a charge block layer. A silicon oxide film has a larger band gap than the band gap of a silicon nitride film. For this reason, it is possible to adopt a silicon nitride film as the insulation film MZ2, and to adopt silicon oxide films as the insulation film MZ1 and the insulation film MZ3, respectively.

Further, the band gap of the insulation film SP is preferably larger than the band gap of the insulation film MZ2. This is due to the following: in order to suppress or prevent the electric charges implanted or accumulated in the insulation film MZ2 from passing through the insulation film SP, and going out toward the selection gate electrode SG side, the insulation film SP desirably also has a function as a charge block layer. For this reason, the insulation film SP is more preferably formed of the same material as that for the insulation film MZ1 functioning as a charge block layer. Therefore, a silicon oxide film can be preferably used as the insulation film SP.

Whereas, the total thickness (thickness) T2 of the insulation film SP and the insulation film MZ interposed between the selection gate electrode SG and the memory gate electrode MG is larger than the thickness T1 of the insulation film MZ interposed between the semiconductor substrate SB (p type well PW) and the memory gate electrode MG (T1<T2). This can be implemented by setting the thickness of the insulation film SP larger than the thickness of the insulation film MZ1. This can improve the breakdown voltage between the memory gate electrode MG and the selection gate SLG. Incidentally, the thicknesses T1 and T2 are shown in FIG. 3. The thickness T2 corresponds to the sum of the thickness of the insulation film SP and the thickness of the insulation film MZ between the selection gate electrode SG and the memory gate electrode MG.

The semiconductor region MS is a semiconductor region functioning as one of the source region or the drain region. The semiconductor region MD is a semiconductor region functioning as the other of the source region or the drain region. Herein, the semiconductor region MS is a semiconductor region functioning as the source region, and the semiconductor region MD is a semiconductor region functioning as the drain region. The semiconductor regions MS and MD are each formed of a semiconductor region doped with an n type impurity (n type impurity diffusion layer), and each include a LDD (lightly doped drain) structure. Namely, the semiconductor region MS for source has an $n^-$ type semiconductor region EX1, and an $n^+$ type semiconductor region SD1 having a higher impurity concentration than that of the $n^-$ type semiconductor region EX1. The semiconductor region MD for drain has an $n^-$ type semiconductor region EX2, and an $n^+$ type semiconductor region SD2 having a higher impurity concentration than that of the $n^-$ type semiconductor region EX2. The $n^+$ type semiconductor region SD1 is larger in junction depth, and higher in impurity concentration than the $n^-$ type semiconductor region EX1. Whereas, the $n^+$ type semiconductor region SD2 is larger in junction depth and higher in impurity concentration than the $n^-$ type semiconductor region EX2.

Also apparent from FIG. 4, a plurality of the memory cells MC of the nonvolatile memory are arranged in an array at the main surface of the semiconductor substrate SB (more specifically, in the memory cell region 1A). Of the plurality of memory cells MC arranged in an array (in rows) in the X direction and the Y direction, the selection gate electrodes SG (selection gates SLG) of the memory cells MC arranged in the X direction are coupled with one another in the X direction, and are formed integrally. Namely, one line of selection gate electrodes SG (selection gates SLG) extending in the X direction form the selection gate electrodes of the plurality of memory cells MC arrayed in the X direction. A plurality of the selection gate electrodes SG (selection gates SLG) extending in the X direction are arrayed and arranged in the Y direction. Therefore, respective selection gate electrodes SG (selection gates SLG) extend in the X direction, and serve as the selection gate electrodes of a plurality of memory cells MC arrayed in the X direction, and a selection gate line for electrically coupling the selection gate electrodes of the plurality of memory cells MC arrayed in the X direction.

Further, of the plurality of memory cells MC arranged in an array in the X direction and the Y direction, the memory gate electrodes MG of the memory cells MC arrayed in the X direction are coupled with one another in the X direction, and are formed integrally. Namely, one line of memory gate electrodes MG extending in the X direction form the memory gate electrodes of a plurality of memory cells MC arrayed in the X direction. A plurality of the memory gate electrodes MG extending in the X direction are arrayed and arranged in the Y direction. Therefore, respective memory gate electrodes MG extend in the X direction, and serve as the memory gate electrodes of a plurality of memory cells MC arrayed in the X direction, and a memory gate line for electrically coupling the memory gate electrodes of a plurality of memory cells MC arrayed in the X direction. As described above, the memory gate electrode MG is adjacent to the selection gate electrode SG (selection gate SLG) via the insulation film SP and the insulation film MZ.

Incidentally, the X direction and the Y direction shown in FIG. 4 are directions in parallel with the main surface of the semiconductor substrate SB. The Y direction is a direction crossing with the X direction. The Y direction is preferably a direction orthogonal to the X direction.

Of a plurality of memory cells MC arranged in an array in the X direction and the Y direction, the memory cells MC adjacent to each other in the Y direction via the semiconductor region MD of the drain region have the semiconductor region MD of the drain region in common as also apparent from FIG. 1 or FIG. 4. Whereas, the memory cells MC adjacent to each other in the Y direction via the semiconductor region MS of the source region have the semiconductor region MS of the source region in common.

Insulation films SP are formed over the opposite sides S1 and S2 of the selection gate SLG. The insulation film SP formed over the side surface S1 of the selection gate SLG, and the insulation film SP formed over the side surface S2 of the selection gate SLG are formed integrally, and are coupled with each other. Namely, the insulation film SP is formed over the side surface of the selection gate SLG continuously and integrally in such a manner as to surround the circumference of the selection gate SLG in a plan view. In other words, the insulation film SP is formed continuously and integrally over the side surface S1 of the selection gate SLG, over the side surface S2 of the selection gate SLG, and both the side surfaces forming the opposite ends of the selection gate SLG in the X direction. Accordingly, the insulation film SP formed over the side surface S1 of the selection gate SLG, and the insulation film SP formed over the side surface S2 of the selection gate SLG are not separated from each other, and are integrally coupled.

Herein, of the side surfaces (sidewalls) of the selection gate SLG, the side surface (sidewall) on the side thereof adjacent to the memory gate electrode MG via the insulation film MZ and the insulation film SP is indicated with a reference sign S1, and is referred to as a side surface (sidewall) S1; and the side surface (sidewall) opposite to the side surface (sidewall) S1 is indicated with a reference sign S2, and is referred to as a side surface (sidewall) S2. Whereas, of the side surfaces (sidewalls) of the memory gate electrode MG, the side surface (sidewall) on the side thereof adjacent to the selection gate SLG via the insulation film MZ and the insulation film SP is indicated with a reference sign S3, and is referred to as a side surface (sidewall) S3; and the side surface (sidewall) opposite to the side surface (sidewall) S3 is indicated with a reference sign S4, and is referred to as a side surface (sidewall) S4. The side surfaces S1 and S2 of the selection gate SLG, and the side surfaces S3 and S4 of the memory gate electrode MG are shown in FIGS. 3 and 4. The side surface S1 of the selection gate SLG and the side surface S3 of the memory gate electrode MG face each other via the insulation film SP and the insulation film MZ; a lamination film of the insulation film SP and the insulation film MZ is interposed between the side surface S1 of the selection gate SLG and the side surface S3 of the memory gate electrode MG; the insulation film SP is adjacent to the side surface S1 of the selection gate SLG; and the insulation film MZ is adjacent to the side surface S3 of the memory gate electrode MG.

Over the side surfaces of the memory gate electrode MG and the selection gate SLG on the sides not adjacent to each other, sidewall spacers (sidewalls or sidewall insulation films) SW each formed of an insulation film (a silicon oxide film, a silicon nitride film, or a lamination film thereof) are formed, respectively. Namely, the sidewall spacers SW are formed over the side surface S4 of the memory gate electrode MG opposite to the side thereof adjacent to the selection gate SLG via the insulation film MZ and the insulation film SP, and over the side surface S2 of the selection gate SLG opposite to the side thereof adjacent to the memory gate electrode MG via the insulation film MZ and the insulation film SP. In other words, the sidewall spacers SW are formed over the side surface S2 of the selection gate SLG, and over the side surface S4 of the memory gate electrode MG.

However, the insulation films SP are formed over the side surface S1 and over the side surface S2 of the selection gate SLG. Accordingly, the insulation film SP (the insulation film SP formed over the side surface S2 of the selection gate SLG) is interposed between the side surface S2 of the selection gate SLG and the sidewall spacer SW. Namely, the sidewall spacer SW is formed over the side surface S2 of the selection gate SLG via the insulation film SP.

Alternatively, when a manufacturing step described later is adopted, and the insulation film MZ1 is left without being removed in a Step 15 described later, the insulation film MZ1 extends between the semiconductor substrate SB and the sidewall spacer SW as shown FIGS. 1 and 3.

The $n^-$ type semiconductor region EX1 on the source side is formed in self-alignment with the side surface S4 of the memory gate electrode MG; and the $n^+$ type semiconductor region SD1 is formed in self-alignment with the side surface of the sidewall spacer SW over the side surface S4 of the memory gate electrode MG (the side surface opposite to the side thereof in contact with the memory gate electrode MG). This results from the following: before forming the sidewall spacers SW, the $n^-$ type semiconductor region EX1 is formed by ion implantation; and after forming the sidewall spacers SW, the $n^+$ type semiconductor region SD1 is formed by ion implantation. Accordingly, the low-concentration $n^-$ type semiconductor region EX1 is formed under the sidewall spacer SW over the side surface S4 of the memory gate electrode MG; and the high-concentration $n^+$ type semiconductor region SD1 is formed outside the low-concentration $n^-$ type semiconductor region EX1. Therefore, the low-concentration $n^-$ type semiconductor region EX1 is formed in such a manner as to be adjacent to the channel region of the memory transistor; and the high-concentration $n^+$ type semiconductor region SD1 is formed in such a manner as to be adjacent to the low-concentration $n^-$ type semiconductor region EX1, and to be separated from the channel region of the memory transistor by the $n^-$ type semiconductor region EX1.

The $n^-$ type semiconductor region EX2 on the drain side is formed in self-alignment with the side surface (the side surface opposite to the side thereof in contact with the selection gate SLG) of the insulation film SP over the side surface S2 of the selection gate SLG; and the $n^+$ type semiconductor region SD2 is formed in self-alignment with the side surface (the side surface opposite to the side thereof adjacent to the selection gate SLG via the insulation film SP) of the sidewall spacer SW over the side surface S2 of the selection gate SLG. This results from the following: before forming the sidewall spacers SW, the $n^-$ type semiconductor region EX2 is formed by ion implantation with the insulation film SP formed over the side surface S2 of the selection gate SLG; and after forming the sidewall spacers SW, the $n^+$ type semiconductor region SD2 is formed by ion implantation. Accordingly, the low-concentration $n^-$ type semiconductor region EX2 is formed under the sidewall spacer SW over the side surface S2 of the selection gate SLG; and the high-concentration $n^+$ type semiconductor region SD2 is formed outside the low-concentration $n^-$ type semiconductor region EX2. Therefore, the low-concentration $n^-$ type semiconductor region EX2 is formed in such a manner as to be adjacent to the channel region of the selection transistor; and the high-concentration $n^+$ type semiconductor region SD2 is formed in such a manner as to be adjacent to the low-concentration $n^-$ type semiconductor region EX2, and to be separated from the channel region of the selection transistor by the $n^-$ type semiconductor region EX2.

In the p type well PW, the channel region of the memory transistor is formed under the insulation film MZ under the memory gate electrode MG; and the channel region of the selection transistor is formed under the insulation film GF under the selection gate SLG (selection gate electrode SG). In the channel formation region of the selection transistor, a semiconductor region (a p type semiconductor region or an n type semiconductor region) for adjusting the threshold value of the selection transistor is formed, if required. Whereas, in the channel formation region of the memory transistor, a semiconductor region (a p type semiconductor region or an n type semiconductor region) for adjusting the threshold value of the memory transistor is formed, if required.

In the present embodiment, the selection gate SLG has a lamination structure of a selection gate electrode SG formed of a conductor (conductive film), and a cap insulation film CP formed over the selection gate electrode SG. The cap insulation film CP is formed of, for example, a silicon nitride film. As the cap insulation film CP, a lamination film of a silicon oxide film, and a silicon nitride film formed over the silicon oxide film, and thicker than the silicon oxide film can also be used.

The selection gate electrode SG is formed of a conductive film, and is formed of a silicon film such as an n type polysilicon film (a polycrystal silicon film doped with an n type impurity). Specifically, the selection gate electrode SG is formed of a patterned silicon film. Of the selection gate SLG, the selection gate electrode SG functions as a gate electrode, and the cap insulation film CP is formed of an insulator (insulation film), and hence does not function as a gate electrode. As described later, the lamination film formed of the conductive film (silicon film) for the selection gate electrode SG, and the insulation film for the cap insulation film CP are patterned. As a result, it is possible to form a selection gate SLG formed of the lamination body (lamination film) of the selection gate electrode SG and the cap insulation film CP. The gate length of the selection gate electrode SG can be set at, for example, about 80 to 120 nm.

Incidentally, in the present embodiment, the selection gate SLG has a lamination structure of the selection gate electrode SG, and the cap insulation film CP over the selection gate electrode SG. However, as another form, the cap insulation film CP may not be formed. In that case, the selection gate SLG is formed of the selection gate electrode SG, and does not have the cap insulation film CP.

The memory gate electrode MG is formed of a conductive film, and is formed of a silicon film such as an n type polysilicon film. Specifically, the memory gate electrode MG is formed in the following manner: the silicon film formed over the semiconductor substrate SB in such a manner as to cover the selection gate SLG is anisotropically etched (etched back); as a result, the silicon film is selectively left over the side surface S1 of the selection gate SLG via the insulation film SP and the insulation film MZ. Accordingly, the memory gate electrode MG is formed in a sidewall spacer shape over one side surface (herein, the side surface S1) of the selection gate SLG via the insulation film SP and the insulation film MZ. The gate length of the memory gate electrode MG can be set at, for example, about 50 to 100 nm. Over the selection gate electrode SG, the cap insulation film CP is formed; and the memory gate electrode MG is formed at the side surface of the selection gate SLG which is the lamination body thereof. Accordingly, the height position of the uppermost part of the memory gate electrode MG can be set higher than the top surface of the selection gate electrode SG.

The selection gate SLG and the memory gate electrode MG adjacent to each other via the insulation film SP and the insulation film MZ not only extend in the memory cell region 1A, but also further extend even to a shunt region (feeding region) 1B.

The shunt region 1B is the region to be used for pulling the selection gate electrode SG and the memory gate electrode MG up to the wire 1. As also apparent from FIGS. 2 and 4, the element isolation region ST is formed in the whole shunt region 1B. Therefore, in the shunt region 1B, the selection gate SLG and the memory gate electrode MG adjacent to each other via the insulation film SP and the insulation film MZ extend over the element isolation region ST.

In each memory cell MC of the memory cell region 1A, the insulation film GF functioning as a gate insulation film is formed between the selection gate SLG (the selection gate electrode SG) and the semiconductor substrate SB (the p type well PW). This does not depend upon the deposition method of the insulation film GF.

However, when the insulation film GF is formed by a general thermal oxidation method, the insulation film. GF is not formed over the element isolation region ST during deposition of the insulation film GF. In this case, the insulation film GF is not formed under the portion of the selection gate electrode SG extending over the element isolation region ST (e.g., the selection gate electrode SG in the shunt region 1B). The selection gate electrode SG is arranged directly on the element isolation region ST. Namely, the insulation film GF is not formed between the selection gate electrode SG and the element isolation region ST.

On the other hand, when the insulation film GF is deposited and formed by a CVD method, a sputtering method, or the like, the insulation film GF is also formed over the element isolation region ST during deposition of the insulation film GF. Accordingly, the insulation film GF is also formed between the selection gate electrode SG and the element isolation region ST.

Whereas, in each memory cell MC in the memory cell region 1A, the insulation film MZ is formed between the memory gate electrode MG and the semiconductor substrate SB (the p type well PW), and between the memory gate electrode MG and the selection gate SLG. The insulation film MZ can also be formed over the element isolation region ST during deposition. Accordingly, the insulation film MZ is also formed under the portion of the memory gate electrode MG extending over the element isolation region ST (e.g., the memory gate electrode MG in the shunt region 1B). Accordingly, in the region (e.g., the shunt region 1B) in which the memory gate electrode MG extends over the element isolation region ST, the insulation film MZ is formed between the memory gate electrode MG and the element isolation region ST, and between the memory gate electrode MG and the selection gate SLG.

Incidentally, as described above, of the insulation film MZ, the insulation film MZ at a portion thereof situated between the memory gate electrode MG and the semiconductor substrate SB (the p type well PW) (i.e., the insulation film MZ under the memory gate electrode MG) is formed of a lamination film of the insulation film MZ1, the insulation film MZ2 over the insulation film MZ1, and the insulation film MZ3 over the insulation film MZ2. On the other hand, the insulation film MZ at a portion thereof situated between the memory gate electrode MG and the selection gate SLG does not have the insulation film MZ1, and is formed of a lamination film of the insulation film MZ2 and the insulation film MZ3. Whereas, the insulation film MZ at a portion thereof situated between the memory gate electrode MG and the element isolation region ST also does not have the insulation film MZ1, and is formed of a lamination film of the insulation film MZ2 and the insulation film MZ3.

In other words, the insulation film MZ2 and the insulation film MZ3 of the insulation film MZ are formed in the region between the memory gate electrode MG and the semiconductor substrate SB (the p type well PW), the region between the memory gate electrode MG and the selection gate SLG, and the region between the memory gate electrode MG and the element isolation region ST. On the other hand, the insulation film MZ1 of the insulation film MZ is formed between the memory gate electrode MG and the semiconductor substrate SB (the p type well PW), but is not formed between the memory gate electrode MG and the selection gate SLG, and further, is also not formed between the memory gate electrode MG and the element isolation region ST. This is due to the following: when the insulation film MZ1 is formed by oxidation (preferably, a thermal oxidation method), the insulation film MZ1 is not formed over the insulation film SP, and over the element isolation region ST.

However, even when the insulation film MZ is not formed between the memory gate electrode MG and the element isolation region ST, the operation of the nonvolatile memory is not adversely affected. For this reason, the case where the insulation film MZ is not formed between the memory gate electrode MG and the element isolation region ST is also allowable. Whereas, the case where not only the insulation films MZ2 and MZ3 but also the insulation film MZ1 are formed between the memory gate electrode MG and the element isolation region ST, is also allowable.

Metal silicide layers SL are formed at the top (the top surface) of (the silicon film PS2 forming) the memory gate electrode MG, and the tops (the top surfaces or the front surfaces) of the n$^+$ type semiconductor regions SD1 and SD2 by a Salicide: Self Aligned Silicide technology, or the like. The metal silicide layer SL is formed of, for example, a cobalt silicide layer, a nickel silicide layer, or a platinum-doped nickel silicide layer. The metal silicide layer SL can reduce the diffusion resistance and the contact resistance.

When the metal silicide layer SL is formed at the top of the memory gate electrode MG, the total of the silicon film forming the memory gate electrode MG, and the metal silicide layer SL thereover can also be regarded as the memory gate electrode MG.

Further, when the selection gate SLG is formed of a lamination body (lamination film) of the selection gate electrode SG and the cap insulation film CP as in the present embodiment, the top surface of the selection gate electrode SG is covered with the cap insulation film CP except for a contact part SGa described later. Accordingly, the equivalent of the metal silicide layer SL is not formed over the selection gate electrode SG. As another form, when the cap insulation film CP is not formed, the cap insulation film. CP is not formed over the selection gate electrode SG. Accordingly, the metal silicide layer SL may be formed at the top of the selection gate electrode SG.

An interlayer insulation film IL1 is formed as an insulation film over the semiconductor substrate SB in such a manner as to cover the selection gate SLG, the memory gate electrode MG, and the sidewall spacer SW. The interlayer insulation film IL1 is formed of a single film of a silicon oxide film, a lamination film of a silicon nitride film and a silicon oxide film formed thicker than the silicon nitride film over the silicon nitride film, or the like. The top surface of the interlayer insulation film IL1 is planarized.

In the interlayer insulation film IL1, a plurality of contact holes (openings or through holes) are formed. In the contact holes, conductive plugs (contact plugs) P1, P2, P3, and P4 are formed as coupling conductor parts, respectively.

Of the plugs P1, P2, P3, and P4, the plug P1 is the plug electrically coupled to the n$^+$ type semiconductor region SD1; the plug P2 is the plug electrically coupled to the n$^+$ type semiconductor region SD2; the plug P3 is the plug electrically coupled to the memory gate electrode MG; and the plug P4 is the plug electrically coupled to the selection gate electrode SG. The plug P1 is embedded in the contact hole for the plug P1; the plug P2 is embedded in the contact hole for the plug P2; the plug P3 is embedded in the contact hole for the plug P3; and the plug P4 is embedded in the contact hole for the plug P4.

The plug P1 is arranged over the n$^+$ type semiconductor region SD1. The bottom surface of the plug P1 is in contact with the metal silicide layer SL over the surface of the n$^+$ type semiconductor region SD1. Accordingly, the plug P1 is electrically coupled to the n$^+$ type semiconductor region SD1. The plug P2 is arranged over the n$^+$ type semiconductor region SD2. The bottom surface of the plug P2 is in contact with the metal silicide layer SL over the surface of the n$^+$ type semiconductor region SD2. Accordingly, the plug P2 is electrically coupled to the n$^+$ type semiconductor region SD2. The plugs P3 and P4 will be described in more details later.

Each of the plugs P1, P2, P3, and P4 is formed of a thin barrier film formed over the bottom and the sidewall (side surface) of the contact hole, and a main conductor film formed over the barrier conductor film in such a manner as to fill the contact hole. However, for simplification of the drawing, in FIGS. 1 and 2, the barrier conductor film and the main conductor film forming each of the plugs P1, P2, P3, and P4 are integrally shown.

A wire M1 is formed over the interlayer insulation film IL1 including the plugs P1, P2, P3, and P4 embedded therein. The wire M1 is, for example, a damascene wire (embedded wire), and is embedded in the wire trench provided in an insulation film (interlayer insulation film) IL2 formed over the interlayer insulation film IL1. The wire M1 is electrically coupled via the plugs (P1, P2, P3, or P4) to the source region (semiconductor region MS) of the memory transistor, the drain region (semiconductor region MD) of the selection transistor, the selection gate electrode SG, the memory gate electrode MG, or the like.

Wires and insulation films at layers still higher than the wire M1 are also formed, but herein are not shown and are not described. Further, the wire M1 and wires at higher layers than that are not limited to damascene wires, and can also be formed by patterning a wiring conductor film. For example, a tungsten wire, an aluminum wire, or the like can also be adopted.

Further, in the present embodiment, in the shunt region 1B, a selection gate FLC is formed in such a manner as to be separated from the selection gate SLG, and to be adjacent to the memory gate electrode MG. Namely, in the shunt region 1B, the selection gate FLC is formed at a position facing the side surface S1 of the selection gate SLG via the insulation films SP and MZ and the memory gate electrode MG. The selection gate FLC is not formed in the memory cell region 1A, and is formed in an island shape in the shunt region 1B, and is adjacent to the selection gate SLG via the insulation films SP and MZ and the memory gate electrode MG in the Y direction. In other words, in the shunt region 1B, in a plan view, the memory gate electrode MG is interposed between the selection gate SLG and the selection gate FLC in the Y direction. In the entire shunt region 1B, the element isolation region ST is formed. Accordingly, the selection gate FLC is formed over the element isolation region ST. In a plan view, the selection gate FLC can be formed, for example, in a pattern extending in the X direction in the shunt region 1B.

The selection gate FLC and the selection gate SLG are formed of the same-layer film (common film) by the same step. For this reason, the layer structure of the selection gate FLC is the same as the layer structure of the selection gate SLG. When the selection gate SLG has a lamination structure of the selection gate electrode SG and the cap insulation film CP over the selection gate electrode SG, the selection gate FLC has a lamination structure of the selection gate electrode FC and the cap insulation film CP1 over the selection gate electrode FC.

The selection gate electrode (dummy gate electrode) FC and the selection gate electrode SG are formed of the same-layer film (common film) by the same step. Whereas, the cap insulation film CP1 and the cap insulation film CP are formed of the same-layer film (common film) by the same step. Namely, the selection gate electrode FC and the selection gate electrode SG are formed by patterning a conductive film (corresponding to a silicon film PS1 described later) both for the selection gate electrode FC and for the selection gate electrode SG. Whereas, the cap insulation film CP1 and the cap insulation film CP are formed by patterning a conductive film (corresponding to an insulation film CPZ described later) both for the cap insulation film CP1 and for the cap insulation film CP. For this reason, the selection gate electrode FC and the selection gate electrode SG are formed of mutually the same material. Whereas, the cap insulation film CP1 and the cap insulation film CP are formed of mutually the same material. However, the selection gate electrode FC and the selection gate electrode SG are not coupled to each other, and are separated from each other. Whereas, the cap insulation film CP1 and the cap insulation film CP are not coupled to each other, and are separated from each other.

When the cap insulation film CP is not formed over the selection gate electrode SG, namely, when the selection gate SLG does not have the cap insulation film CP, and is formed of the selection gate electrode SG, the cap insulation film CP1 is not formed over the selection gate electrode FC. Therefore, the selection gate FLC does not have the cap insulation film CP1, and is formed of the selection gate electrode FC.

The selection gate electrode FC and the selection gate electrode SG are formed of the common conductive film by the same step, but are separated from each other, and are not coupled with each other. Whereas, the selection gate electrode FC and the selection gate electrode SG are not electrically coupled with each other via a wire, or the like. For this reason, the selection gate electrode FC is not electrically coupled with the selection gate electrode SG. The selection gate electrode FC is in an electrically floating state. Namely, the selection gate electrode FC is set at a floating potential.

The selection gate electrode SG functions as the gate electrode of the selection transistor. However, the selection gate electrode FC does not function as the gate electrode of a transistor. The selection gate electrode FC is provided so as to enable precise coupling of the plug P3 to the memory gate electrode MG. For this reason, the selection gate electrode FC can be regarded as a dummy gate electrode (pseudo gate electrode).

The memory gate electrode MG is formed in a sidewall spacer shape over the side surface S1 of the selection gate SLG via the insulation films SP and MZ, and extends together with the selection gate SLG in the X direction of FIG. 4. Then, in the shunt region 1B, the memory gate electrode MG is formed in such a manner as to fill the space between the selection gate SLG and the selection gate FLC, and is formed around the selection gate FLC in such a manner as to surround the selection gate FLC in a plan view. The memory gate electrode MG at a portion thereof formed in a sidewall spacer shape over the side surface S1 of the selection gate SLG via the insulation films SP and MZ, and extending together with the selection gate SLG in the X direction, the memory gate electrode MG at a portion thereof filling the space between the selection gate SLG and the selection gate FLC, and the memory gate electrode MG at a portion thereof formed around the selection gate FLC in such a manner as to surround the selection gate FLC are integrally formed. The portion of the memory gate electrode MG situated between the selection gate SLG and the selection gate FLC is formed in such a manner as to fill the space between the selection gate SLG and the selection gate FLC, and the other portion thereof is formed in a sidewall spacer shape.

Whereas, the insulation film SP and the insulation film MZ are also interposed between the selection gate FLC and the memory gate electrode MG adjacent to the selection gate FLC. Namely, the lamination structure of the insulation film SP and the insulation film MZ is interposed between the selection gate FLC and the memory gate electrode MG; and the insulation film SP is adjacent to the selection gate FLC, and the insulation film MZ is adjacent to the memory gate electrode MG.

The insulation film SP is formed over the side surface of the selection gate FLC. The insulation film SP is formed over the side surface of the selection gate FLC in such a manner as to surround the circumference of the selection gate FLC in a plan view. However, the insulation film SP over the side surface of the selection gate FLC, and the insulation films SP over the side surfaces (S1 and S2) of the selection gate SLG are formed of the same-layer film (common film) by the same step, but are separated from each other. Namely, the insulation film SP over the side surface of the selection gate FLC, and the insulation films SP over the side surfaces (S1 and S2) of the selection gate SLG are not coupled with each other, and are separated from each other. The insulation film SP over the side surface of the selection gate FLC, and the insulation films SP over the side surfaces (S1 and S2) of the selection gate SLG are formed of mutually the same material.

The insulation film SP formed over the side surface of the selection gate SLG is not formed under the memory gate electrode MG. Similarly, the insulation film SP formed over the side surface of the selection gate FLC is also not formed under the memory gate electrode MG. Namely, the insulation film SP formed over the side surface of the selection gate SLG does not extend under the memory gate electrode MG. Similarly, the insulation film SP formed over the side surface of the selection gate FLC also does not extend under the memory gate electrode MG. In other words, the insulation film SP is not formed under the memory gate electrode MG.

On the other hand, the insulation film MZ formed between the selection gate FLC and the memory gate electrode MG is formed integrally with the insulation film MZ formed under the memory gate electrode MG, and the insulation film MZ formed between the selection gate SLG and the memory gate electrode MG. Namely, the insulation films MZ are continuously formed between the selection gate SLG and the memory gate electrode MG, under the memory gate electrode MG, and between the selection gate FLC and the memory gate electrode MG. Incidentally, the insulation film MZ formed between the selection gate FLC and the memory gate electrode MG does not have the insulation film MZ1, and is formed of the lamination film of the insulation film MZ2 and the insulation film MZ3 as with the insulation film MZ formed between the selection gate SLG and the memory gate electrode MG.

The reason why the selection gate SLG is provided is as follows.

The memory gate electrode MG is the electrode in a sidewall spacer shape formed in a self-alignment with the side surface (sidewall) of the selection gate SLG. For this reason, it is difficult to provide a feeding pattern having a large area in a plan view on the memory gate electrode MG. Further, the memory gate electrode MG is the pattern to be formed in a self-alignment manner. For this reason, the width of the memory gate electrode MG in the direction orthogonal to the X direction which is the direction of extension of the memory gate electrode MG, in other words, the Y direction is small.

For this reason, if the plug P3 is tried to be coupled to the top surface of the memory gate electrode MG simply extending along the side surface S1 of the selection gate SLG without providing the selection gate FLC as distinct from the present embodiment, a coupling failure may be caused between the memory gate electrode MG and the plug P3 when the formation position of the plug P3 is deviated from the design position due to the misalignment of a photomask. Further, the plug P3 which should be coupled to the memory gate electrode MG is coupled not only to the memory gate electrode MG but also to the selection gate electrode SG. This may cause a short circuit between the memory gate electrode MG and the selection gate electrode SG.

In contrast, in the present embodiment, as described above, in the shunt region 1B, the selection gate FLC is formed on the side surface Si side of the selection gate SLG via the insulation films SP and MZ and the memory gate electrode MG, and the memory gate electrode MG is also formed around the selection gate FLC. Then, the plug P3 to be coupled to the memory gate electrode MG is arranged over the memory gate electrode MG at a portion thereof formed around the selection gate FLC, and is coupled to the memory gate electrode MG at a portion thereof formed around the selection gate FLC. Namely, the plug P3 to be coupled to the memory gate electrode MG overlaps the memory gate electrode MG at a portion thereof formed around the selection gate FLC in a plan view.

It does not matter if the plug P3 to be coupled to the memory gate electrode MG overlaps the selection gate FLC in a plan view. This is for the following reason: the selection gate electrode FC is in an electrically floating state; accordingly, even when the plug P3 to be coupled to the memory gate electrode MG is electrically coupled to the selection gate electrode FC, the selection gate electrode SG and the memory gate electrode MG are not short-circuited, which incurs no problem. In the present embodiment, the memory gate electrode MG adjacent to the selection gate electrode FC in a floating state serves as the coupling part (coupling region) with the plug P3. As a result, even when the position for forming the plug P3 to be coupled to the memory gate electrode MG is deviated from the design position, the memory gate electrode MG and the selection gate electrode SG can be prevented from being short-circuited. This can enlarge the margin with respect to the deviation of the formation position of the plug P3 to be coupled to the memory gate electrode MG from the design position.

Namely, as distinct from the present embodiment, when the selection gate electrode FC is integrally coupled with the selection gate electrode SG, the plug P3 to be coupled to the memory gate electrode MG is coupled not only to the memory gate electrode MG but also to the selection gate electrode FC. As a result, the memory gate electrode MG and the selection gate electrode SG are electrically short-circuited.

In contrast, in the present embodiment, the selection gate electrode FC is not integrally coupled with, and is separated from the selection gate electrode SG. For this reason, even when the plug P3 to be coupled to the memory gate electrode MG is coupled not only to the memory gate electrode MG but also to the selection gate electrode FC, the memory gate electrode MG and the selection gate electrode SG are prevented from being electrically short-circuited. For this reason, in the present embodiment, when the plug P3 to be coupled to the memory gate electrode MG is coupled to the memory gate electrode MG, the plug P3 is not required to be prevented from being coupled to the selection gate electrode FC. Therefore, the formation position of the plug P3 to be coupled to the memory gate electrode MG can be allowed to be deviated to a certain degree from the design position. This facilitates manufacturing of the semiconductor device, resulting in easy control of the manufacturing steps.

For this reason, in the present embodiment, the plug P3 to be coupled to the memory gate electrode MG is coupled to the memory gate electrode MG at a portion thereof formed around the selection gate FLC, but may either be coupled to, or not be coupled to the selection gate electrode SG. Namely, the plug P3 to be coupled to the memory gate electrode MG is required to be electrically coupled to the memory gate electrode MG, and not to be electrically coupled to the selection gate electrode SG, but may either be electrically coupled to, or not be electrically coupled to the selection gate electrode FC. For this reason, the plug P3 to be coupled to the memory gate electrode MG can also be formed across over the memory gate electrode MG along the side surface (sidewall) of the selection gate FLC, and over the selection gate electrode FC.

Whereas, when the metal silicide layer SL is formed at the top of the memory gate electrode MG, the plug P3 to be coupled to the memory gate electrode MG is in contact with, and electrically coupled with the metal silicide layer SL at the top of the memory gate electrode MG, thereby to be electrically coupled with the memory gate electrode MG.

Further, in a plan view, the plug P3 to be coupled to the memory gate electrode MG preferably does not overlap the memory gate electrode MG at a portion thereof formed in a sidewall spacer shape over the side surface S1 of the selection gate SLG. This can prevent the plug P3 to be coupled to the memory gate electrode MG from being coupled to the selection gate electrode SG with more precision.

Incidentally, in the shunt region 1B, the element isolation region ST is formed. Accordingly, even when a part of the plug P3 to be coupled to the memory gate electrode MG protrudes from the selection gate electrode FC and the memory gate electrode MG in a plan view, the protruding portion of the plug P3 is coupled to the top surface of the element isolation region ST. For this reason, the plug P3 to be coupled to the memory gate electrode MG does not establish a conduction with the semiconductor substrate SB.

Further, in the shunt region 1B, the selection gate SLG has the contact part SGa for establishing a coupling with the plug P4 (the plug P4 which should be electrically coupled to the selection gate electrode SG). In a plan view, the contact part SGa extends in the direction (herein, the Y direction of FIG. 4) orthogonal to the direction (herein, the X direction of FIG. 4) of extension of the selection gate SLG. Accordingly, in the selection gate SLG, the contact part SGa is larger in width (the dimension in the Y direction) than other regions than the contact part SGa. For this reason, the contact part SGa can also be regarded as a larger-width portion (wide part) of the selection gate SLG in the selection gate SLG. Herein, the width of the selection gate SLG corresponds to the width in the direction (herein, the Y direction of FIG. 4) orthogonal to the direction of extension of the selection gate SLG (herein, the X direction of FIG. 4).

The contact part SGa is a part of the selection gate SLG (selection gate electrode SG), and is formed integrally with the selection gate SLG. However, in other parts than the contact part SGa, the cap insulation film CP is formed over the selection gate electrode SG. In contrast, in the contact part SGa, the cap insulation film CP is not formed over at least a part of the selection gate electrode SG, so that the selection gate electrode SG is exposed. This is for coupling the plug P4 to the selection gate electrode SG at a portion thereof not covered with the cap insulation film CP in the contact part SGa. At the portion of the contact part SGa at which the cap insulation film CP is not formed, and the selection gate electrode SG is exposed, the metal silicide layer SL is preferably formed at the top of the selection gate electrode SG.

The contact part SGa can be regarded as a part of the selection gate SLG (selection gate electrode SG), but is a portion not functioning as the gate electrode of the selection transistor of the memory cell MC of the nonvolatile memory. For this reason, preferably, the contact part SGa of the selection gate SLG is provided not in the memory cell region 1A in which a plurality of memory cells MC are arrayed in an array, but in the shunt region 1B, and further is arranged over the element isolation region ST.

The contact part SGa is provided for allowing a precise coupling of the plug P4 to the selection gate electrode SG. The plug P4 to be coupled to the selection gate electrode SG is arranged over the contact part SGa, and is coupled to the selection gate electrode SG of the contact part SGa. Namely, in a plan view, the plug P4 to be coupled to the selection gate electrode SG overlaps the contact part SGa. Thus, the bottom of the plug P4 is in contact with the selection gate electrode SG of the contact part SGa, so that the plug P4 and the selection gate electrode SG are electrically coupled with each other. Incidentally, when the metal silicide layer SL is formed at the top of the selection gate electrode SG in the contact part SGa, the plug P4 to be coupled to the selection gate electrode SG is in contact with, and electrically coupled with the metal silicide layer SL at the top of the selection gate electrode SG, thereby to be electrically coupled with the selection gate electrode SG.

The plug P4 to be coupled to the selection gate electrode SG is arranged over the contact part SGa of the selection gate SLG. As a result, the plug P4 can be coupled to the selection gate electrode SG with reliability. Further, the plug P4 to be coupled to the selection gate electrode SG can be prevented from being coupled with the memory gate electrode MG with precision. This can prevent the short circuit between the selection gate electrode SG and the memory gate electrode MG.

The contact part SGa can be provided at a position at some midpoint, the end, or the like of the selection gate SLG extending in the X direction.

<Regarding Operation of Nonvolatile Memory>

Then, the operation example of the nonvolatile memory will be described by reference to FIGS. 5 and 6.

Figure 5:
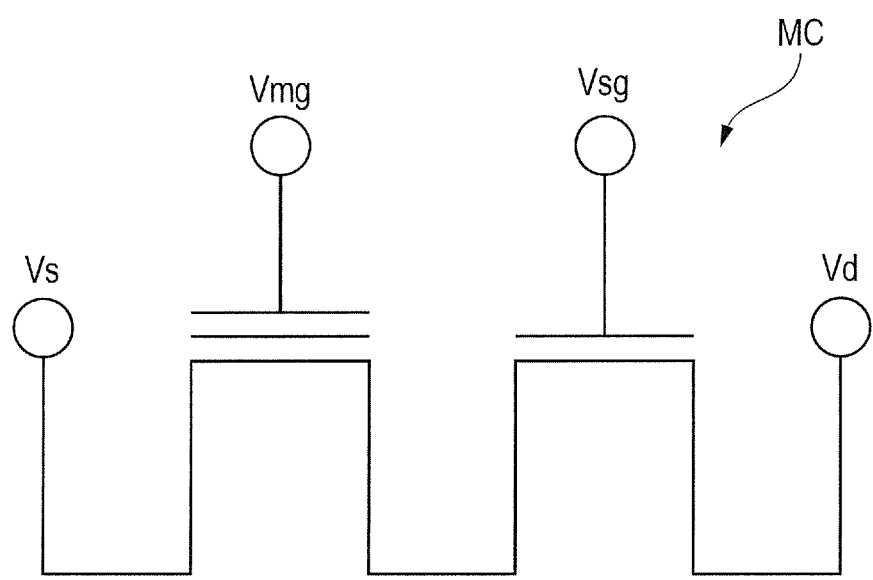
FIG. 5 is an equivalent circuit diagram of a memory cell.

FIG. 5 is an equivalent circuit diagram of the memory cell MC. FIG. 6 is a table showing one example of the application conditions of a voltage to each part of a selection memory cell at the times of "write", "erase", and "read". The table of FIG. 6 shows the voltages Vmg to be applied to the memory gate electrode MG of the memory cell MC, the voltages Vs to be applied to the source region (semiconductor region MS), the voltages Vsg to be applied to the selection gate electrode SG, the voltages Vd to be applied to the drain region (semiconductor region MD), and the base voltages Vb to be applied to the p type well PW, at respective times of "write", "erase", and "read" as shown in FIG. 3 or FIG. 5. The voltage Vs is applied from the wire M1 coupled to the plug P1 via the plug P1 to the source region (semiconductor region MS). The voltage Vd is applied from the wire M1 coupled to the plug P2 via the plug P2 to the drain region (semiconductor region MD). Whereas, the voltage Vmg is applied from the wire M1 coupled to the plug P3 via the plug P3 to the memory gate electrode MG. The voltage Vsg is applied from the wire M1 coupled to the plug P4 via the plug P4 to the selection gate electrode SG.

Incidentally, those shown in the table of FIG. 6 are preferable examples of the voltage application conditions, and are not exclusive, and can be variously changed, if required. Further, in the present embodiment, injection of electrons into the insulation film MZ2 (silicon nitride film) which is the charge accumulation part in the insulation film MZ of the memory transistor is defined as "write", and implantation of holes is defined as "erase".

Incidentally, in the table of FIG. 6, the row A corresponds to the case where the write method is a SSI method, and the erase method is a BTBT method; the row B corresponds to the case where the write method is a SSI method, and the erase method is a FN method; the row C corresponds to the case where the write method is a FN method, and the erase method is a BTBT method; and the row D corresponds to the case where the write method is a FN method, and the erase method is a FN method.

The SSI method can be regarded as an operation method of performing write on the memory cell by injecting hot electrons into the insulation film MZ2. The BTBT method can be regarded as an operation method of performing erase on the memory cell by injecting hot holes into the insulation film MZ2. The FN method can be regarded as an operation method of performing write or erase by tunneling of electrons or holes. The FN method can be described in another expression as follows: the write of the FN method can be regarded as an operation method of performing write on the memory cell by injecting electrons into the insulation film MZ2 by the FN tunneling effect; and the erase of the FN method can be regarded as an operation method of performing erase on the memory cell by injecting holes into the insulation film MZ2 by the FN tunneling effect. Below, a description will be given specifically.

The write methods include a write method referred to as a so-called SSI (Source Side Injection) method in which write is performed by hot electron injection by source side injection, and a write method referred to as a so-called FN method in which write is performed by FN (Fowler Nordheim) tunneling.

For write of the SSI method, for example, the voltages as shown in "Write operation voltage" of the row A or the row B of the table of FIG. 6 are applied to respective sites of the selection memory cell to perform write; thus, electrons are injected into the insulation film MZ2 in the insulation film MZ of the selection memory cell, thereby to perform write. At this step, hot electrons are generated in the channel region under between two gate electrodes (the memory gate electrode MG and the selection gate electrode SG) (between the source and the drain). Thus, hot electrons are injected into the insulation film MZ2 which is the charge accumulation part in the insulation film MZ under the memory gate electrode MG. The injected hot electrons (electrons) are trapped by the trap level in the insulation film MZ2. As a result, the threshold voltage of the memory transistor increases. Namely, the memory transistor is rendered in a write state.

For write of the FN method, for example, the voltages as shown in "Write operation voltage" of the row C or the row D of the table of FIG. 6 are applied to respective sites of the selection memory cell to perform write; thus, in the selection memory cell, electrons are tunneled from the memory gate electrode MG, and injected into the insulation film MZ2 in the insulation film MZ, thereby to perform write. At this step, electrons are tunneled from the memory gate electrode MG through the insulation film MZ3 by the FN tunneling (FN tunneling effect), are injected into the insulation film MZ, and are trapped by the trap level in the insulation film MZ2. As a result, the threshold voltage of the memory transistor increases. Namely, the memory transistor is rendered in a write state.

Incidentally, in write of the FN method, write can also be performed in the following manner: electrons are tunneled from the semiconductor substrate SB, and are injected into the insulation film MZ2 in the insulation film MZ. In this case, the write operation voltages can be set at, for example, those obtained by inverting the positive and negative signs of the "write operation voltages" in the row C or the row D of the table of FIG. 6.

The erase methods include an erase method referred to as a so-called BTBT method in which erase is performed by hot hole injection due to BTBT (Band-To-Band Tunneling phenomenon), and an erase method referred to as a so-called FN method in which erase is performed by FN (Fowler Nordheim) tunneling.

For erase of the BTBT method, holes generated by BTBT are injected into the charge accumulation part (insulation film MZ2), thereby to perform erase. For example, the voltages as shown in "Erase operation voltage" of the row A or the row B of the table of FIG. 6 are applied to respective sites of the selection memory cell to perform erase. As a result, holes are generated by a BTBT phenomenon, and are accelerated under an electric field. Thus, holes are injected into the insulation film MZ2 in the insulation film MZ of the selection memory cell. This reduces the threshold voltage of the memory transistor. Namely, the memory transistor is rendered in an erase state.

For erase of the FN method, for example, the voltages as shown in "Erase operation voltage" of the row B or the row D of the table of FIG. 6 are applied to respective sites of the selection memory cell to perform erase; thus, in the selection memory cell, holes are tunneled from the memory gate electrode MG, and injected into the insulation film MZ2 in the insulation film MZ, thereby to perform erase. At this step, holes are tunneled from the memory gate electrode MG through the insulation film MZ3 by the FN tunneling (FN tunneling effect), are injected into the insulation film MZ, and are trapped by the trap level in the insulation film MZ2. This reduces the threshold voltage of the memory transistor. Namely, the memory transistor is rendered in an erase state.

Incidentally, in erase of the FN method, erase can also be performed in the following manner: holes are tunneled from the semiconductor substrate SB, and are injected into the insulation film MZ2 in the insulation film MZ. In this case, the erase operation voltages can be set at, for example, those obtained by inverting the positive and negative signs of the "erase operation voltages" in the row B or the row D of the table of FIG. 6.

At the time of read, for example, the voltages as shown in "Read operation voltage" in the row A, the row B, the row C, or the row D of the table of FIG. 6 are applied to respective sites of the selection memory cell to perform read. The voltage Vmg to be applied to the memory gate electrode MG at the time of read is set at a value between the threshold voltage of the memory transistor in a write state and the threshold voltage in an erase state. As a result, it is possible to discriminate the write state and the erase state.

<Regarding Manufacturing Steps of Semiconductor Device>

Then, a description will be given to a method for manufacturing a semiconductor device of the present embodiment.

Figure 7:
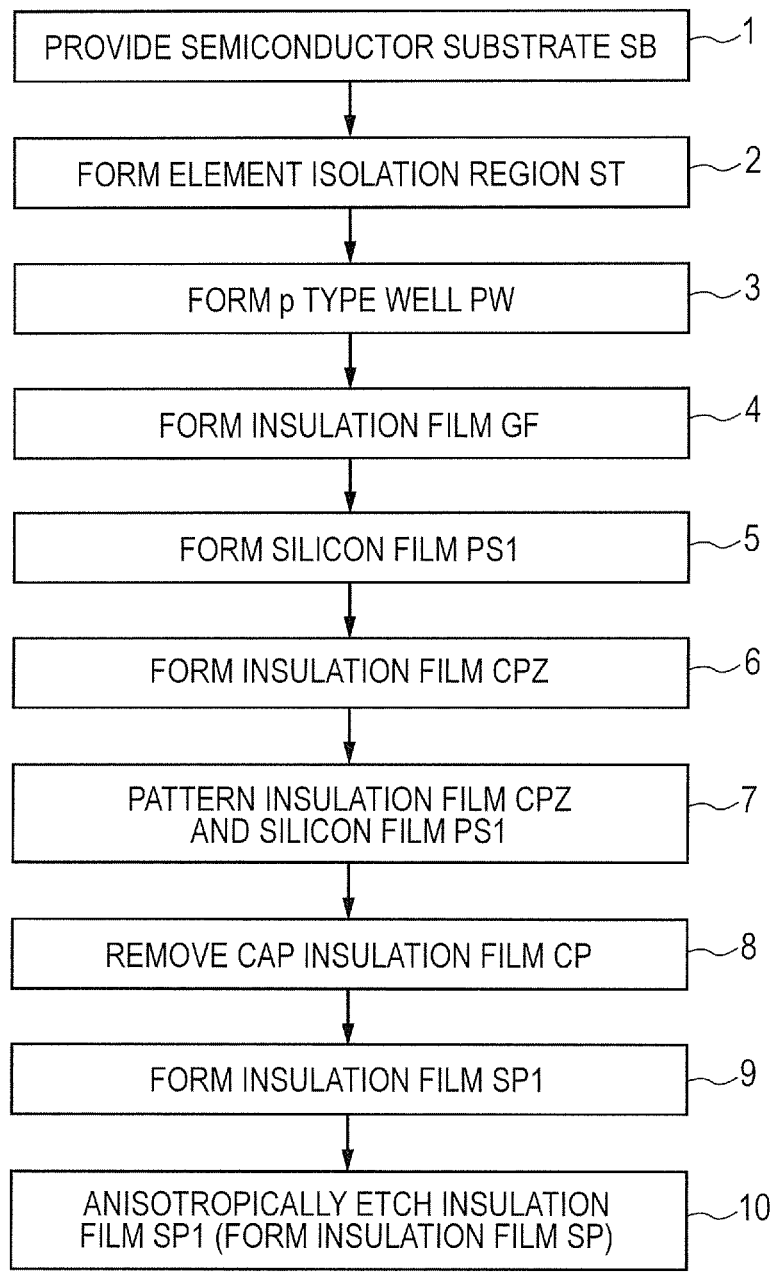
FIG. 7 is a process flowchart showing some of manufacturing steps of the semiconductor device of one embodiment.
Figure 8:
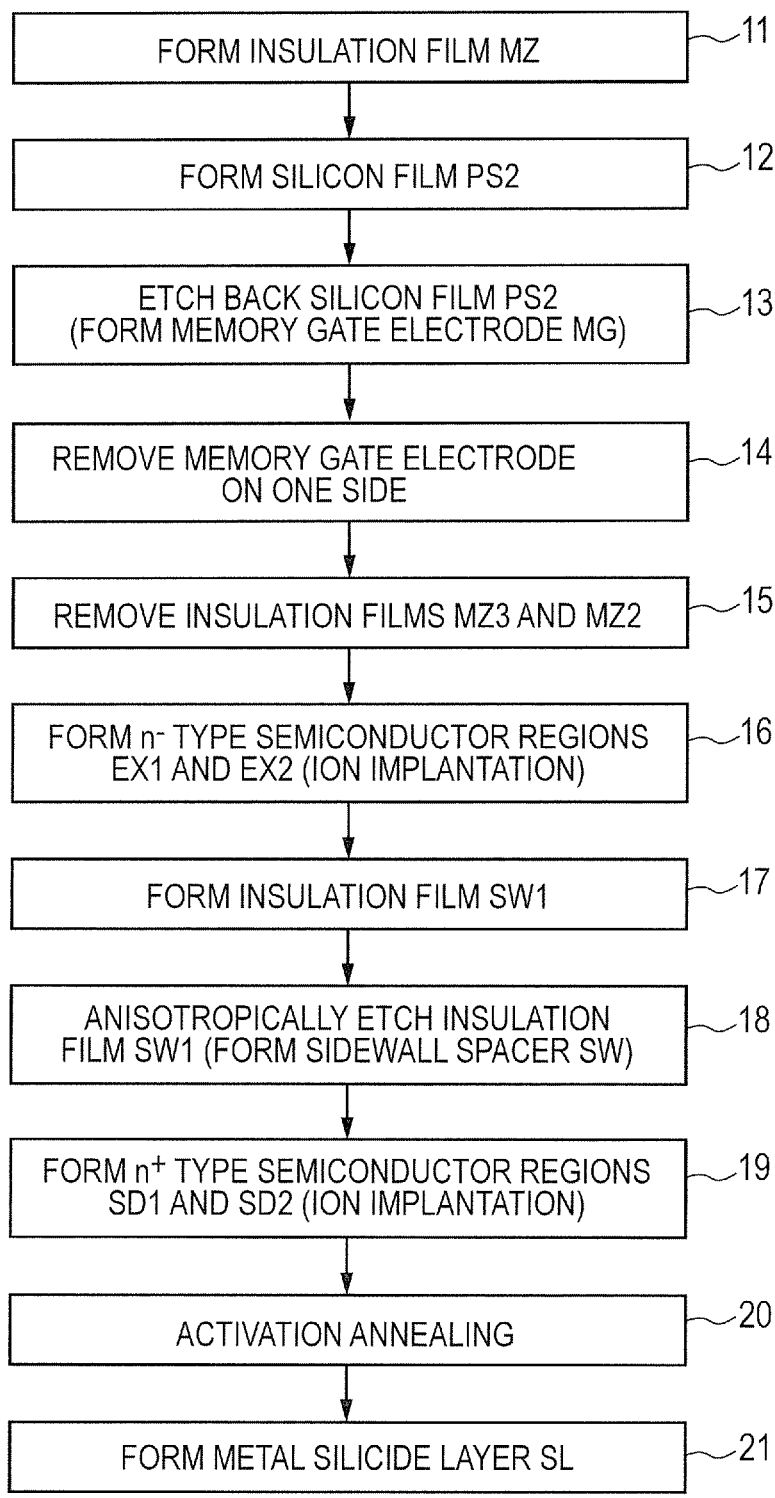
FIG. 8 is a process flowchart showing others of manufacturing steps of the semiconductor device of one embodiment.

FIGS. 7 and 8 are each a process flowchart showing some of the manufacturing steps of the semiconductor device of the present embodiment. Incidentally, after performing the process flow shown in FIG. 7, the process flow shown in FIG. 8 is performed. FIGS. 9 to 39 are each an essential part cross sectional view of the semiconductor device of the present embodiment during a manufacturing step. Incidentally, of FIGS. 9 to 39, FIGS. 9, 11, 13, 16, 18, 20, 22, 24, 26, 28, 30, 31, 33, 35, 36 and 38 each show an essential part cross sectional view of the memory cell region 1A, and specifically each show a cross sectional view at a position along line A-A of FIG. 4 (i.e., across sectional view corresponding to FIG. 1). Whereas, of FIGS. 9 to 39, FIGS. 10, 12, 14, 15, 17, 19, 21, 23, 25, 27, 29, 32, 34, 37, and 39 each show an essential part cross sectional view of the shunt region 1B, and specifically each show a cross sectional view at a position along line B-B of FIG. 4 (i.e., a cross sectional view corresponding to FIG. 2).

Further, in the present embodiment, a description will be given to the case where n channel type MISFETs (a control transistor and a memory transistor) are formed in the memory cell region 1A. However, p channel type MISFETs (a control transistor and a memory transistor) can also be formed in the memory cell region 1A by inverting the conductivity type.

Figure 9:
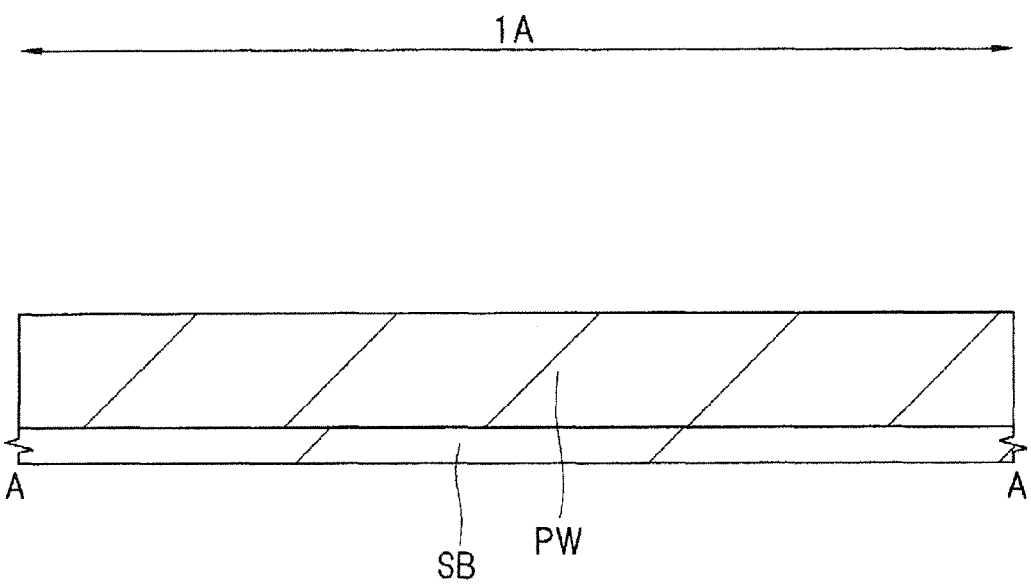
FIG. 9 is an essential part cross sectional view of the semiconductor device of one embodiment during a manufacturing step.
Figure 10:
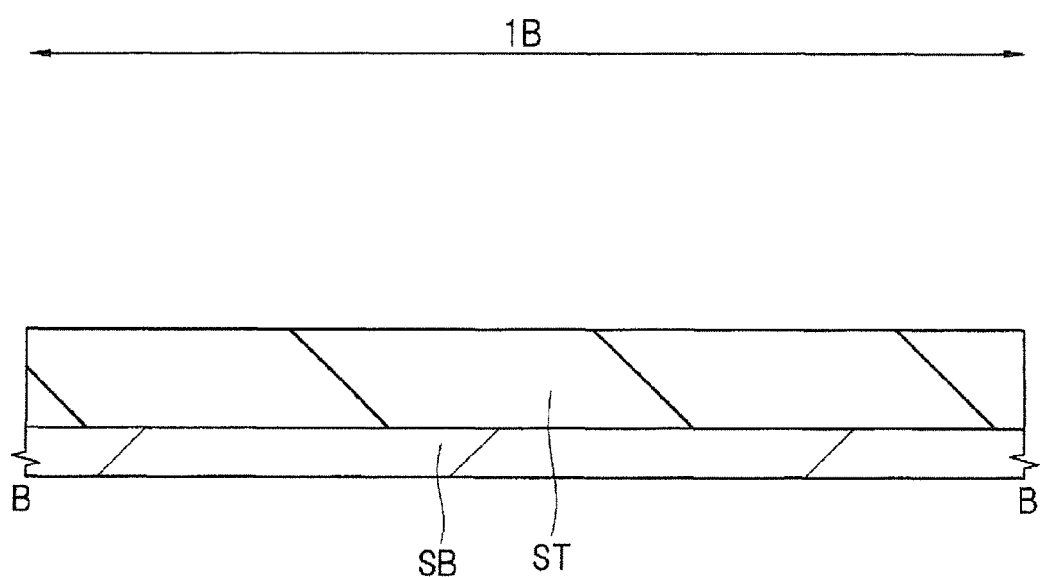
FIG. 10 is an essential part cross sectional view of the same semiconductor device as in FIG. 9 during a manufacturing step.

As shown in FIGS. 9 and 10, first, a semiconductor substrate (semiconductor wafer) SB formed of, for example, a p type single crystal silicon having a specific resistance of about 1 to 10 Ωcm is prepared (provided) (Step 1 of FIG. 7). Then, in the main surface of the semiconductor substrate SB, an element isolation region (interelement isolation insulation region) ST for defining (partitioning) an active region is formed (Step 2 of FIG. 7).

The element isolation region ST is formed of an insulator (insulation film) of silicon oxide, or the like, and can be formed by, for example, a STI (Shallow Trench Isolation) method. For example, a trench for element isolation is formed in the main surface of the semiconductor substrate SB. Then, over the semiconductor substrate SB, an insulation film (e.g., a silicon oxide film) for forming an element isolation region is formed in such a manner as to fill the trench for element isolation. Subsequently, the insulation film (the insulation film for forming an element isolation region) outside the trench for element isolation is removed. As a result, it is possible to form the element isolation region ST formed of the insulation film embedded in the trench for element isolation.

Then, in the memory cell region 1A of the semiconductor substrate SB, a p type well PW is formed (Step 3 of FIG. 7). The p type well PW can be formed by ion implanting a p type impurity such as boron (B) into the semiconductor substrate SB, and is formed to a prescribed depth from the main surface of the semiconductor substrate SB.

Then, in order to adjust the threshold voltage of the control transistor to be formed later in the memory cell region 1A, if required, channel dope ion implantation is performed on the surface layer part of the p type well PW in the memory cell region 1A.

Figure 11:
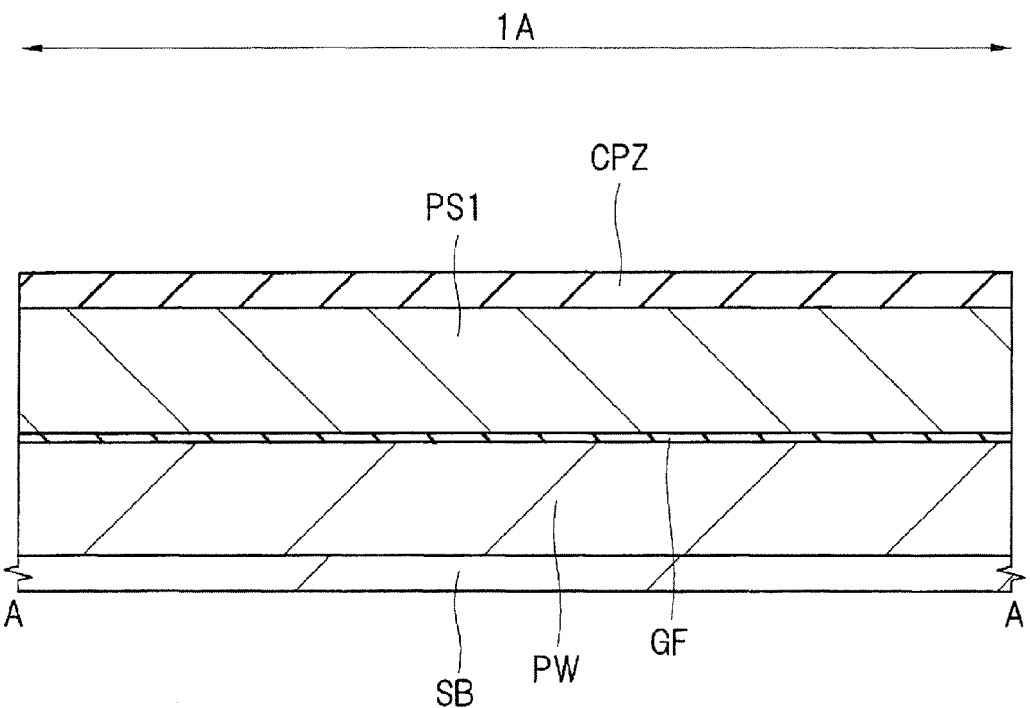
FIG. 11 is an essential part cross sectional view of the semiconductor device during a manufacturing step following FIG. 9.
Figure 12:
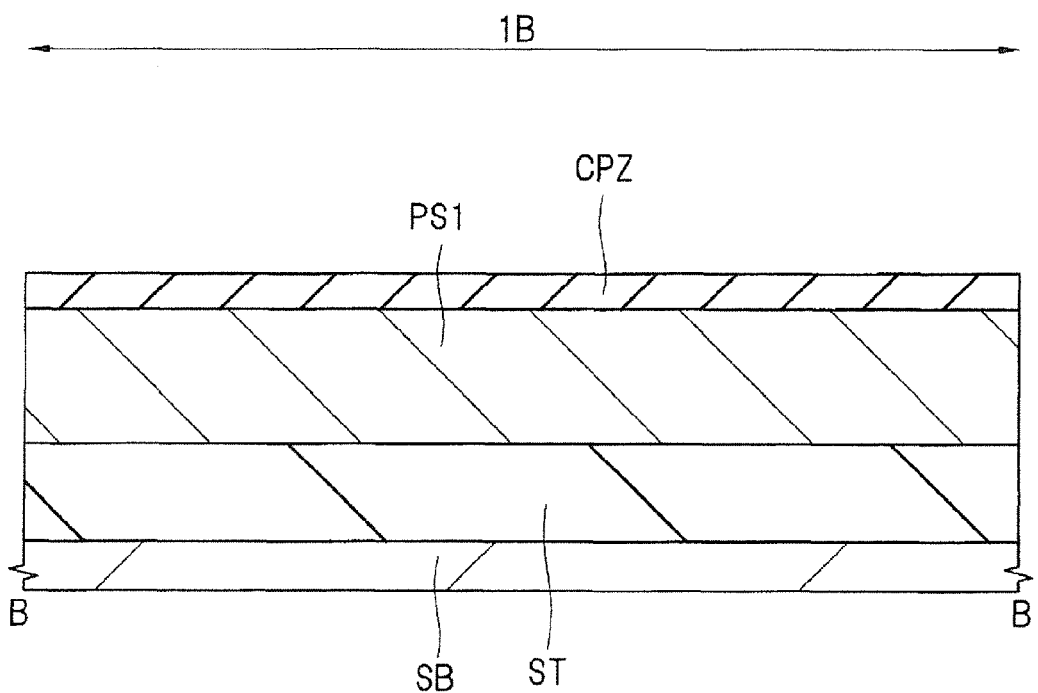
FIG. 12 is an essential part cross sectional view of the same semiconductor device as in FIG. 11 during a manufacturing step.

Then, as shown in FIGS. 11 and 12, the surface of the semiconductor substrate SB (p type well PW) is cleaned by diluted hydrofluoric acid cleaning, or the like. Then, at the main surface of the semiconductor substrate SB (the surface of the p type well PW), an insulation film GF for a gate insulation film is formed (Step 4 of FIG. 7).

The insulation film GF is formed of, for example, a silicon oxide film, and can be formed using a thermal oxidation method, or the like. The formation film thickness of the insulation film GF can be set at, for example, about 2 to 3 nm. When the insulation film GF is formed by a thermal oxidation method, over the element isolation region ST, the insulation film GF is not formed.

Then, over the main surface (the entire main surface) of the semiconductor substrate SB, namely, over the insulation film GF and over the element isolation region ST, a silicon film PS1 is formed (deposited) as a conductive film for forming the selection gate electrode SG (Step 5 of FIG. 7).

The silicon film PS1 is formed of a polycrystal silicon film (polysilicon film), and can be formed using a CVD (Chemical Vapor Deposition) method, or the like. The film thickness (deposited film thickness) of the silicon film PS1 can be set at, for example, about 140 nm. The following is also possible: during deposition, the silicon film PS1 is formed as an amorphous silicon film; then, by the subsequent heat treatment, the silicon film PS1 formed of an amorphous silicon film is changed into the silicon film PS1 formed of a polycrystal silicon film.

The silicon film PS1 is doped with an n type impurity by ion implantation after deposition, or doped with an n type impurity during deposition by a depositing gas, and thereby can be formed into a low-resistivity doped polysilicon film.

Then, over the main surface (the entire main surface) of the semiconductor substrate SB, namely, over the silicon film PS1, an insulation film CPZ for forming the cap insulation film CP is formed (Step 6 of FIG. 7).

The insulation film CPZ is formed of, for example, a silicon nitride film. As the insulation film CPZ, a lamination film of a silicon oxide film, and a silicon nitride film formed over the silicon oxide film, and thicker than the silicon oxide film can also be used. The film thickness (deposited film thickness) of the insulation film CPZ can be set at, for example, about 50 nm.

Figure 13:
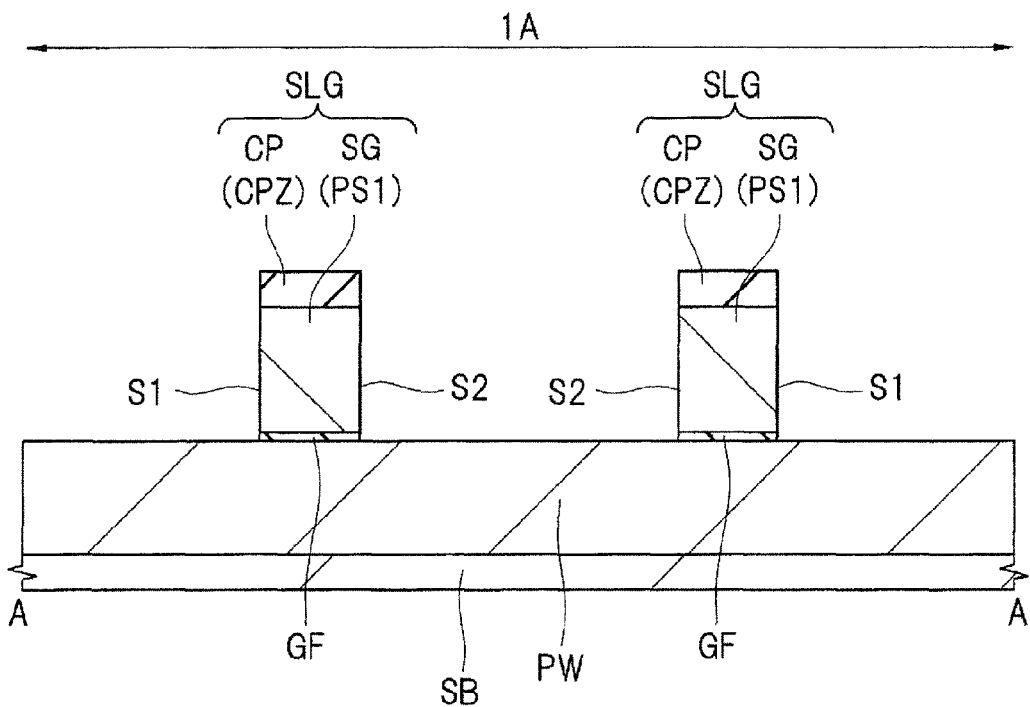
FIG. 13 is an essential part cross sectional view of the semiconductor device during a manufacturing step following FIG. 11.
Figure 14:
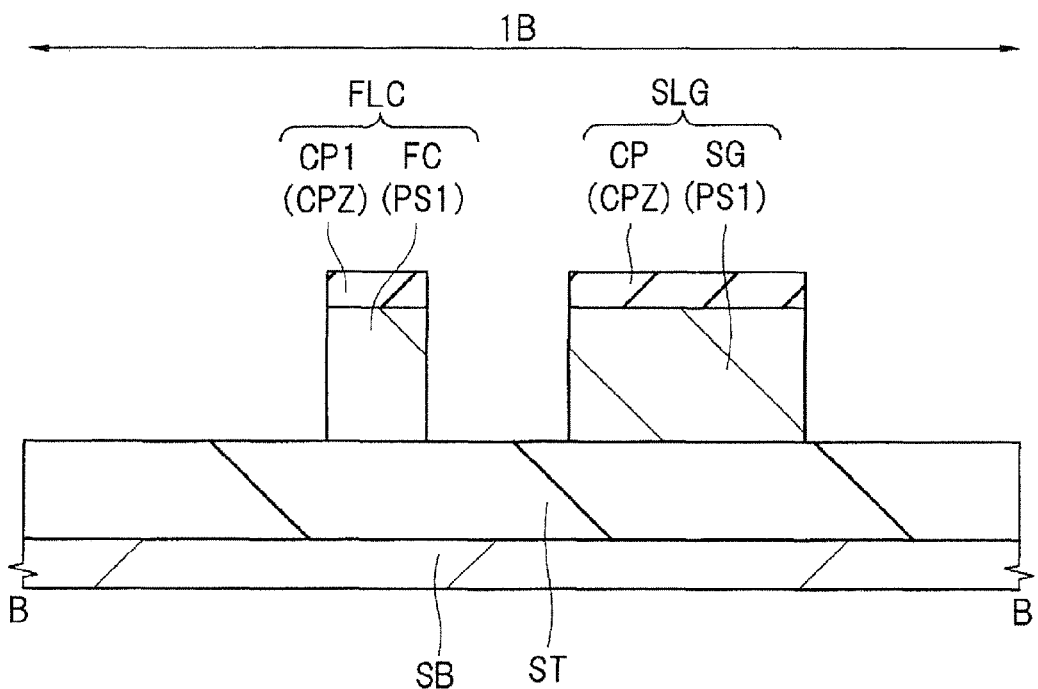
FIG. 14 is an essential part cross sectional view of the same semiconductor device as in FIG. 13 during a manufacturing step.

Then, as shown in FIGS. 13 and 14, the lamination film of the silicon film PS1 and the insulation film CPZ over the silicon film PS1 is patterned using a photolithography technology and an etching technology. As a result, a selection gate SLG and a selection gate FLC are formed (Step 7 of FIG. 7).

The patterning step of Step 7 can be performed specifically, for example, in the following manner. Namely, a photoresist pattern (not shown) is formed over the lamination film of the silicon film PS1 and the insulation film CPZ using a photolithography method. Using the photoresist pattern as an etching mask, the insulation film CPZ and the silicon film PS1 are sequentially etched (dry etched), and are patterned. Subsequently, the photoresist pattern is removed.

The selection gate SLG has a lamination structure of the selection gate electrode SG and the cap insulation film CP over the selection gate electrode SG. The selection gate electrode SG is formed of a patterned silicon film PS1, and the cap insulation film CP is formed of a patterned insulation film CPZ. The selection gate FLC has a lamination structure of the selection gate electrode FC, and the cap insulation film CP1 over the selection gate electrode FC. The selection gate electrode FC is formed of a patterned silicon film PS1, and the cap insulation film CP1 is formed of a patterned insulation film CPZ. The selection gate SLG and the selection gate FLC are not coupled with each other, and are separated from each other. Accordingly, the selection gate electrode SG and the selection gate electrode FC are not coupled with each other, and are separated from each other. Whereas, the cap insulation film CP and the cap insulation film CP1 are not coupled with each other, and are separated from each other. The selection gate FLC is formed closer to the side surface S1 of the selection gate SLG in the shunt region 1B. Namely, the selection gate FLC is formed in such a manner as to face the side surface S1 of the selection gate SLG in the shunt region 1B. Further, the element isolation region ST is formed in the entire shunt region 1B. Accordingly, the selection gate FLC is formed over the element isolation region ST. Whereas, in the shunt region 1B, the selection gate SLG has the contact part SGa. At this stage, the contact part SGa has a lamination structure of the selection gate electrode SG, and the cap insulation film CP over the selection gate electrode SG.

Whereas, in the memory cell region 1A, the insulation film GF left under the selection gate SLG serves as the gate insulation film of the selection transistor. Therefore, in the memory cell region 1A, the selection gate electrode SG formed of the silicon film PS1 is formed over the semiconductor substrate SB (p type well PW) via the insulation film GF as the gate insulation film.

In the memory cell region 1A, the portions of the insulation film GF except for the portions covered with the selection gate electrode SG can be removed by dry etching performed at the patterning step of Step 7, or by performing wet etching after the dry etching.

Figure 15:
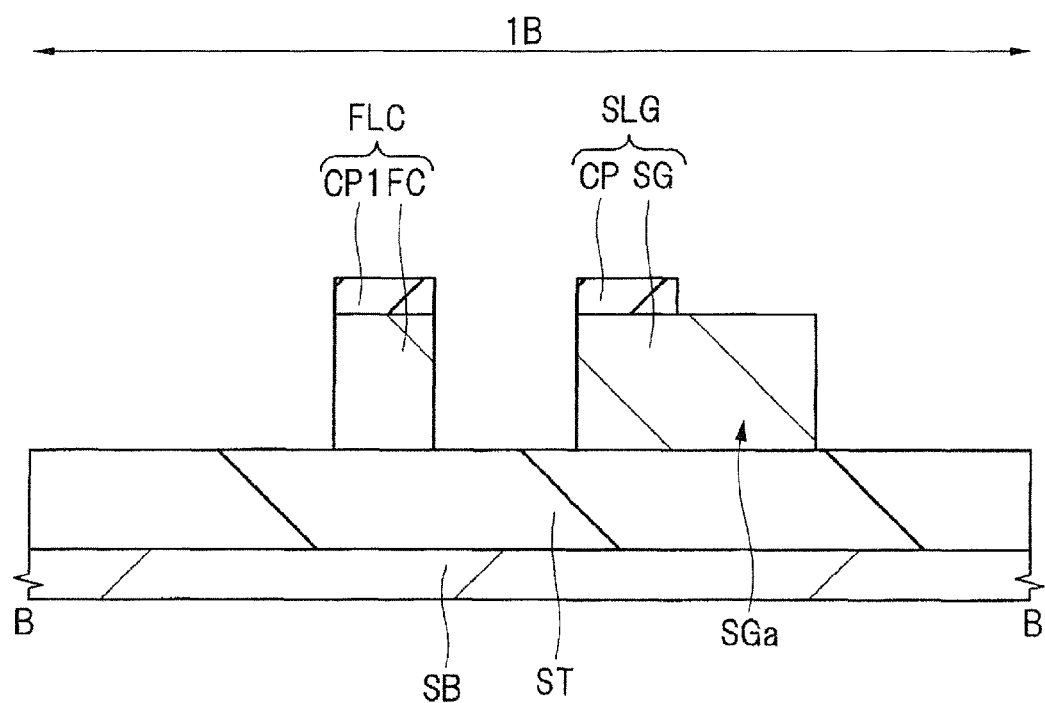
FIG. 15 is an essential part cross sectional view of the semiconductor device during a manufacturing step following FIG. 14.

Then, as shown in FIG. 15, at the contact part SGa of the selection gate SLG, the cap insulation film CP is selectively removed (Step 8 of FIG. 7).

Step 8 can be performed specifically, for example, in the following manner. First, in the shunt region 1B, such a photoresist pattern as to expose the contact part SGa of the selection gate SLG, and to cover the selection gate SLG except for the contact part SGa and the entire selection gate FLC is formed using a photolithography technology. The photoresist pattern also covers the entire memory cell region 1A. Then, using the photoresist pattern as an etching mask, the cap insulation film CP at the contact part SGa is selectively removed by etching. As a result, at the contact part SGa of the selection gate SLG, the cap insulation film CP is removed. Accordingly, the top surface of the selection gate electrode SG is exposed, and the selection gate SLG except for the contact part SGa keeps the lamination structure of the selection gate electrode SG and the cap insulation film CP. Whereas, the selection gate FLC keeps the lamination structure of the selection gate electrode FC and the cap insulation film CP1. Subsequently, the photoresist pattern is removed. Incidentally, in the memory cell region 1A, the structure of FIG. 13 is kept before and after Step 8.

Then, in order to adjust the threshold voltage of the memory transistor to be formed later in the memory cell region 1A, if required, channel dope ion implantations is performed on the surface layer part of the p type well PW of the memory cell region 1A.

Figure 16:
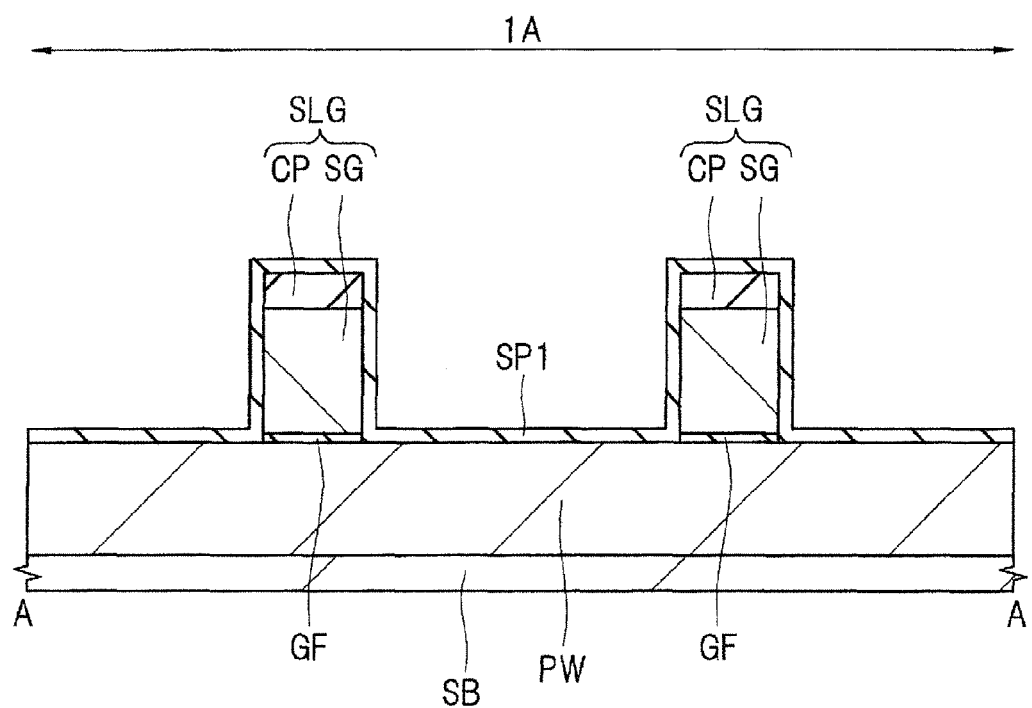
FIG. 16 is an essential part cross sectional view of the semiconductor device during a manufacturing step following FIG. 15.
Figure 17:
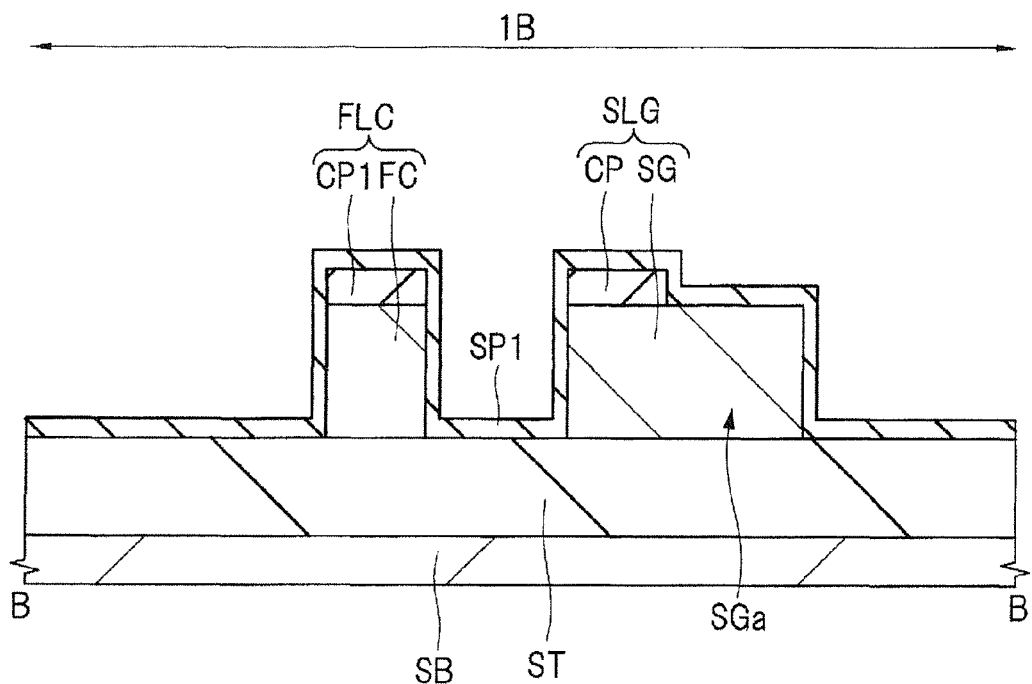
FIG. 17 is an essential part cross sectional view of the same semiconductor device as in FIG. 16 during a manufacturing step.

Then, as shown in FIGS. 16 and 17, over the main surface (the entire main surface) of the semiconductor substrate SB, an insulation film SP1 is formed (deposited) in such a manner as to cover the selection gate SLG and the selection gate FLC (Step 9 of FIG. 7). The insulation film SP1 is an insulation film for forming the insulation film SP, is preferably formed of a silicon oxide film, and can be formed using a CVD method, or the like. The film thickness (deposited film thickness) of the insulation film SP1 can be set at, for example, about 10 to 15 nm.

Figure 18:
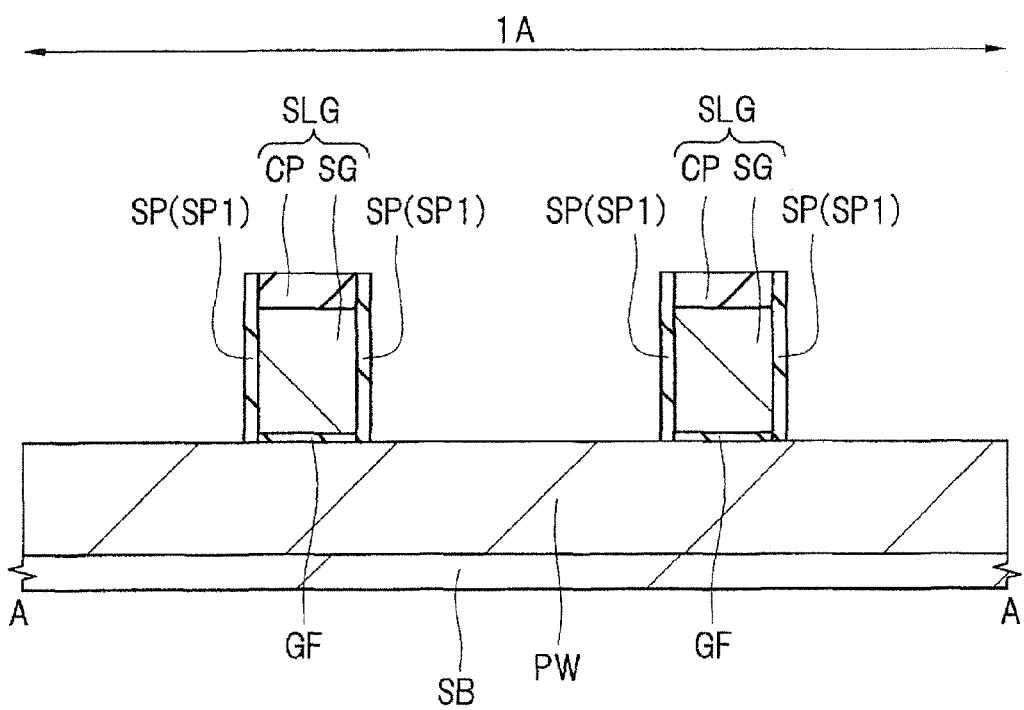
FIG. 18 is an essential part cross sectional view of the semiconductor device during a manufacturing step following FIG. 16.
Figure 19:
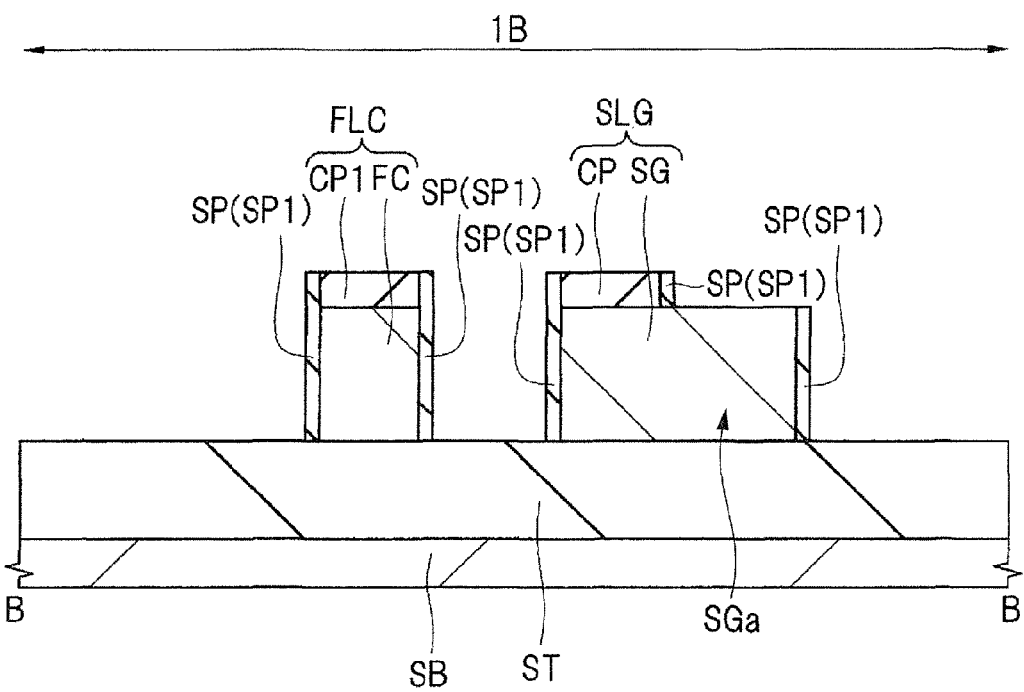
FIG. 19 is an essential part cross sectional view of the same semiconductor device as in FIG. 18 during a manufacturing step.

Then, as shown in FIGS. 18 and 19, the insulation film SP1 is anisotropically etched (etched back). As a result, over the side surfaces (sidewalls) of the selection gate SLG, and over the side surfaces (sidewalls) of the selection gate FLC, insulation films (sidewall insulation films) SP which are sidewall insulation films are formed, respectively (Step 10 of FIG. 7).

Specifically, in Step 10, the insulation film SP1 is anisotropically etched (etched back). As a result, the insulation films SP1 are selectively left over the side surfaces of the selection gate SLG, and over the side surfaces of the selection gate FLC, and other insulation films SP1 are removed. The insulation films SP1 left over the side surfaces of the selection gate SLG, and over the side surfaces of the selection gate FLC form insulation films SP as sidewall insulation films.

The insulation film SP is formed over the entire side surface of the selection gate SLG, and the entire side surface of the selection gate FLC. The insulation film SP formed at the side surface of the selection gate SLG and the insulation film SP formed at the side surface of the selection gate FLC are not coupled with each other, and are separated from each other.

The insulation film SP formed on the selection gate SLG is formed at the entire side surface of the selection gate SLG continuously and integrally in such a manner as to surround the circumference of the selection gate SLG in a plan view. Accordingly, the insulation films SP formed over respective side surfaces of the selection gate SLG are formed integrally, and are coupled with each other.

Whereas, the insulation film SP formed on the selection gate FLC is formed at the entire side surface of the selection gate FLC continuously and integrally in such a manner as to surround the circumference of the selection gate FLC in a plan view. Accordingly, the insulation films SP formed over respective side surfaces of the selection gate FLC are formed integrally, and are coupled with each other.

The thickness of the insulation film SP formed in Step 10 is roughly in agreement with the deposited film thickness of the insulation film SP1 in Step 9, and can be set at, for example, about 10 to 15 nm.

Figure 20:
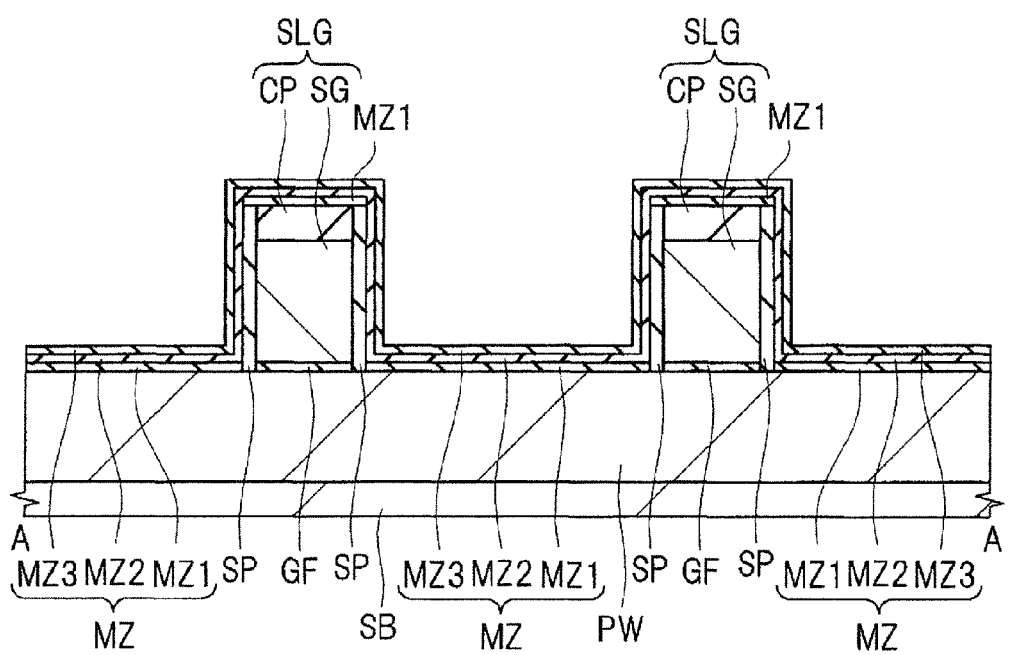
FIG. 20 is an essential part cross sectional view of the semiconductor device during a manufacturing step following FIG. 18.
Figure 21:
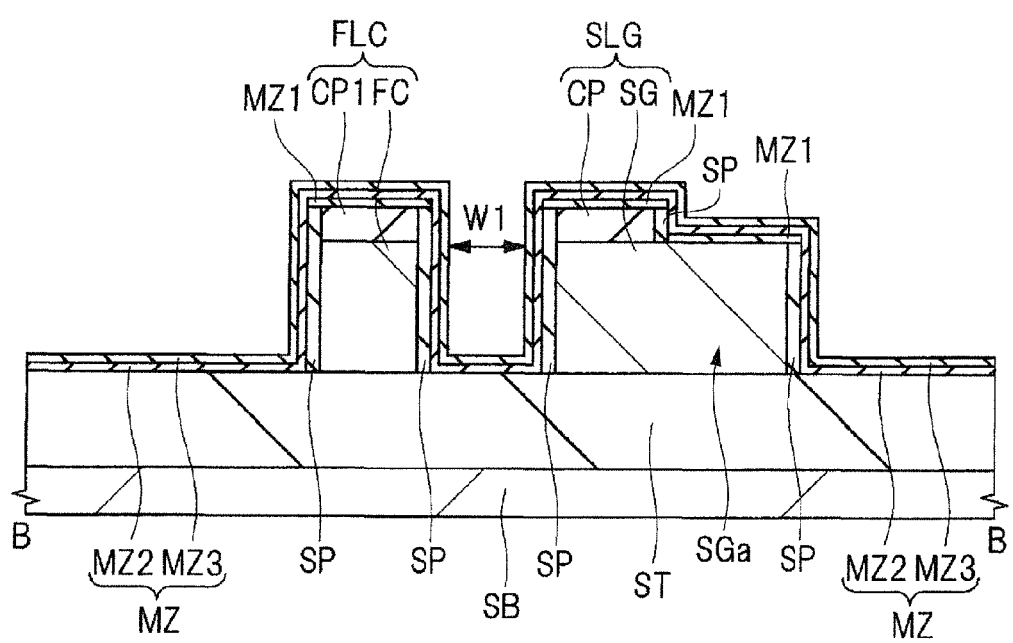
FIG. 21 is an essential part cross sectional view of the same semiconductor device as in FIG. 20 during a manufacturing step.

Then, a cleaning treatment is performed, thereby to subject the main surface of the semiconductor substrate SB to a purification treatment. Then, as shown in FIGS. 20 and 21, over the entire main surface of the semiconductor substrate SB, namely, over the main surface (surface) of the semiconductor substrate SB, over the surface (the top surface and the side surfaces) of the selection gate SLG, and over the surface (the top surface and the side surfaces) of the selection gate FLC, an insulation film MZ for the gate insulation film of the memory transistor is formed (Step 11 of FIG. 8). In Step 11, the insulation film MZ is formed over the semiconductor substrate SB in such a manner as to cover the selection gate SLG and the selection gate FLC.

The insulation film MZ is an insulation film for the gate insulation film of the memory transistor, and is an insulation film having a charge accumulation layer (charge accumulation part) in the inside thereof. The insulation film MZ is formed of a lamination film (lamination insulation film) having an insulation film MZ1, an insulation film MZ2 formed over the insulation film MZ1, and an insulation film MZ3 formed over the insulation film MZ2. Herein, the insulation film MZ1 and the insulation film MZ3 each can be formed of a silicon oxide film (oxide film). The insulation film MZ2 can be formed of a silicon nitride film (nitride film).

For forming the insulation film MZ, for example, first, the insulation film MZ1 formed of a silicon oxide film is formed by a thermal oxidation method; then, over the insulation film MZ1, the insulation film MZ2 formed of a silicon nitride film is deposited by a CVD method; and further, over the insulation film MZ2, the insulation film MZ3 formed of a silicon oxide film is formed by a CVD method or a thermal oxidation method, or both thereof. As the thermal oxidation method, ISSG (In Situ Steam Generation) oxidation can also be used. As a result, it is possible to form the insulation film (lamination insulation film) MZ having the insulation film MZ1 (silicon oxide film), the insulation film MZ2 (silicon nitride film), and the insulation film MZ3 (silicon oxide film).

The thickness of the insulation film MZ1 can be set at, for example, about 4 to 6 nm. The thickness of the insulation film MZ2 can be set at, for example, about 6 to 8 nm. The thickness of the insulation film MZ3 can be set at, for example, about 9 to 11 nm.

The insulation film MZ1 is formed over the substrate region (over the silicon surface) of the semiconductor substrate SB, but is not formed over the element isolation region ST, and over the insulation film SP. Namely, the silicon oxide film as the insulation film MZ1 is formed at the surface of the semiconductor substrate SB (p type well PW) at the portions thereof not covered with the selection gates SLG and FLC, but is not formed over the element isolation region ST, and over the insulation film SP. This is remarkable when the silicon oxide film as the insulation film MZ1 is formed by a thermal oxidation method. Namely, the element isolation region ST mainly including a silicon oxide, and the insulation film SP mainly including a silicon oxide are not oxidized even when a thermal oxidation treatment for forming the insulation film MZ1 is performed. For this reason, the silicon oxide film as the insulation film MZ1 is formed over the substrate region (over the silicon surface) of the semiconductor substrate SB, but is not formed over the element isolation region ST, and over the insulation film SP. The cap insulation film CP is mainly formed of a silicon nitride film. For this reason, the insulation film MZ1 can also be formed over the top surface of the cap insulation film CP.

For this reason, when the insulation film MZ is formed in Step 11, of the formed insulation film MZ, the portion thereof formed over the substrate region (over the silicon surface) of the semiconductor substrate SB is formed of a lamination film (lamination insulation film) having the insulation film MZ1, the insulation film MZ2 over the insulation film MZ1, and the insulation film MZ3 over the insulation film MZ2. On the other hand, of the formed insulation film MZ, the portion formed over the element isolation region ST, and the portion formed over the insulation film SP do not have the insulation film MZ1, and are each formed of a lamination film (lamination insulation film of the insulation film MZ2, and the insulation film MZ3 over the insulation film MZ2.

Alternatively, in the insulation film MZ1 formation step (thermal oxidation step), the insulation film SP may increase in thickness. The thickness of the insulation film SP at the stage of having been formed at Step 10 can be controlled by adjusting the deposited film thickness of the insulation film SP1 in Step 9. For this reason, the deposited film thickness of the insulation film SP1 in Step 9 may desirably be previously set so that, at the stage of having formed the insulation film MZ in Step 11, the thickness of the insulation film SP is larger than the thickness of the insulation film MZ1. As a result, the thickness of the insulation film SP is larger than the thickness of the insulation film MZ1. Accordingly, as shown in FIG. 3, the total thickness T2 of the insulation film SP and the insulation film MZ interposed between the selection gate electrode SG and the memory gate electrode MG is set larger than the thickness T1 of the insulation film MZ interposed between the semiconductor substrate SB (p type well PW) and the memory gate electrode MG (T1<T2).

Figure 22:
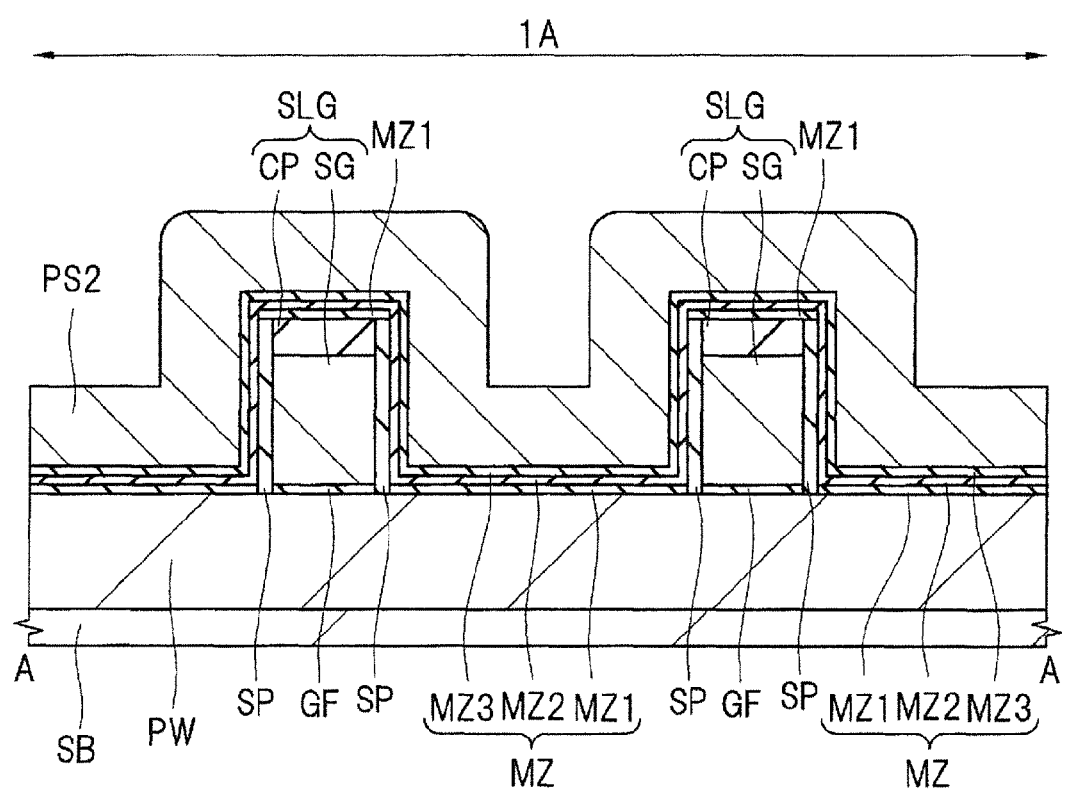
FIG. 22 is an essential part cross sectional view of the semiconductor device during a manufacturing step following FIG. 20.
Figure 23:
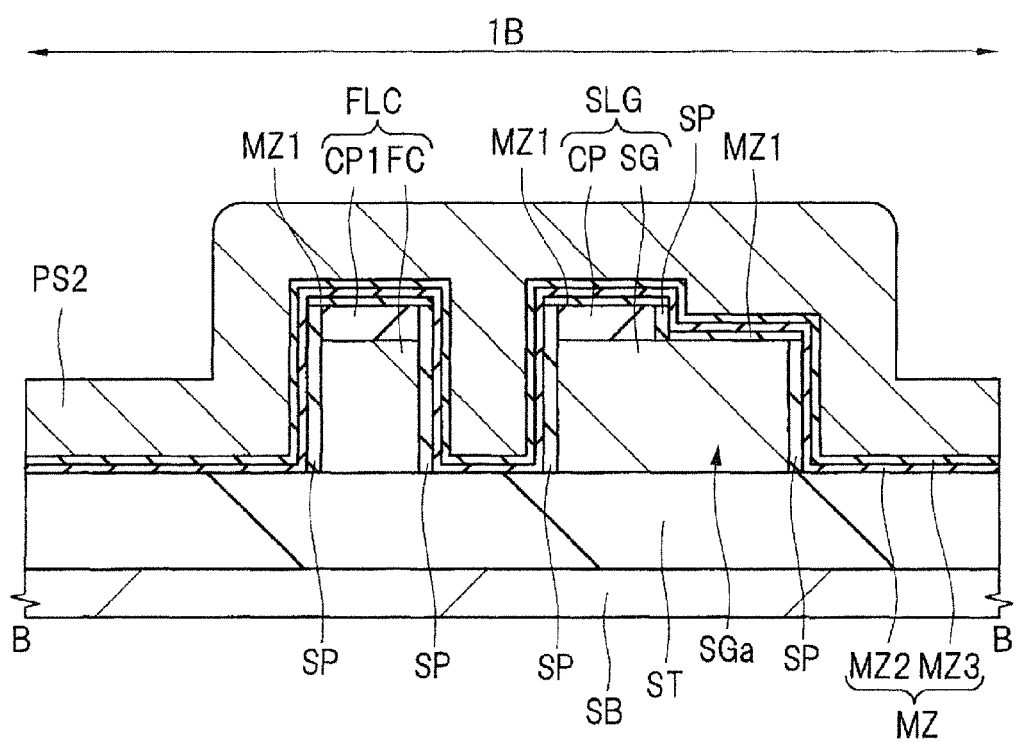
FIG. 23 is an essential part cross sectional view of the same semiconductor device as in FIG. 22 during a manufacturing step.

Then, as shown in FIGS. 22 and 23, over the main surface (the entire main surface) of the semiconductor substrate SB, namely, over the insulation film MZ, a silicon film PS2 is formed (deposited) as a conductive film for forming the memory gate electrode MG in such a manner as to cover the selection gate SLG and the selection gate FLC (Step 12 of FIG. 8).

The silicon film PS2 is formed of a polycrystal silicon film, and can be formed using a CVD method, or the like. The film thickness (deposited film thickness) of the silicon film PS2 can be set at, for example, about 50 to 100 nm. The deposited film thickness of the silicon film PS2 is set according to the design value of the gate length of the memory gate electrode MG to be formed later. For deposition, the following is also possible: the silicon film PS2 is formed as an amorphous silicon film; then, by a subsequent heat treatment, the silicon film PS2 formed of the amorphous silicon film can be changed into the silicon film PS2 formed of a polycrystal silicon film.

In Step 12, a silicon film PS2 is preferably formed so that the region between the selection gate SLG and the selection gate FLC adjacent to each other in the Y direction in the shunt region 1B is embedded (filled) with the silicon film PS2.

The silicon film PS2 is doped with an n type impurity by ion implantation after deposition, or doped with an n type impurity by a depositing gas during deposition, and thereby can be formed into a low-resistivity doped polysilicon film.

Then, by an anisotropic etching technology, the silicon film PS2 is etched back (etched, dry etched, or anisotropically etched) (Step 13 of FIG. 8).

Figure 24:
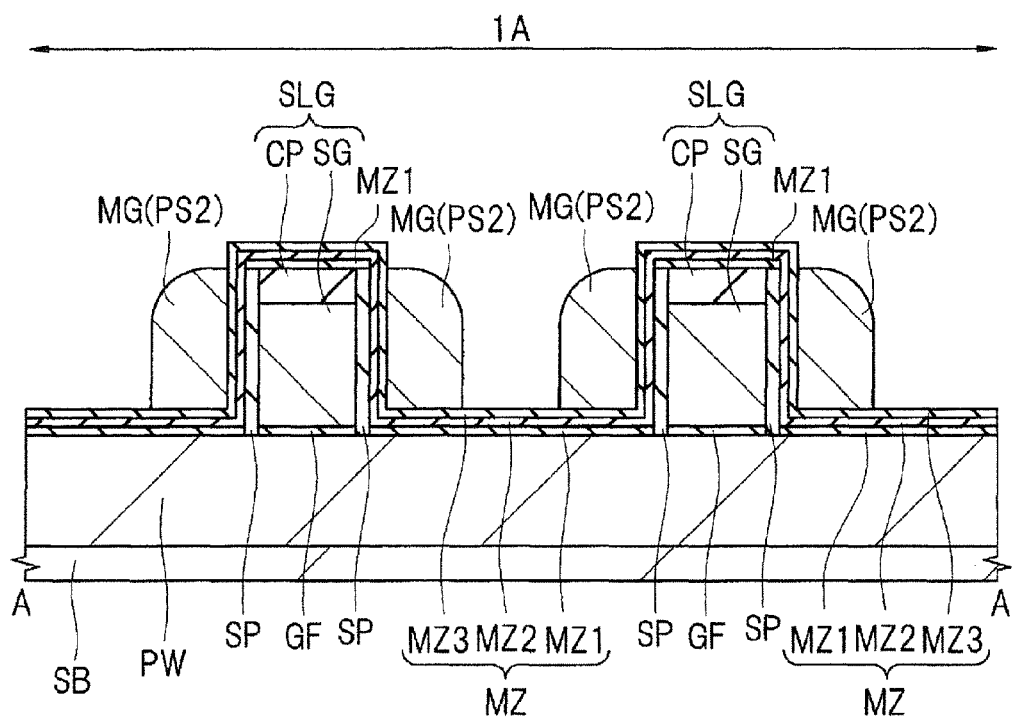
FIG. 24 is an essential part cross sectional view of the semiconductor device during a manufacturing step following FIG. 22.
Figure 25:
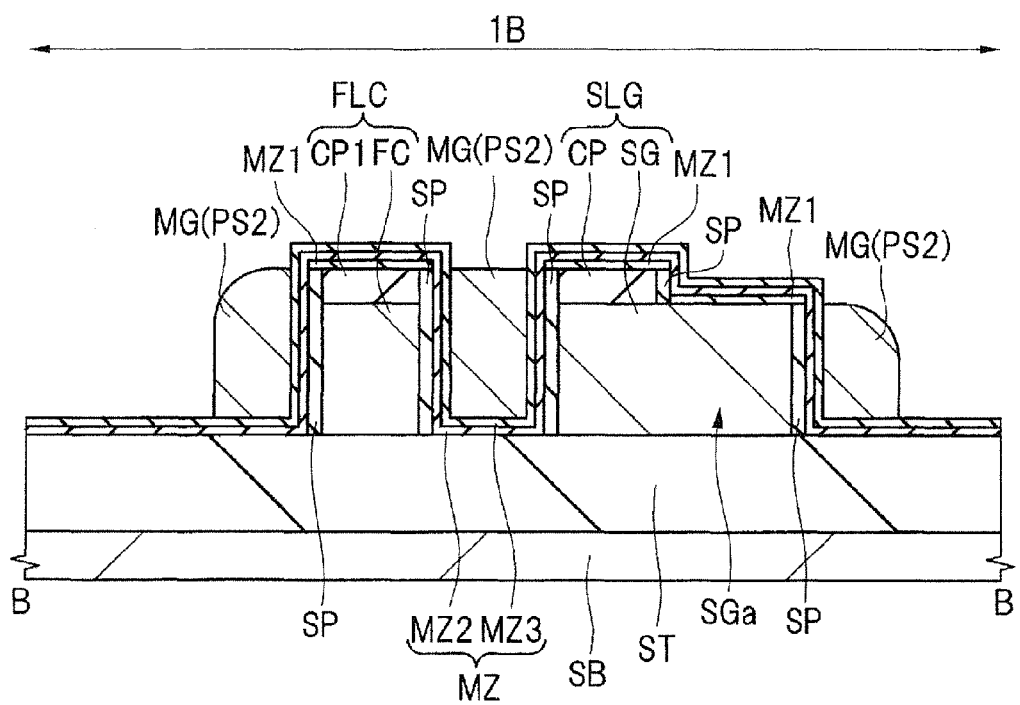
FIG. 25 is an essential part cross sectional view of the same semiconductor device as in FIG. 24 during a manufacturing step.

In the Step 13, the silicon film PS2 is anisotropically etched (etched back) by the deposited film thickness of the silicon film PS2. As a result, the silicon film PS2 is left in a sidewall spacer shape over each side surface of the selection gate SLG and the selection gate FLC via the insulation films SP and MZ, and a part of the silicon film PS2 is left between the selection gate FLC and the selection gate SLG, and the silicon film PS2 in other regions is removed. As a result, as shown in FIGS. 24 and 25, a memory gate electrode MG is formed over each side surface (sidewall) of the selection gate SLG and the selection gate FLC via the insulation film SP and the insulation film MZ. The memory gate electrode MG is formed of the silicon film PS2 left in a sidewall spacer shape over each side surface of the selection gate SLG and the selection gate FLC via the insulation films SP and MZ, and the silicon film PS2 left between the selection gate FLC and the selection gate SLG. The memory gate electrode MG is formed over the insulation film MZ in such a manner as to be adjacent to the selection gate SLG or the selection gate FLC via the insulation films SP and MZ.

However, at the stage of having performed the etch back step of Step 13, the memory gate electrode MG is formed continuously and integrally in such a manner as to surround the circumferences of the selection gate SLG and the selection gate FLC in a plan view. Namely, at the stage of having performed the etch back step of Step 13, the formed memory gate electrode MG integrally has a portion surrounding the circumference of the selection gate SLG, a portion surrounding the circumference of the selection gate FLC, and a portion filling the space between the selection gate FLC and the selection gate SLG in a plan view. For this reason, at the stage of having performed the etch back step of Step 13, the memory gate electrodes MG are formed not at one of, but both of the opposite side surfaces (S1 and S2) of the selection gate SLG.

In Step 12, the silicon film PS2 is formed so that the region between the selection gate FLC and the selection gate SLG adjacent to each other in the Y direction in the shunt region 1B is embedded (filled) with the silicon film PS2. Then, in Step 13, the silicon film PS2 is etched back in such a manner as not to fully remove the silicon film PS2, but to partially leave the silicon film PS2 between the selection gate FLC and the selection gate SLG adjacent to each other in the Y direction in the shunt region 1B. For this reason, when the etch back step of Step 13 is performed, between the selection gate FLC and the selection gate SLG adjacent to each other in the Y direction in the shunt region 1B, a part of the silicon film PS2 is left to be a part of the memory gate electrode MG. When the etch back step of Step 13 is performed, the insulation film MZ in a region not covered with the memory gate electrode MG is exposed.

Figure 26:
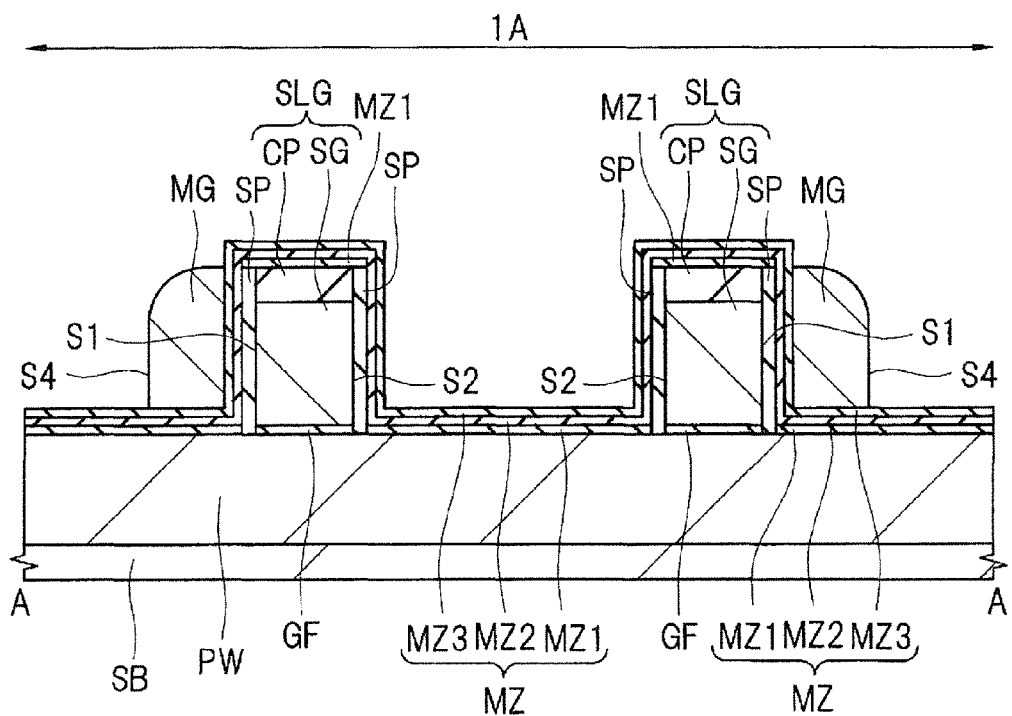
FIG. 26 is an essential part cross sectional view of the semiconductor device during a manufacturing step following FIG. 24.
Figure 27:
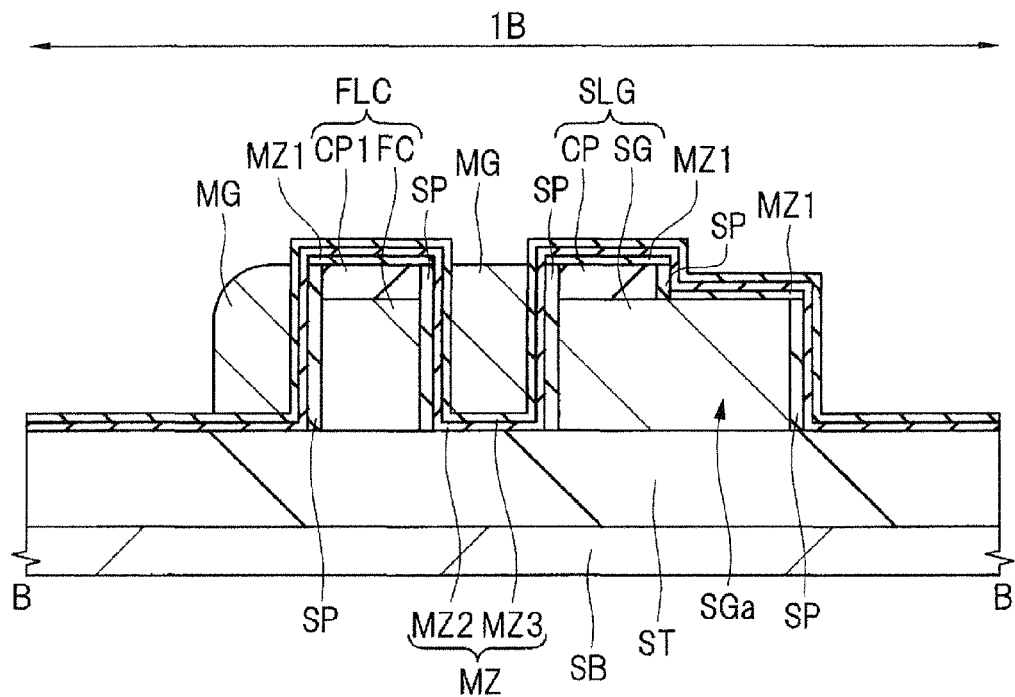
FIG. 27 is an essential part cross sectional view of the same semiconductor device as in FIG. 26 during a manufacturing step.

Then, as shown in FIGS. 26 and 27, the memory gate electrode MG on one side of the selection gate SLG of the memory gate electrodes formed on the opposite sides thereof, specifically the memory gate electrode MG closer to the side surface S2 of the selection gate SLG S2 is removed (Step 14 of FIG. 8). Namely, in Step 14, the memory gate electrode MG at a portion thereof formed over the side surface S2 of the selection gate SLG via the insulation films SP and MZ is selectively removed.

Step 14 can be performed specifically in the following manner. Namely, first, using a photolithography technology, a photoresist pattern (not shown) is formed over the semiconductor substrate SB. The photoresist pattern covers the memory gate electrode MG closer to the side surface S1 of the selection gate SLG, and the memory gate electrode MG closer to the side surface S2 of the selection gate SLG. Then, by dry etching using the photoresist pattern as an etching mask, the memory gate electrode MG at a portion thereof exposed from the photoresist pattern is removed. With the etching, the memory gate electrode MG closer to the side surface S2 of the selection gate SLG is selectively removed. On the other hand, the memory gate electrode MG closer to the side surface S1 of the selection gate SLG has been covered with the photoresist pattern, and hence is left without being etched. Namely, the memory gate electrode MG at a portion thereof formed over the side surface S2 of the selection gate SLG via the insulation films SP and MZ is selectively etched and removed. The memory gate electrode MG formed over the side surface S1 of the selection gate SLG via the insulation films SP and MZ, the memory gate electrode MG at a portion thereof formed over the side surface of the selection gate FLC via the insulation films SP and MZ, and the memory gate electrode MG at a portion thereof formed between the selection gate FLC and the selection gate SLG have been covered with the photoresist pattern, and hence are left without being etched. Then, the photoresist pattern is removed.

Step 14 is performed. As a result, the memory gate electrode MG is not formed closer to the side surface S2 of the selection gate SLG (over the side surface S2), and are integrally formed over the side surface S1 of the selection gate SLG, over the side surface of the selection gate FLC, and between the selection gate FLC and the selection gate SLG. Namely, the memory gate electrode MG after performing Step 14 integrally has the portion formed in a sidewall spacer shape over the side surface S1 of the selection gate SLG via the insulation films SP and MZ, the portion formed in a sidewall spacer shape over the side surface of the selection gate FLC via the insulation films SP and MZ, and the portion filling the region between the selection gate FLC and the selection gate SLG. Accordingly, after performing Step 14, the memory gate electrode MG is formed not over both the opposite side surfaces S1 and S2 of the selection gate SLG, but on one (herein, the side surface S1).

Figure 28:
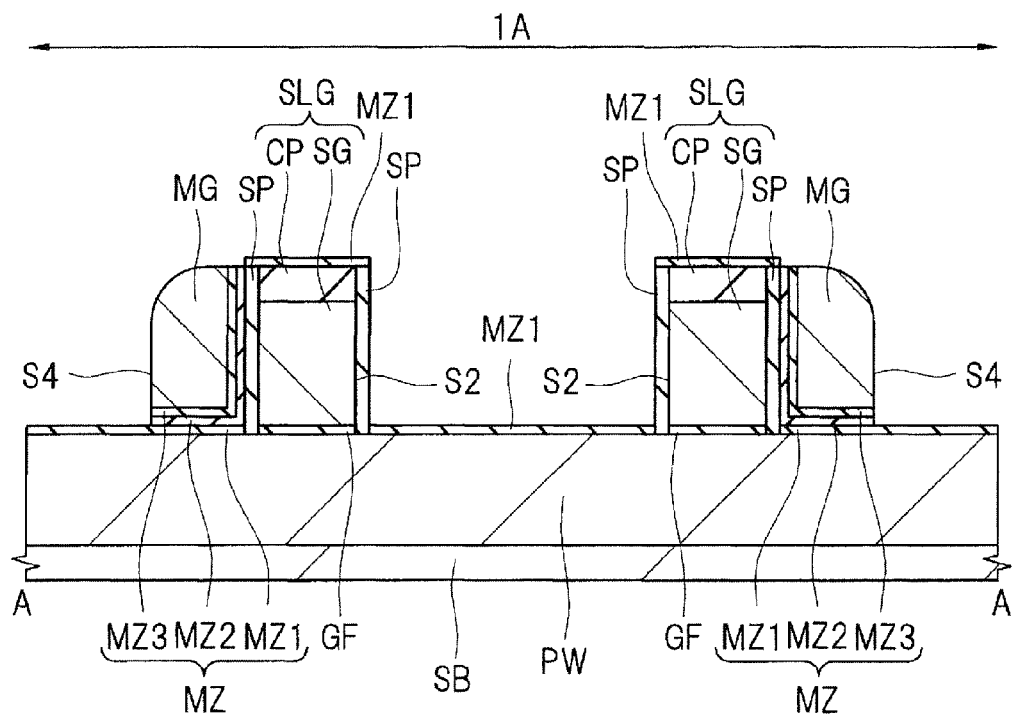
FIG. 28 is an essential part cross sectional view of the semiconductor device during a manufacturing step following FIG. 26.
Figure 29:
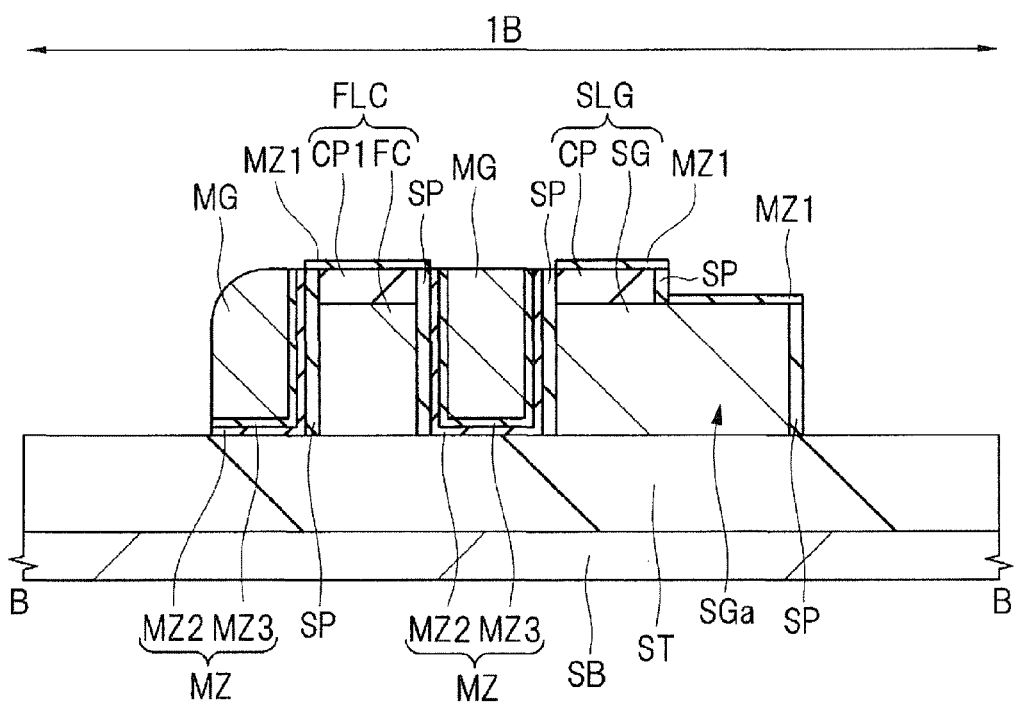
FIG. 29 is an essential part cross sectional view of the same semiconductor device as in FIG. 28 during a manufacturing step.

Then, as shown in FIGS. 28 and 29, the portions of the insulation films MZ3 and MZ2 forming the insulation film MZ exposed without being covered with the memory gate electrode MG are removed by etching (e.g., wet etching) (Step 15 of FIG. 8). At this step, of the insulation films MZ3 and MZ2, the portions situated under the memory gate electrode MG, the portions situated between the memory gate electrode MG and the selection gate SLG, and the portions situated between the memory gate electrode MG and the selection gate FLC are not removed, and are left. The insulation films MZ3 and MZ2 in other regions are removed.

In Step 15, first, the etching step for removing the insulation film MZ3 is performed. Then, the etching step for removing the insulation film MZ2 is performed. In the etching step for removing the insulation film MZ3, etching is performed under etching conditions such that the insulation film MZ2 is less likely to be etched than the insulation film MZ3. Thus, the exposed insulation film MZ3 is selectively etched, and the insulation film MZ2 is allowed to function as an etching stopper film. In the etching step for removing the insulation film MZ2, etching is performed under etching conditions such that the insulation film MZ1 and the insulation film SP are less likely to be etched than the insulation film MZ2. Thus, the exposed insulation film MZ2 is selectively etched, and the insulation film MZ1 and the insulation film SP are each allowed to function as an etching stopper film.

As distinct from the present embodiment, when the insulation film MZ1 is further tried to be removed by etching after the etching step of the insulation film MZ2, the insulation film SP may also be removed together. This is particularly noticeable when the insulation film MZ1 and the insulation film SP are formed of the same material (herein, silicon oxide). However, in the present embodiment, it is important that the insulation film SP is not removed, and is left. For this reason, in Step 15, after the etching step of the insulation film MZ2, the etching step of the insulation film MZ1 is not performed. Thus, the insulation film MZ1 is not removed, and is left. As a result, it is possible to precisely prevent the insulation film SP from being etched and removed in Step 15.

Figure 30:
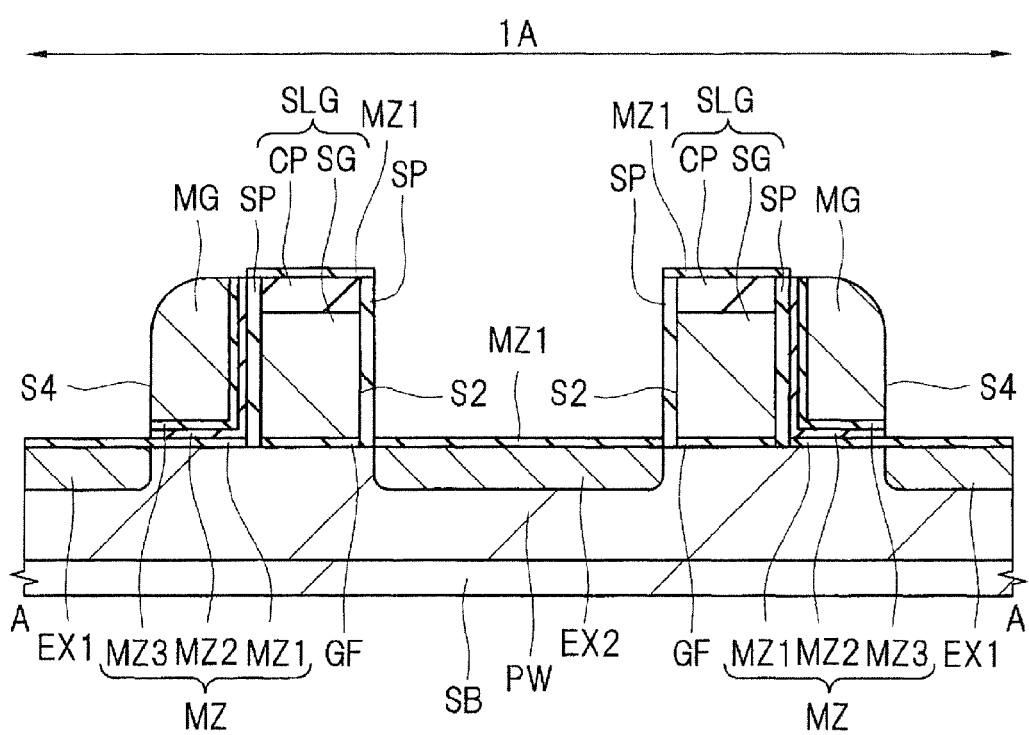
FIG. 30 is an essential part cross sectional view of the semiconductor device during a manufacturing step following FIG. 28.

Then, as shown in FIG. 30, n$^-$ type semiconductor regions (impurity diffusion layers) EX1 and EX2 are formed using anion implantation method, or the like (Step 16 of FIG. 8).

In Step 16, an n type impurity such as arsenic (As) or phosphorus (P) is ion-implanted into the semiconductor substrate SB (p type well PW) using the selection gate SLG, the insulation film SP, and the memory gate electrode MG as a mask (an ion implantation inhibiting mask). As a result n$^-$ type semiconductor regions EX1 and EX2 can be formed.

At this step, the n$^-$ type semiconductor region EX1 is formed in self-alignment with the side surface S4 of the memory gate electrode MG in the memory cell region 1A. This is due to the following: the memory gate electrode MG functions as a mask (an ion implantation inhibiting mask); thus, the n$^-$ type semiconductor region EX1 is formed. Whereas, the n$^-$ type semiconductor region EX2 is formed in self-alignment with the side surface of the insulation film SP over the side surface S2 of the selection gate SLG (the side surface opposite to the side thereof in contact with the selection gate SLG) in the memory cell region 1A. This is due to the following: the selection gate SLG and the insulation film SP over the side surface S2 of the selection gate SLG function as a mask (an ion implantation inhibiting mask); thus, the n$^-$ type semiconductor region EX2 is formed. The n$^-$ type semiconductor region EX1 and the n$^-$ type semiconductor region EX2 can each function as a part of a source/drain region (source or drain region) of the memory cell formed in the memory cell region 1A. The n$^-$ type semiconductor region EX1 and the n$^-$ type semiconductor region EX2 can be formed by the same ion implantation step, but can also be formed by different ion implantation steps.

Incidentally, the element isolation region ST is formed entirely in the shunt region 1B. For this reason, the n$^-$ type semiconductor regions EX1 and EX2 are not formed in the shunt region 1B. Accordingly, the shunt region 1B at the stage of having performed Step 16 is not shown.

Figure 31:
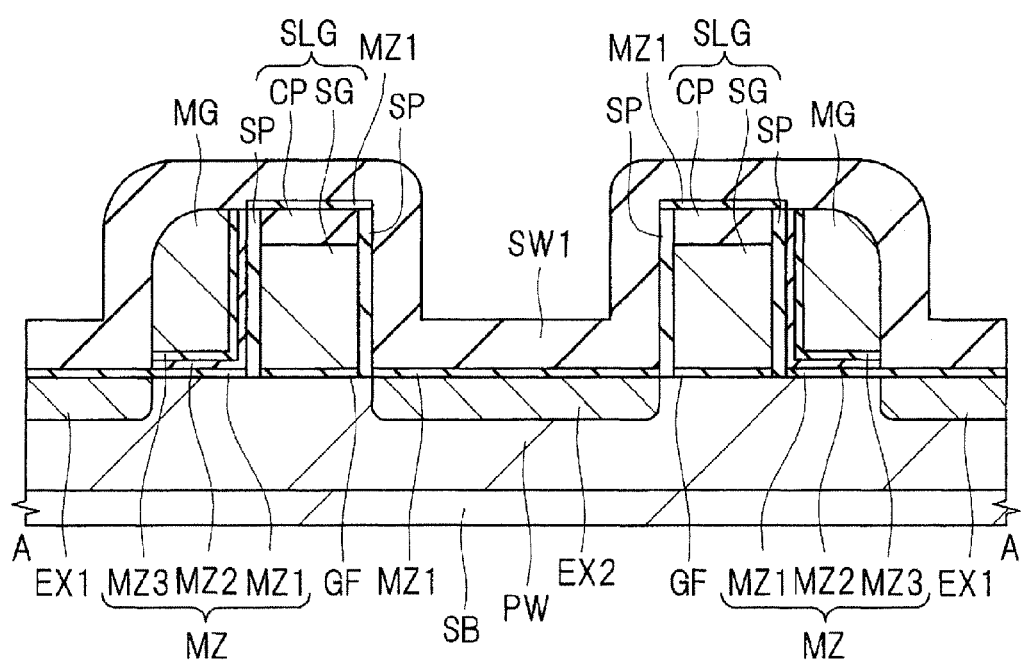
FIG. 31 is an essential part cross sectional view of the semiconductor device during a manufacturing step following FIG. 30.
Figure 32:
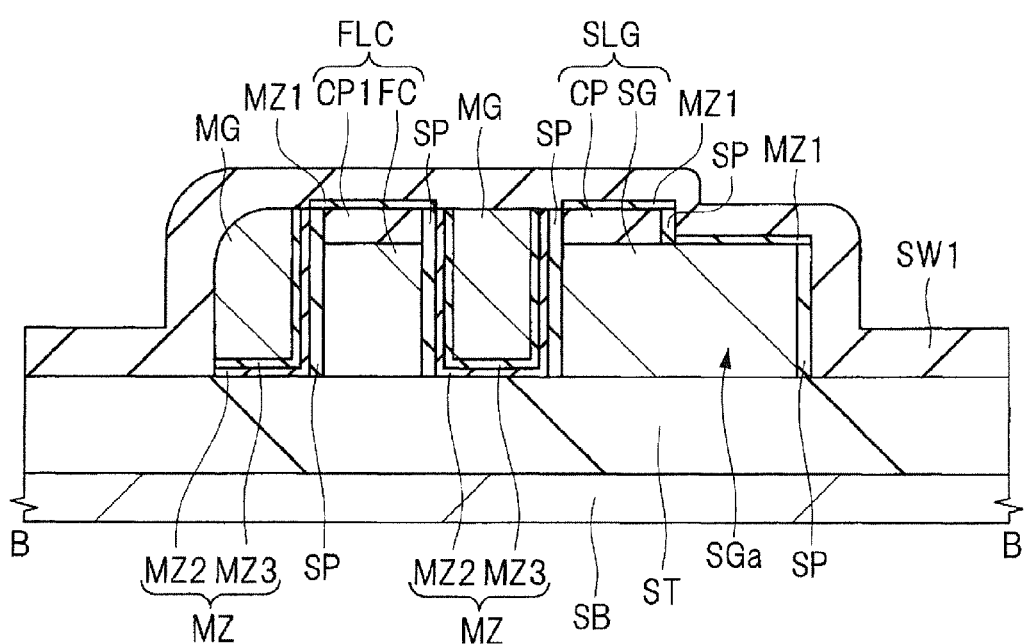
FIG. 32 is an essential part cross sectional view of the same semiconductor device as in FIG. 31 during a manufacturing step.

Then, as shown in FIGS. 31 and 32, an insulation film SW1 is formed over the main surface (the entire main surface) of the semiconductor substrate SB in such a manner as to cover the selection gate SLG, the selection gate FLC, the insulation film SP, the insulation film MZ1, and the memory gate electrode MG (Step 17 of FIG. 8). The insulation film SW1 is an insulation film for forming the sidewall spacer SW. The insulation film SW1 is formed of a silicon oxide film, a silicon nitride film, or a lamination film thereof, and can be formed using a CVD method, or the like.

Figure 33:
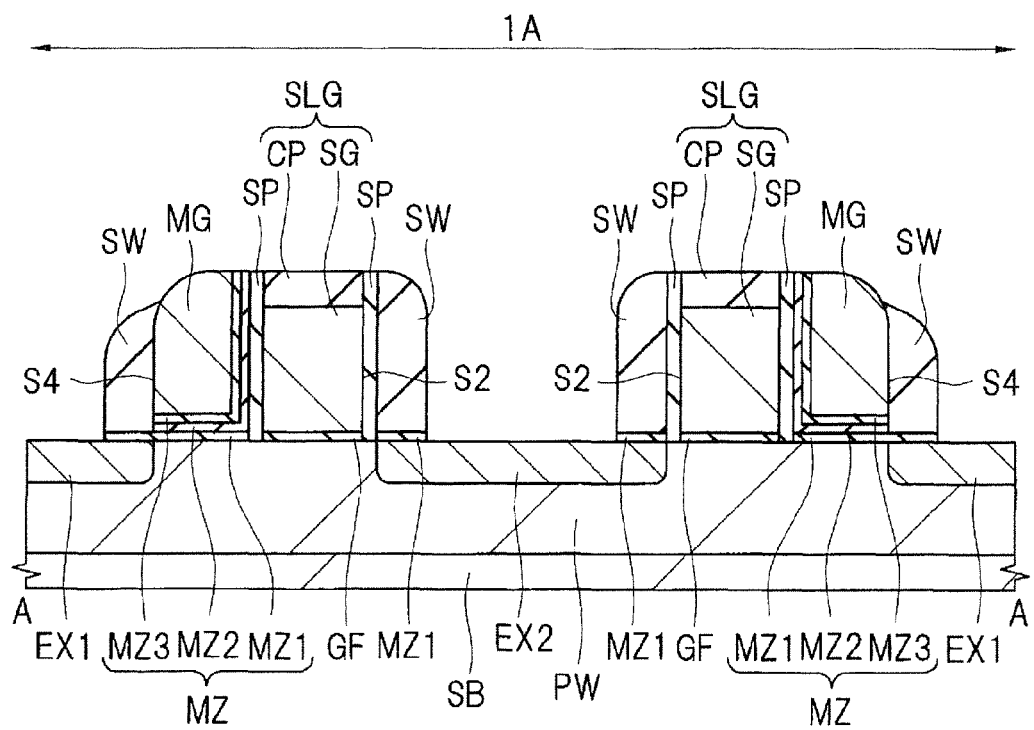
FIG. 33 is an essential part cross sectional view of the semiconductor device during a manufacturing step following FIG. 31.
Figure 34:
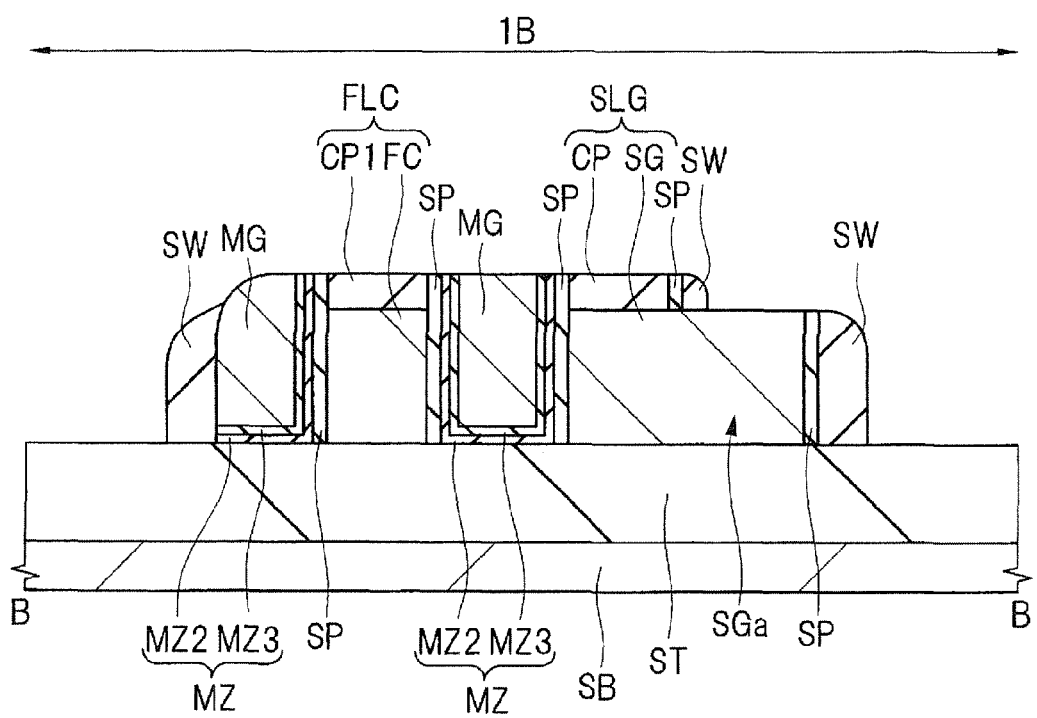
FIG. 34 is an essential part cross sectional view of the same semiconductor device as in FIG. 33 during a manufacturing step.

Then, as shown in FIGS. 33 and 34, the insulation film SW1 is anisotropically etched (etched back). As a result, sidewall spacers SW are formed over the side surface of the selection gate SLG, and over the side surface of the memory gate electrode MG (Step 18 of FIG. 8).

Specifically, in Step 18, the insulation film SW1 is anisotropically etched (etched back). As a result, the insulation film SW1 is selectively left over the side surface of the selection gate SLG, and over the side surface of the memory gate electrode MG, and other portions of the insulation films SW1 are removed. The insulation films SW1 left over the side surface of the selection gate SLG, and over the side surface of the memory gate electrode MG form the sidewall spacer SW as a sidewall insulation film.

Incidentally, the sidewall spacer SW is formed at the side surface S2 of the selection gate SLG opposite to the side thereof adjacent to the memory gate electrode MG via the insulation films SP and MZ of the side surfaces S1 and S2 of the selection gate SLG, or the side surface S4 of the memory gate electrode MG opposite to the side thereof adjacent to the selection gate SLG via the insulation films SP and MZ of the side surfaces S3 and S4 of the memory gate electrode MG. In other words, the sidewall spacers SW are formed over the side surface of the selection gate SLG on the side thereof not adjacent to the memory gate electrode MG via the insulation films SP and MZ, and over the side surface of the memory gate electrode MG on the side thereof not adjacent to the selection gates SLG and FLC via the insulation films SP and MZ. For this reason, the sidewall spacers SW are formed over the side surface S4 of the memory gate electrode MG, and over the side surface S2 of the selection gate SLG. Whereas, for the memory gate electrode MG at a portion thereof formed over the side surface of the selection gate FLC via the insulation films SP and MZ, over the side surface thereof opposite to the side thereof adjacent to the selection gate FLC via the insulation films SP and MZ, the sidewall spacer SW is formed. However, the insulation film SP has been formed over the side surface S2 of the selection gate SLG. Accordingly the sidewall spacer SW is formed over the side surface S2 of the selection gate SLG via the insulation film SP. In a plan view, the circumference of the selection gate FLC is surrounded by the memory gate electrode MG. For this reason, the sidewall spacer SW is not formed over the side surface of the selection gate FLC.

By the etching step for anisotropically etching the insulation film SW1, and forming the sidewall spacer SW in Step 18, or the subsequent etching, the exposed portions of the insulation film MZ1 can be removed. At this step, of the insulation film MZ1, the portion situated between the memory gate electrode MG and the semiconductor substrate SB, the portion situated between the sidewall spacer SW and the semiconductor substrate SB, the portion situated between the memory gate electrode MG and the selection gate SLG, and the portion situated between the memory gate electrode MG and the selection gate FLC are not removed, and are left, and the portions of the insulation film MZ1 in other regions are removed.

After performing Step 18, the insulation film MZ is interposed between the memory gate electrode MG and the semiconductor substrate SB (p type well PW), between the memory gate electrode MG and the element isolation region ST, between the memory gate electrode MG and the selection gate SLG, and between the memory gate electrode MG and the selection gate FLC. The insulation film MZ extends continuously over the region immediately under the memory gate electrode MG, the region between the memory gate electrode MG and the selection gate SLG, and the region between the memory gate electrode MG and the selection gate FLC. Incidentally, the insulation film MZ1 of the insulation film MZ extends between the memory gate electrode MG and the semiconductor substrate SB (p type well PW), and between the sidewall spacer SW and the semiconductor substrate SB (p type well PW). However, the insulation film MZ1 is not formed between the memory gate electrode MG and the element isolation region ST, between the memory gate electrode MG and the selection gate SLG, and between the memory gate electrode MG and the selection gate FLC. This is because the insulation film MZ1 has not been formed over the element isolation region ST and over the insulation film SP in the formation step of the insulation film MZ1.

Figure 35:
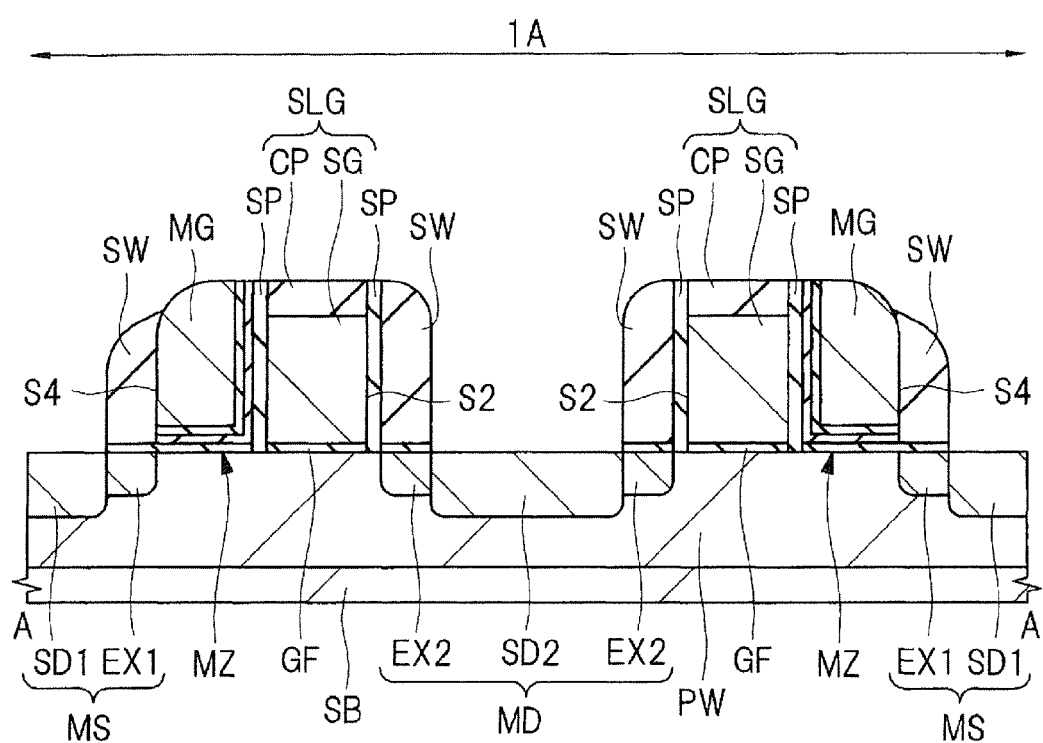
FIG. 35 is an essential part cross sectional view of the semiconductor device during a manufacturing step following FIG. 33.

Then, as shown in FIG. 35, n$^+$ type semiconductor regions (impurity diffusion layers) SD1 and SD2 are formed using anion implantation method, or the like (Step 19 of FIG. 8).

In Step 19, an n type impurity such as arsenic (As) or phosphorus (P) is ion-implanted into the semiconductor substrate SB (p type well PW) using the selection gate SLG, the insulation film SP, the memory gate electrode MG, and the sidewall spacer SW as a mask (an ion implantation inhibiting mask). As a result, the n$^+$ type semiconductor regions SD1 and SD2 can be formed.

At this step, the n$^+$ type semiconductor region SD1 is formed in self-alignment with the sidewall spacer SW over the side surface of the memory gate electrode MG in the memory cell region 1A. This is due to the following: the memory gate electrode MG, and the sidewall spacer SW over the side surface of the memory gate electrode MG function as a mask (an ion implantation inhibiting mask); thus, the n$^+$ type semiconductor region SD1 is formed. Whereas, the n$^+$ type semiconductor region SD2 is formed in self-alignment with the sidewall spacer SW formed over the side surface of the selection gate SLG via the insulation film SP in the memory cell region 1A. This is due to the following: the selection gate SLG, the sidewall spacer SW formed over the side surface of the selection gate SLG via the insulation film SP, and the insulation film SP therebetween function as a mask (an ion implantation inhibiting mask); thus, the n$^+$ type semiconductor region SD2 is formed. As a result, a LDD structure is formed. The n$^+$ type semiconductor region SD1 and the n$^+$ type semiconductor region SD2 can be formed by the same ion implantation step, but can also be formed by different ion implantation steps.

Incidentally, the element isolation region ST is formed entirely in the shunt region 1B. For this reason, the n$^+$ type semiconductor regions SD1 and SD2 are not formed in the shunt region 1B. Accordingly, the shunt region 1B at the stage of having performed Step 19 is not shown.

In this manner, the n$^-$ type semiconductor region EX1, and the n$^+$ type semiconductor region SD1 having a higher impurity concentration than that form an n type semiconductor region MS functioning as a source region of the memory transistor. The n$^-$ type semiconductor region EX2, and the n$^+$ type semiconductor region SD2 having a higher impurity concentration than that form an n type semiconductor region MD functioning as a drain region of the control transistor.

Then, activation annealing which is a heat treatment for activating the impurity doped into the semiconductor regions for source and drain (the n$^-$ type semiconductor regions EX1 and EX2 and the n$^+$ type semiconductor regions SD1 and SD2) is performed (Step 20 of FIG. 8).

In this manner, the memory cell of the nonvolatile memory is formed in the memory cell region 1A.

Then, a metal silicide layer SL is formed (Step 21 of FIG. 8).

The metal silicide layer SL can be formed by performing a so-called Salicide: Self Aligned Silicide process. Specifically, the metal silicide layer SL can be formed in the following manner.

Figure 36:
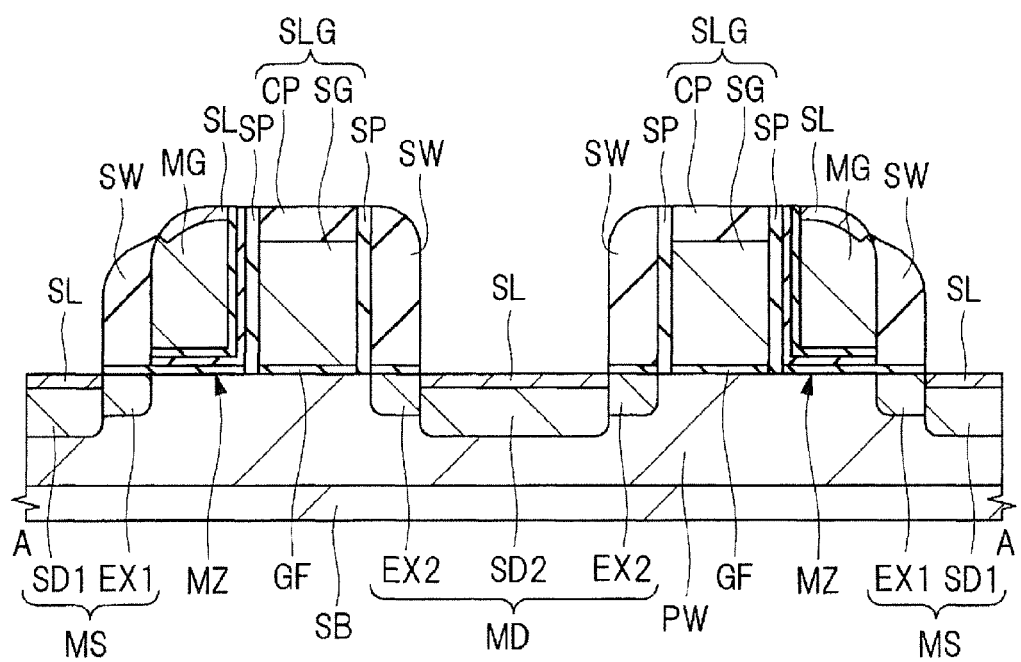
FIG. 36 is an essential part cross sectional view of the semiconductor device during a manufacturing step following FIG. 35.
Figure 37:
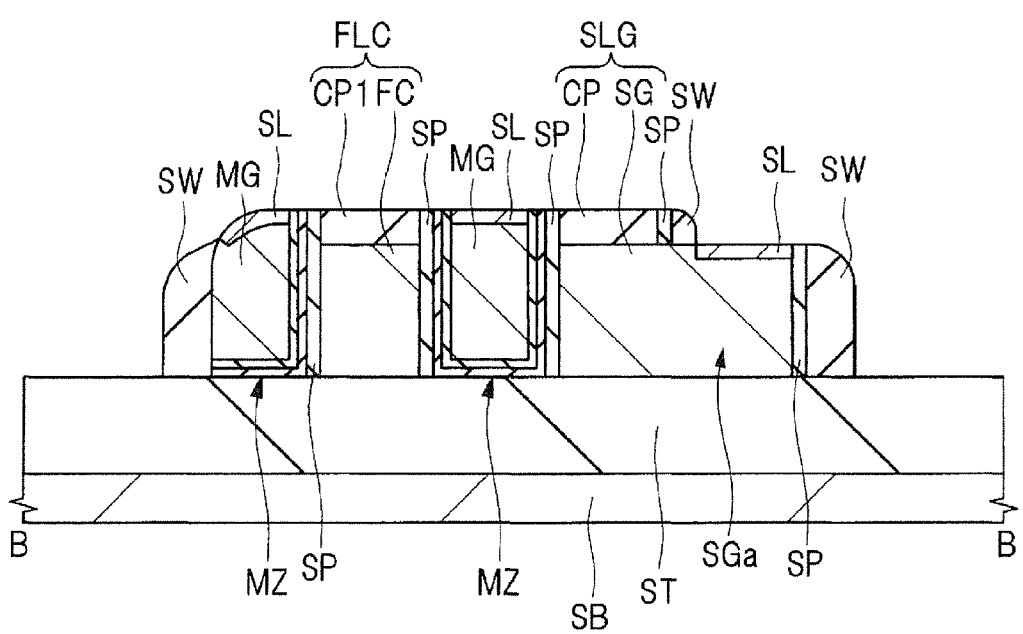
FIG. 37 is an essential part cross sectional view of the same semiconductor device as in FIG. 36 during a manufacturing step.

Namely, first, entirely over the main surface of the semiconductor substrate SB including over the top surfaces of the n$^+$ type semiconductor regions SD1 and SD2, a metal film for forming the metal silicide layer SL is formed in such a manner as to cover the selection gates SLG and FLC, the memory gate electrode MG, and the sidewall spacer SW. The metal film is formed of, for example, a cobalt (Co) film, a nickel (Ni) film, or a nickel platinum alloy film, and can be formed using a sputtering method or the like. Then, the semiconductor substrate SB is subjected to a heat treatment. As a result, respective upper layer portions (surface layer portions) of the n$^+$ type semiconductor regions SD1 and SD2, the memory gate electrode MG, and the selection gate electrode SG of the contact part SGa are allowed to react with the metal film for forming the metal silicide layer SL. Consequently, as shown in FIGS. 36 and 37, the metal silicide layer SL is formed at each top of the n$^+$ type semiconductor regions SD1 and SD2, the memory gate electrode MG, and the selection gate electrode SG of the contact part SGa. Then, the unreacted portions of the metal film are removed by wet etching, or the like. FIGS. 36 and 37 each show the cross sectional view at this stage. Further, after removing the unreacted portions of the metal film, a heat treatment can also be further performed. The metal silicide layer SL is formed of a cobalt silicide layer, a nickel silicide layer, a platinum-doped nickel silicide layer, or the like.

Figure 38:
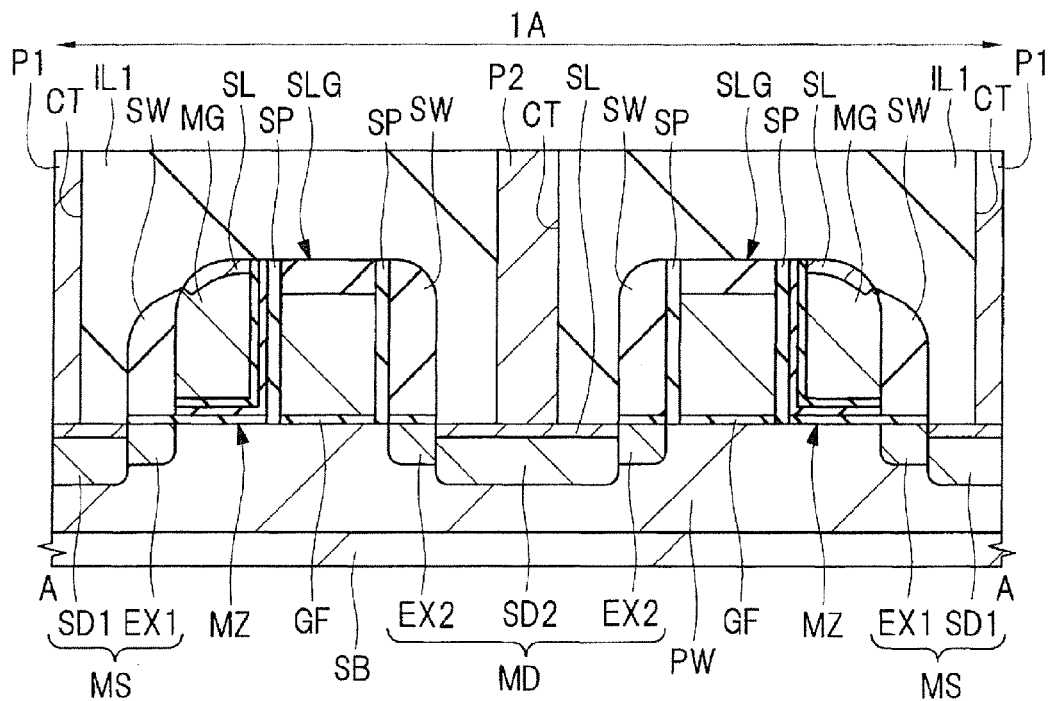
FIG. 38 is an essential part cross sectional view of the semiconductor device during a manufacturing step following FIG. 36.
Figure 39:
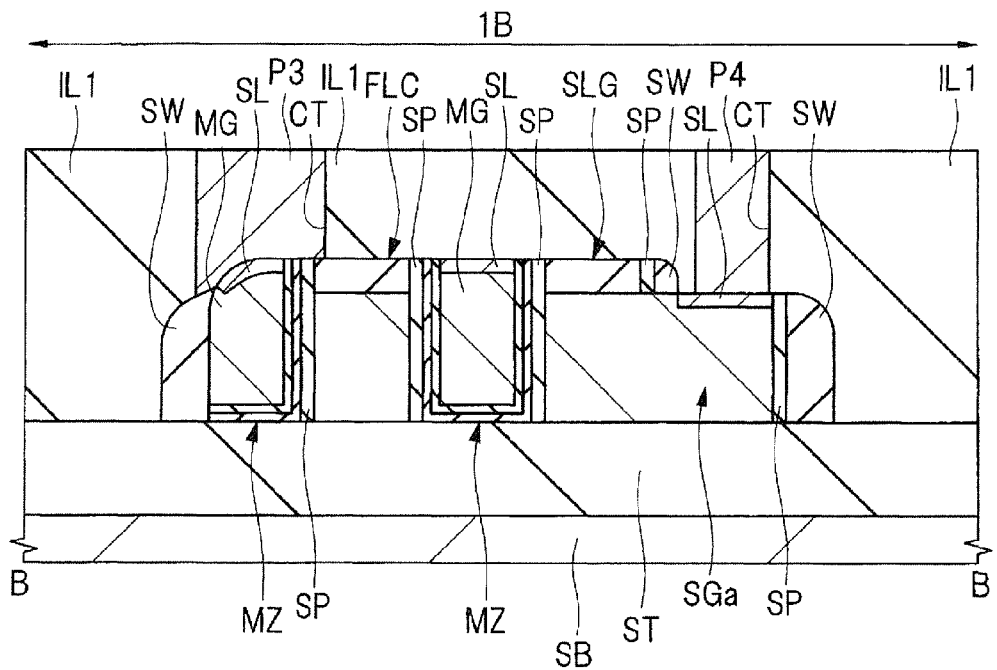
FIG. 39 is an essential part cross sectional view of the same semiconductor device as in FIG. 38 during a manufacturing step.

Then, as shown in FIGS. 38 and 39, entirely over the main surface of the semiconductor substrate SB, an interlayer insulation film IL1 is formed (deposited) as an insulation film in such a manner as to cover the selection gate SLG, the selection gate FLC, the memory gate electrode MG, and the sidewall spacer SW.

The interlayer insulation film IL1 is formed of a single film of a silicon oxide film, a lamination film of a silicon nitride film and a silicon oxide film formed thicker than the silicon nitride film over the silicon nitride film, or the like, and can be formed using, for example, a CVD method. After formation of the interlayer insulation film IL1, if required, using a CMP (Chemical Mechanical Polishing) method, or the like, the top surface of the interlayer insulation film IL1 is planarized.

Then, using the photoresist pattern (not shown) formed over the interlayer insulation film IL1 using a photolithography method as an etching mask, the interlayer insulation film IL1 is dry etched. As a result, contact holes (openings or through holes) CT are formed in the interlayer insulation film IL1.

Then, conductive plugs P1, P2, P3, and P4 formed of tungsten (W), or the like are formed as coupling conductor parts in the contact holes CT, respectively.

For forming the plugs P1, P2, P3, and P4, for example, over the interlayer insulation film IL1 including the inside (over the bottom and sidewall) of each contact hole CT, a barrier conductor film is formed. The barrier conductor film is formed of, for example, a titanium film, a titanium nitride film, or a lamination film thereof. Then, over the barrier conductor film, a main conductor film formed of a tungsten film, or the like is formed in such a manner as to fill the contact hole CT. Then, the unnecessary portions of the main conductor film and the barrier conductor film over the interlayer insulation film IL1 are removed by a CMP method, an etch back method, or the like. As a result, the plugs P1, P2, P3, and P4 can be formed. Incidentally, for simplification of the drawing, in FIGS. 38 and 39, the barrier conductor film and the main conductor film (tungsten film) forming each of the plugs P1, P2, P3, and P4 are integrally shown.

Each contact hole CT and the plug (P1, P2, P3, or P4) embedded therein are formed over the n$^+$ type semiconductor region SD1, over the n$^+$ type semiconductor region SD2, over the memory gate electrode MG, or over the contact part SGa of the selection gate electrode SG. The plug P1 formed over the n$^+$ type semiconductor region SD1 is electrically coupled with the n$^+$ type semiconductor region SD1; and the plug P2 formed over the n$^+$ type semiconductor region SD2 is electrically coupled with the n$^+$ type semiconductor region SD2. Whereas, the plug P3 formed over the memory gate electrode MG is electrically coupled with the memory gate electrode MG. Further, the plug P4 formed over the contact part SGa of the selection gate electrode SG is electrically coupled with the contact part SGa of the selection gate electrode SG, and thereby electrically coupled with the selection gate electrode SG.

Then, over the interlayer insulation film IL1 including the plugs (P1, P2, P3, and P4) embedded therein, a wire M1 which is a first-layer wire is formed. A description will be given to the case where the wire M1 is formed using a damascene technology (herein, a single damascene technology).

First, as shown in FIGS. 1 and 2, over the interlayer insulation film IL1 including the plugs (P1, P2, P3, and P4) embedded therein, an insulation film IL2 is formed. The insulation film IL2 can also be formed of a lamination film of a plurality of insulation films. Then, by dry etching using a photoresist pattern (not shown) as an etching mask, a wire trench (a trench for a wire) is formed in a prescribed region of the insulation film IL2. Then, over the insulation film IL2 including the bottom and the sidewall of the wire trench, a barrier conductor film is formed. The barrier conductor film is formed of, for example, a titanium nitride film, a tantalum film, a tantalum nitride film, or the like. Then, by a CVD method, a sputtering method, or the like, a copper seed layer is formed over the barrier conductor film. Further, using an electrolytic plating method, or the like, a copper plating film is formed over the seed layer. The copper plating film fills the inside of the wire trench. Then, the portions of the main conductor film (the copper plating film and the seed layer), and the barrier conductor film in other regions than the wire trench are removed by a CMP method. This results in the formation of the first-layer wire M1 including copper embedded in the wire trench as a main conductive material. In FIGS. 1 and 2, for simplification of the drawing, the wire M1 is shown as the barrier conductor film, the seed layer, and the copper plating film in an integral form.

The wire M1 is electrically coupled via the plug (P1, P2, P3, or P4) with the source region (semiconductor region MS) of the memory transistor, the drain region (semiconductor region MD) of the selection transistor, the selection gate electrode SG, the memory gate electrode MG, or the like. Then, second- or higher-layer wires are formed by a dual damascene method, or the like, but herein are not shown and not described. Alternatively, the wire M1 and wires at higher layers than that are not limited to damascene wires, and can also be formed by patterning a conductor film for each wire, and can be each formed as, for example, a tungsten wire or an aluminum wire.

In the manner described up to this point, the semiconductor device of the present embodiment is manufactured.

<Regarding Main Features and Effects>

The semiconductor device of the present embodiment is a semiconductor device including a nonvolatile memory. The semiconductor device has a semiconductor substrate SB, a selection gate electrode SG (first gate electrode) formed over the semiconductor substrate SB, an insulation film SP (first sidewall insulation film) formed over the side surface S1 (first side surface) of the selection gate electrode SG, and an insulation film SP (second sidewall insulation film) formed over the side surface S2 (second side surface) of the selection gate electrode SG opposite to the side surface S1 thereof. The semiconductor device further has a memory gate electrode MG (second gate electrode) formed on the side surface S1 side of the selection gate electrode SG, and extending together with the selection gate electrode SG over the semiconductor substrate SB, an insulation film GF (first gate insulation film) formed between the selection gate electrode SG and the semiconductor substrate SB, and an insulation film MZ (second gate insulation film) having a charge accumulation part formed between the memory gate electrode MG and the semiconductor substrate SB. The semiconductor device further has a sidewall spacer SW (first sidewall spacer) formed over the side surface S2 of the selection gate electrode SG via the insulation film SP, and a sidewall spacer SW (second sidewall spacer) formed over the side surface S4 (third side surface) of the memory gate electrode MG opposite to the side thereof adjacent to the selection gate electrode SG. The insulation film MZ (second gate insulation film) is formed over between the semiconductor substrate SB and the memory gate electrode MG, and between the selection gate electrode SG and the memory gate electrode MG. The selection gate electrode SG and the memory gate electrode MG are adjacent to each other via the insulation film. SP (first sidewall insulation film) and the insulation film MZ (second gate insulation film). Between the selection gate electrode SG and the memory gate electrode MG, the insulation film SP (first sidewall insulation film) is situated on the selection gate electrode SG side, and the insulation film MZ (second gate insulation film) is situated on the memory gate electrode MG side. The insulation film SP (first sidewall insulation film) is not formed under the memory gate electrode MG. The insulation film SP (first sidewall insulation film) over the side surface S1 of the selection gate electrode SG, and the insulation film SP (second sidewall insulation film) over the side surface S2 are integrally formed. Then, the total thickness T2 (second thickness) of the insulation film SP (first sidewall insulation film) and the insulation film MZ (second gate insulation film) interposed between the selection gate electrode SG and the memory gate electrode MG is larger than the thickness T1 (first thickness) of the insulation film MZ (second gate insulation film) interposed between the semiconductor substrate SB and the memory gate electrode MG (T1<T2).

One of the main features of the present embodiment is that the insulation films SP of the sidewall insulation films are provided over the side surfaces S1 and S2 of the selection gate electrode SG. The insulation film SP is formed as a sidewall insulation film over each side surface of the selection gate electrode SG, and hence is interposed between the selection gate electrode SG and the memory gate electrode MG, but is not formed under the memory gate electrode MG. Namely, the insulation film SP extends between the selection gate electrode SG and the memory gate electrode MG, but does not extend between the memory gate electrode MG and the semiconductor substrate SB. On the other hand, the insulation film MZ is formed over between the semiconductor substrate SB and the memory gate electrode MG, and between the selection gate electrode SG and the memory gate electrode MG.

Another of the main features of the present embodiment is that the total thickness T2 (second thickness) of the insulation film SP and the insulation film MZ interposed between the selection gate electrode SG and the memory gate electrode MG is larger than the thickness T1 (first thickness) of the insulation film MZ interposed between the semiconductor substrate SB (p type well PW) and the memory gate electrode MG (T1<T2). The thicknesses T1 and T2 are shown in FIG. 3.

The selection gate electrode SG and the memory gate electrode MG are adjacent to each other with the insulation film (herein, the insulation film SP and the insulation film MZ) interposed therebetween. For this reason, in order to increase the breakdown voltage between the selection gate electrode SG and the memory gate electrode MG, it is effective to increase the thickness of the insulation film (herein, the insulation film SP and the insulation film MZ) interposed between the selection gate electrode SG and the memory gate electrode MG.

As distinct from the present embodiment, it is assumed that the insulation film SP of the sidewall insulation film is not formed over the side surface S1 of the selection gate electrode SG. In this case, between the selection gate electrode SG and the memory gate electrode MG, the insulation film SP is not present, but only the insulation film MZ is interposed. In this case, in order to increase the breakdown voltage between the selection gate electrode SG and the memory gate electrode MG, the thickness of the insulation film MZ interposed between the selection gate electrode SG and the memory gate electrode MG is increased. This also results in an increase in thickness of the insulation film MZ interposed between the semiconductor substrate SB and the memory gate electrode MG. This affects the operation of the nonvolatile memory. Namely, in consideration of the operation of the nonvolatile memory, the thickness of the insulation film MZ interposed between the semiconductor substrate SB and the memory gate electrode MG is set at the optimum thickness. This necessarily also specifies the thickness of the insulation film MZ interposed between the selection gate electrode SG and the memory gate electrode MG. For this reason, it is difficult to increase the thickness of the insulation film MZ between the selection gate electrode SG and the memory gate electrode MG in order to increase the breakdown voltage between the selection gate electrode SG and the memory gate electrode MG.

In contrast, in the present embodiment, the insulation film SP is formed as a sidewall insulation film over the side surface of the selection gate electrode SG, and hence is interposed between the selection gate electrode SG and the memory gate electrode MG, but is not formed under the memory gate electrode MG. For this reason, even when the thickness of the insulation film SP interposed between the selection gate electrode SG and the memory gate electrode MG is increased, the thickness of the insulation film (herein, the insulation film MZ) interposed between the memory gate electrode MG and the semiconductor substrate SB is not affected. Namely, the thickness of the insulation film SP interposed between the selection gate electrode SG and the memory gate electrode MG can be controlled independent of the thickness of the insulation film MZ interposed between the memory gate electrode MG and the semiconductor substrate SB. In other words, even when the thickness of the insulation film MZ interposed between the memory gate electrode MG and the semiconductor substrate SB is not increased, the thickness of the insulation film SP interposed between the selection gate electrode SG and the memory gate electrode MG can be increased. For this reason, the insulation film SP is formed as a sidewall insulation film over the side surface S1 of the selection gate electrode SG. Thus, the thickness of the insulation film SP is adjusted. As a result, even when the thickness T1 of the insulation film MZ interposed between the semiconductor substrate SB and the memory gate electrode MG is not increased, the total thickness T2 of the insulation film SP and the insulation film MZ interposed between the selection gate electrode SG and the memory gate electrode MG can be increased.

As a result, the total thickness T2 of the insulation film SP and the insulation film MZ interposed between the selection gate electrode SG and the memory gate electrode MG can be set larger than the thickness T1 of the insulation film MZ interposed between the semiconductor substrate SB and the memory gate electrode MG (T1<T2). With such a configuration, for the thickness T1 of the insulation film MZ interposed between the semiconductor substrate SB and the memory gate electrode MG, while ensuring the optimum thickness for the operation of the nonvolatile memory, the total thickness T2 of the insulation film SP and the insulation film MZ interposed between the selection gate electrode SG and the memory gate electrode MG is increased. This can improve the breakdown voltage between the selection gate electrode SG and the memory gate electrode MG. Therefore, it is possible to improve the performances of the semiconductor device having a nonvolatile memory. Further, it is possible to improve the reliability of the semiconductor device having a nonvolatile memory.

Further, use of the FN method for the erase method can also provide an effect of improving the retention characteristics (charge holding characteristics).

Namely, when the FN method is used for the erase method, holes tend to be injected into the insulation film MZ interposed between the selection gate electrode SG and the memory gate electrode MG. When holes are injected into the insulation film MZ interposed between the selection gate electrode SG and the memory gate electrode MG, in the insulation film MZ, the position to be injected with electrons for write, and the position to be injected with holes for erase are misaligned. Accordingly, holes are left in the insulation film MZ interposed between the selection gate electrode SG and the memory gate electrode MG. This may reduce the retention characteristics.

In contrast, in the present embodiment, as described above, the insulation film SP of the sidewall insulation film is provided over the side surface S1 of the selection gate electrode SG. As a result, the total thickness T2 of the insulation film SP and the insulation film MZ interposed between the selection gate electrode SG and the memory gate electrode MG is larger than the thickness T1 of the insulation film MZ interposed between the semiconductor substrate SB and the memory gate electrode MG (T1<T2). The thickness of the insulation film (herein, the insulation film SP and the insulation film MZ) interposed between the selection gate electrode SG and the memory gate electrode MG is increased. This leads to a reduction of the electric field to be applied to the insulation film interposed between the selection gate electrode SG and the memory gate electrode MG during the erase operation of the FN method. This acts so as to suppress the phenomenon that holes are injected into the insulation film MZ interposed between the selection gate electrode SG and the memory gate electrode MG. For this reason, in the present embodiment, provision of the insulation film SP increases the total thickness T2 of the insulation film. SP and the insulation film MZ interposed between the selection gate electrode SG and the memory gate electrode MG (T1<T2). As a result, it becomes possible to suppress the occurrence of the phenomenon that holes are injected into the insulation film MZ interposed between the selection gate electrode SG and the memory gate electrode MG during the erase operation of the FN method. This can produce an effect of improving the retention characteristics when the FN method is used for the erase method. Therefore, it is possible to improve the performances of the semiconductor device having a nonvolatile memory. Further, it is possible to improve the reliability of the semiconductor device having a nonvolatile memory In other words, in the present embodiment, provision of the insulation film SP increases the total thickness T2 of the insulation film SP and the insulation film MZ interposed between the selection gate electrode SG and the memory gate electrode MG (T1<T2). As a result, it is possible to improve the breakdown voltage between the selection gate electrode SG and the memory gate electrode MG. This effect can be obtained not depending upon the erase method. Further, when the FN method is used for the erase method, it is also possible to obtain the effect of improving the retention characteristics.

Further, in the present embodiment, the insulation films SP of the sidewall insulation films are formed not only over the side surface S1 of the selection gate electrode SG but also over the side surface S2 of the selection gate electrode SG opposite to the side surface S1. The insulation film SP over the side surface S1 of the selection gate electrode SG, and the insulation film over the side surface S2 are integrally formed. Then, a sidewall spacer SW is formed over the side surface S2 of the selection gate electrode SG via the insulation film SP.

For this reason, the low-concentration semiconductor region (herein, the n⁻ type semiconductor region EX2) forming the source/drain region (herein, the semiconductor region MD for drain) of a LDD structure, provided adjacent to the channel formation region immediately under the selection gate electrode SG can be formed in the following manner: ion implantation is performed with the insulation film SP of the sidewall insulation film formed over the side surface S2 of the selection gate electrode SG. Namely, the low-concentration semiconductor region (herein, the n⁻ type semiconductor region EX2) forming the source/drain region (herein, the semiconductor region MD for drain) of a LDD structure can be formed in self-alignment with the insulation film SP over the side surface S2 of the selection gate electrode SG. For this reason, the channel formation region formed in the semiconductor substrate SB (p type well PW) immediately under the selection gate electrode SG, and the low-concentration semiconductor region (herein, the n⁻ type semiconductor region EX2) forming the source/drain region (herein, the semiconductor region MD for drain) of a LDD structure adjacent thereto are suppressed from overlapping each other. This can suppress the short channel effect of the selection gate electrode SG. Therefore, it is possible to improve the performances of the semiconductor device having a nonvolatile memory. Further, it is possible to improve the reliability of the semiconductor device having a nonvolatile memory. Furthermore, it is possible to reduce the size of the memory cell of the nonvolatile memory, which can reduce the area of the semiconductor device.

Whereas, the insulation film MZ (second gate insulation film) at a portion thereof interposed between the memory gate electrode MG and the semiconductor substrate SB (p type well PW) has an insulation film MZ1 (first insulation film) over the semiconductor substrate SB (p type well PW), an insulation film MZ2 (second insulation film) over the insulation film MZ1, and an insulation film MZ3 (third insulation film) over the insulation film MZ2. The insulation film MZ2 functions as a charge accumulation part. Then, respective band gaps of the insulation film MZ1 and the insulation film MZ3 are larger than the band gap of the insulation film MZ2. As a result, the insulation film MZ2 can function as a charge accumulation part with precision. The insulation film MZ1 and the insulation film MZ3 can each function as a charge block layer with precision.

Whereas, each band gap of the insulation films SP (the first sidewall insulation film and the second sidewall insulation film) is preferably larger than the band gap of the insulation film MZ2. When the band gap of the insulation film SP is larger than the band gap of the insulation film MZ2, the insulation film SP can also function as a charge block layer. For this reason, it becomes possible to more precisely suppress or prevent the electric charges injected into or accumulated in the insulation film MZ2 from passing through the insulation film SP, and going out toward the selection gate electrode SG side. For this reason, the insulation film SP is more preferably formed of the same material as that for the insulation film MZ1 functioning as a charge block layer. Therefore, as the materials for the insulation film MZ1 and the insulation film SP, a silicon oxide can be preferably used, respectively.

The semiconductor device of the present embodiment also further has the following features.

Namely, over the semiconductor substrate SB, a selection gate electrode FC (dummy gate electrode) is formed apart from the selection gate electrode SG. The selection gate electrode FC is arranged on the side facing the side surface S1 of the selection gate electrode SG. Over the side surface (sidewall) of the selection gate electrode FC, an insulation film SP (third sidewall insulation film) is formed. The insulation film SP (third sidewall insulation film) is also formed over the side surface (fourth side surface) of the selection gate electrode FC facing the selection gate electrode SG. Then, the memory gate electrode MG is formed in the region between the selection gate electrode SG and the selection gate electrode FC, and also around the selection gate electrode FC. The insulation film SP (third sidewall insulation film) and the insulation film MZ are interposed between the selection gate electrode FC and the memory gate electrode MG. The insulation film SP (third sidewall insulation film) is not formed under the memory gate electrode MG.

As described above, the selection gate electrode FC is provided apart from the selection gate electrode SG, and the memory gate electrode MG is also formed around the selection gate electrode FC. As a result, the plug P3 becomes more likely to be coupled with the memory gate electrode MG. However, when the selection gate electrode FC is provided apart from the selection gate electrode SG, and the memory gate electrode MG is also formed around the selection gate electrode FC, the memory gate electrode MG is also required to be formed between the selection gate electrode FC and the selection gate electrode SG. This is for the following reason: when the memory gate electrode MG is not formed between the selection gate electrode FC and the selection gate electrode SG, the memory gate electrode MG at a portion thereof formed around the selection gate electrode FC may not be coupled with the memory gate electrode MG at a portion thereof extending over the semiconductor substrate SB while being adjacent to the selection gate electrode SG via the insulation films MZ and SP at a low resistance, and may not be electrically coupled thereto at worst. This leads to disconnection of the memory gate electrode MG. For this reason, the memory gate electrode MG is also required to be formed surely between the selection gate electrode FC and the selection gate electrode SG.

For also surely forming the memory gate electrode MG between the selection gate electrode FC and the selection gate electrode SG, it is effective to reduce the width W1 shown in FIG. 21. Herein, the width W1 corresponds to the width (the width in the Y direction) of the region in which the memory gate electrode MG is embedded between the selection gate electrode FC and the selection gate electrode SG. Specifically, the width W1 corresponds to the distance between the surface of the insulation film MZ over the side surface of the selection gate electrode FC and the surface of the insulation film MZ over the side surface of the selection gate electrode SG between the selection gate electrode FC and the selection gate electrode SG facing each other.

When the width W1 is large, upon forming the silicon film PS2 in the Step 12, the region between the selection gate electrode FC and the selection gate electrode SG facing each other is not filled with the silicon film PS2. When the silicon film PS2 is etched back in the Step 13, the silicon film PS2 may not be left sufficiently between the selection gate electrode FC and the selection gate electrode SG facing each other. This results in that the memory gate electrode MG becomes less likely to be formed between the selection gate electrode FC and the selection gate electrode SG.

In contrast, in the present embodiment, the insulation film SP is provided as a sidewall insulation film over the side surface S1 of the selection gate SLG (selection gate electrode SG), and further, the insulation film SP is also provided as a sidewall insulation film over the side surface of the selection gate FLC (selection gate electrode FC). Thus, the width W1 shown in FIG. 21 can be reduced by that much as compared with the case where the insulation film SP is not provided. In the present embodiment, provision of the insulation film SP can reduce the width W1 shown in FIG. 21. For this reason, it becomes possible to form the memory gate electrode MG between the selection gate electrode FC and the selection gate electrode SG with more precision. Namely, the width W1 shown in FIG. 21 can be reduced by the length equivalent to the provided insulation film SP. For this reason, when the silicon film PS2 is formed in the Step 12, the region between the selection gate electrode FC and the selection gate electrode SG facing each other becomes more likely to be filled with the silicon film PS2. Accordingly, when the silicon film PS2 is etched back in the Step 13, it becomes possible to sufficiently leave the silicon film PS2 between the selection gate electrode FC and the selection gate electrode SG facing each other. As a result, it becomes possible to form the memory gate electrode MG between the selection gate electrode FC and the selection gate electrode SG with more precision.

For this reason, in the present embodiment, by providing the insulation film SP, it is possible to form the memory gate electrode MG between the selection gate electrode FC and the selection gate electrode SG with more precision. As a result, even when the selection gate electrode FC is provided apart from the selection gate electrode SG, it becomes possible to prevent the disconnection of the memory gate electrode MG with more precision. Therefore, it is possible to more improve the reliability of the semiconductor device. Further, it is possible to improve the manufacturing yield of the semiconductor device. Furthermore, it becomes easy to control the manufacturing steps of the semiconductor device.

Second Embodiment

FIGS. 40 to 53 are each an essential part cross sectional view of a semiconductor device of the present Second Embodiment during a manufacturing step. Of FIGS. 40 to 53, FIGS. 40, 42, 44, 46, 48, 50, and 52 each show an essential part cross sectional view of the memory cell region 1A, and specifically each show a cross sectional view at the position along line A-A of FIG. 4 (i.e., a cross sectional view corresponding to FIG. 1). Further, of FIGS. 40 to 53, FIGS. 41, 43, 45, 47, 49, 51, and 53 each show an essential part cross sectional view of the shunt region 1B, and specifically each show a cross sectional view at the position along line B-B of FIG. 4 (i.e., a cross sectional view corresponding to FIG. 2).

The manufacturing steps of the semiconductor device of the present Second Embodiment are the same as those of First Embodiment until the Step 21 (metal silicide layer SL formation step) is performed to obtain the structure of FIGS. 36 and 37, and hence, herein, a repeated description thereon is omitted.

Figure 40:
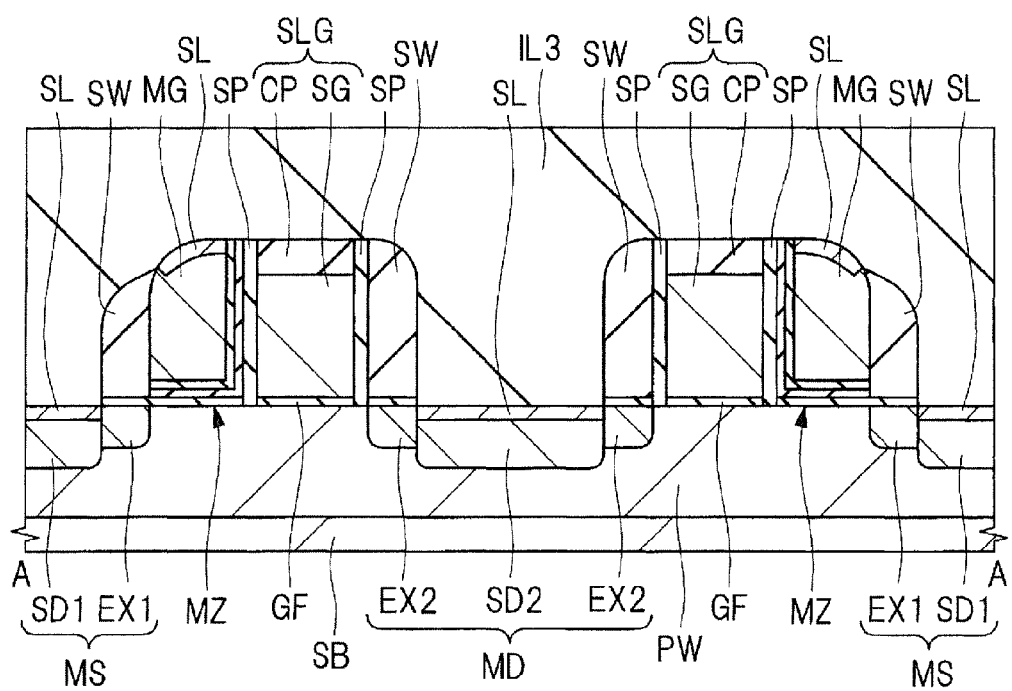
FIG. 40 is an essential part cross sectional view of the semiconductor device of one embodiment during a manufacturing step.
Figure 41:
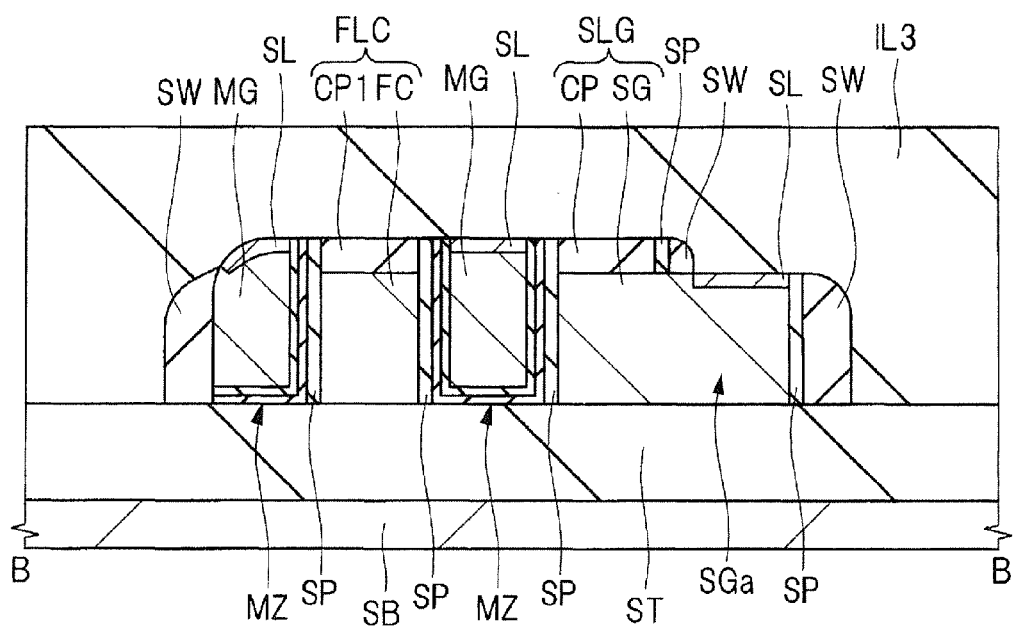
FIG. 41 is an essential part cross sectional view of the same semiconductor device as in FIG. 40 during a manufacturing step.

In the present Second Embodiment, the Step 21 (metal silicide layer SL formation step) is performed to obtain the structure of FIGS. 36 and 37. Then, as shown in FIGS. 40 and 41, entirely over the main surface of the semiconductor substrate SB, an interlayer insulation film IL3 is formed (deposited) as an insulation film in such a manner as to cover the selection gate SLG, the selection gate FLC, the memory gate electrode MG, and the sidewall spacer SW. As the interlayer insulation film IL3, the same insulation film as the interlayer insulation film IL1 can be used.

Figure 42:
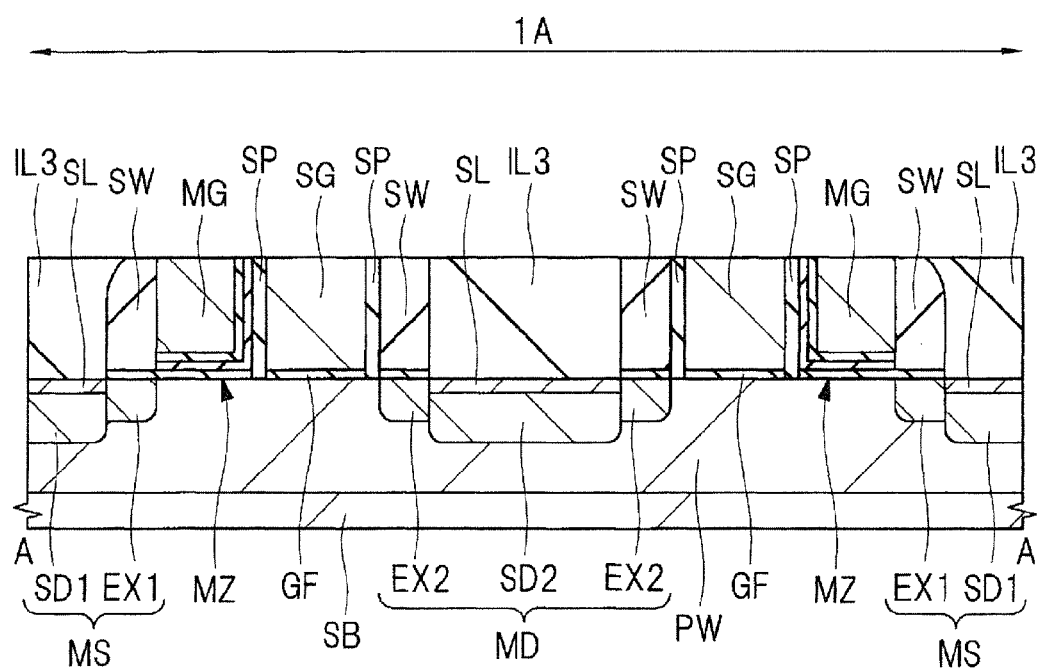
FIG. 42 is an essential part cross sectional view of the semiconductor device during a manufacturing step following FIG. 40.
Figure 43:
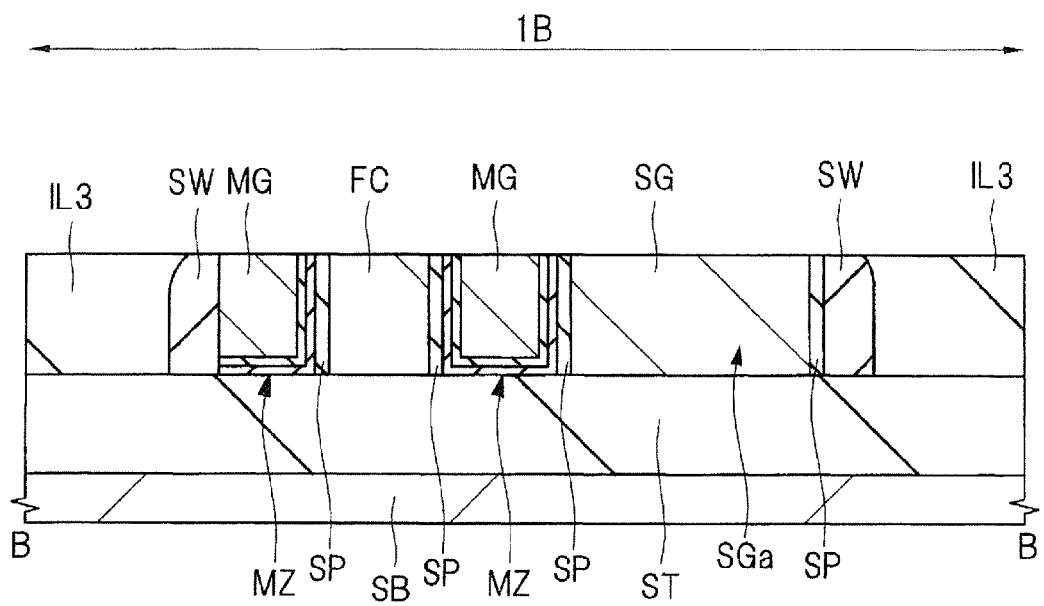
FIG. 43 is an essential part cross sectional view of the same semiconductor device as in FIG. 42 during a manufacturing step.

Then, as shown in FIGS. 42 and 43, the top surface of the interlayer insulation film IL3 is polished using a CMP method, or the like. By the polishing step, respective top surfaces of the selection gate electrode SG, the memory gate electrode MG, and the selection gate electrode FC are exposed. When the cap insulation film CP has been formed over the selection gate electrode SG, and the cap insulation film CP1 has been formed over the selection gate electrode FC, the cap insulation films CP and CP1 are also removed by this polishing step. As a result, respective top surfaces of the selection gate electrode SG, the memory gate electrode MG, and the selection gate electrode FC are exposed. Namely, in this polishing step, the interlayer insulation film IL3, the cap insulation films CP and CP1, the sidewall spacer SW, and the insulation films SP and MZ are polished until respective top surfaces of the selection gate electrode SG, the memory gate electrode MG, and the selection gate electrode FC are exposed.

Figure 44:
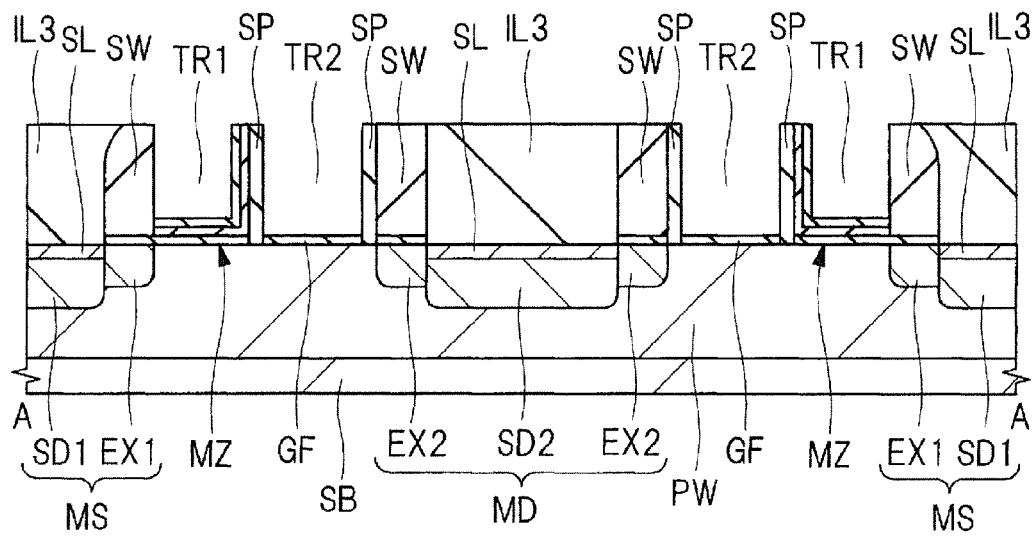
FIG. 44 is an essential part cross sectional view of the semiconductor device during a manufacturing step following FIG. 42.
Figure 45:
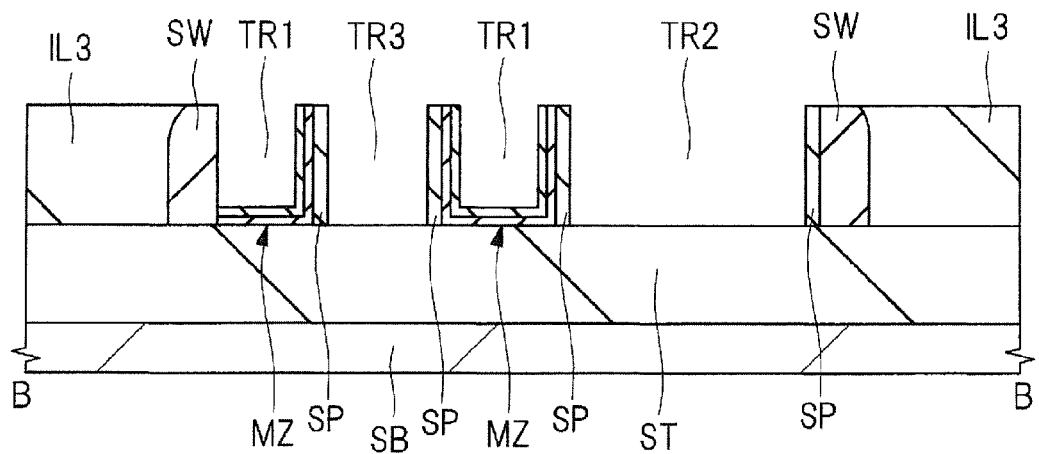
FIG. 45 is an essential part cross sectional view of the same semiconductor device as in FIG. 44 during a manufacturing step.

Then, as shown in FIGS. 44 and 45, the selection gate electrode SG, the memory gate electrode MG, and the selection gate electrode FC are etched and removed. The etching step is hereinafter referred to as the "etching step of FIGS. 44 and 45".

In the etching step of FIGS. 44 and 45, etching is preferably performed under the conditions such that the interlayer insulation film IL3, the sidewall spacer SW, the insulation film SP, the insulation film MZ, and the insulation film GF are less likely to be etched than the selection gate electrode SG, the memory gate electrode MG, and the selection gate electrode FC. Namely, etching is preferably performed under the conditions such that respective etching rates of the interlayer insulation film IL3, the sidewall spacer SW, the insulation film SP, the insulation film MZ, and the insulation film GF are smaller than respective etching rates of the selection gate electrode SG, the memory gate electrode MG, and the selection gate electrode FC. As a result, in the etching step of FIGS. 44 and 45, the selection gate electrode SG, the memory gate electrode MG, and the selection gate electrode FC can be selectively etched. For etching, wet etching can be preferably used. The selection gate electrode SG, the memory gate electrode MG, and the selection gate electrode FC are formed of silicon (polysilicon). For this reason, in the etching step of FIGS. 44 and 45, high etching selectivities of the selection gate electrode SG, the memory gate electrode MG, and the selection gate electrode FC are easy to ensure. Accordingly, it is possible to selectively remove the selection gate electrode SG, the memory gate electrode MG, and the selection gate electrode FC with ease and precision.

The selection gate electrode SG, the memory gate electrode MG, and the selection gate electrode FC are removed by etching. As a result, as also shown in FIGS. 44 and 45, the insulation films SP and MZ interposed between the memory gate electrode MG and the selection gate electrode SG are exposed; and further, the insulation films SP and MZ interposed between the memory gate electrode MG and the selection gate electrode FC are exposed.

In the etching step of FIGS. 44 and 45, the selection gate electrode SG, the memory gate electrode MG, and the selection gate electrode FC are removed. As a result, trenches (concave parts or pit parts) TR1, TR2, and TR3 are formed. The trench TR1 is a region obtained by removing the memory gate electrode MG in the etching step of FIGS. 44 and 45, and corresponds to the region in which the memory gate electrode MG was present until the etching step of FIGS. 44 and 45 was performed. Whereas, the trench TR2 is a region obtained by removing the selection gate electrode SG in the etching step of FIGS. 44 and 45, and corresponds to the region in which the selection gate electrode SG was present until the etching step of FIGS. 44 and 45 was performed. The trench TR3 is a region obtained by removing the selection gate electrode FC in the etching step of FIGS. 44 and 45, and corresponds to the region in which the selection gate electrode FC was present until the etching step of FIGS. 44 and 45 was performed. Between the trench TR1 and the trench TR2, a lamination film of the insulation film SP and the insulation film MZ is interposed. Whereas, also between the trench TR1 and the trench TR3, a lamination film of the insulation film SP and the insulation film MZ is interposed. Namely, the lamination film (lamination body) of the insulation film SP and the insulation film MZ forms the partition wall between the trench TR1 and the trench TR2, and further forms the partition wall between the trench TR1 and the trench TR3. Specifically, the lamination film (lamination body) of the insulation film SP and the insulation film MZ interposed between the selection gate electrode SG and the memory gate electrode MG forms the partition wall between the trench TR1 and the trench TR2. The lamination film (lamination body) of the insulation film SP and the insulation film MG interposed between the selection gate electrode FC and the memory gate electrode MG forms the partition wall between the trench TR1 and the trench TR3.

Figure 46:
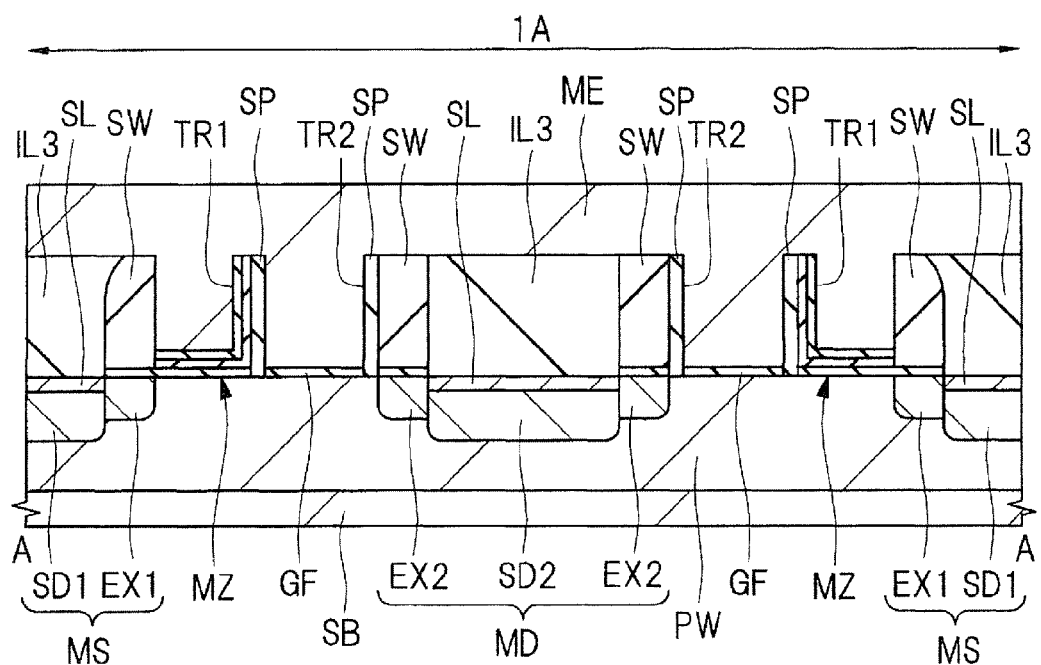
FIG. 46 is an essential part cross sectional view of the semiconductor device during a manufacturing step following FIG. 44.
Figure 47:
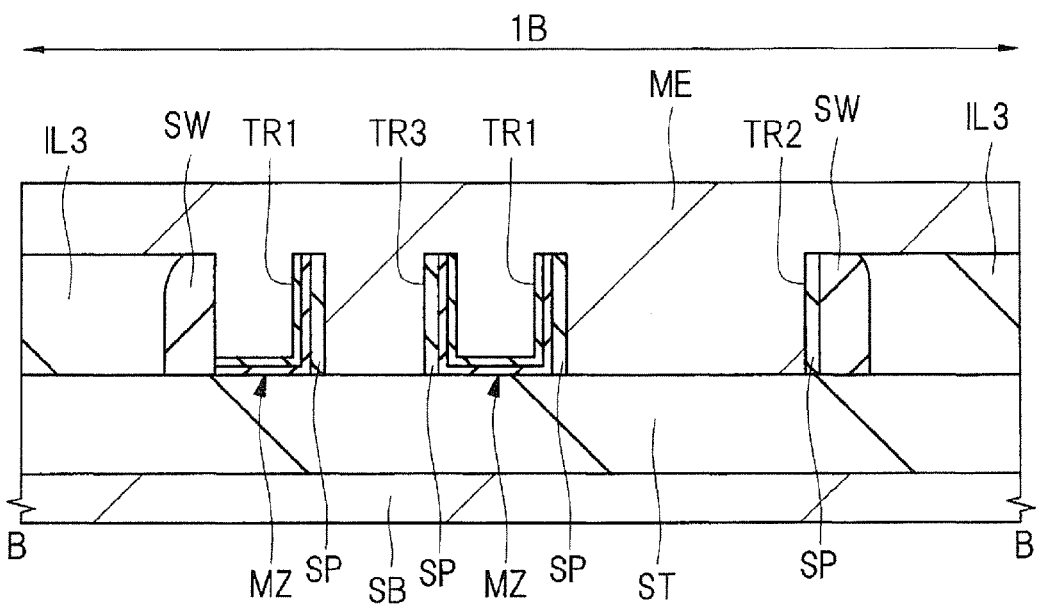
FIG. 47 is an essential part cross sectional view of the same semiconductor device as in FIG. 46 during a manufacturing step.

Then, as shown in FIGS. 46 and 47, over the semiconductor substrate SB, namely, over the interlayer insulation film IL3, a metal film ME for metal gate electrode is formed in such a manner as to fill the trenches TR1, TR2, and TR3.

As the metal film ME, there can be used a metal film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbon nitride (TaCN) film, a titanium (Ti) film, a tantalum (Ta) film, a titanium aluminum (TiAl) film, or an aluminum (Al) film. Incidentally, the metal film herein referred to denotes a conductive film showing metal conduction, and also includes not only an elementary metal film (pure metal film), or an alloy film, but also a metal compound film showing metal conduction (such as a metal nitride film or a metal carbide film). For this reason, the metal film ME is a conductive film showing metal conduction, and is not limited to an elementary metal film (pure metal film) or an alloy film, and may be a metal compound film showing metal conduction (such as a metal nitride film or a metal carbide film). Alternatively, the metal film ME can also be formed as a lamination film (a lamination film of a plurality of deposited films). However, in that case, the lowermost layer of the lamination film is set as a metal film (a conductive film showing metal conduction). Further, the lamination film can also be formed as a lamination film of a plurality of metal films (conductive films showing metal conduction). The metal film ME can be formed using, for example, a sputtering method.

Figure 48:
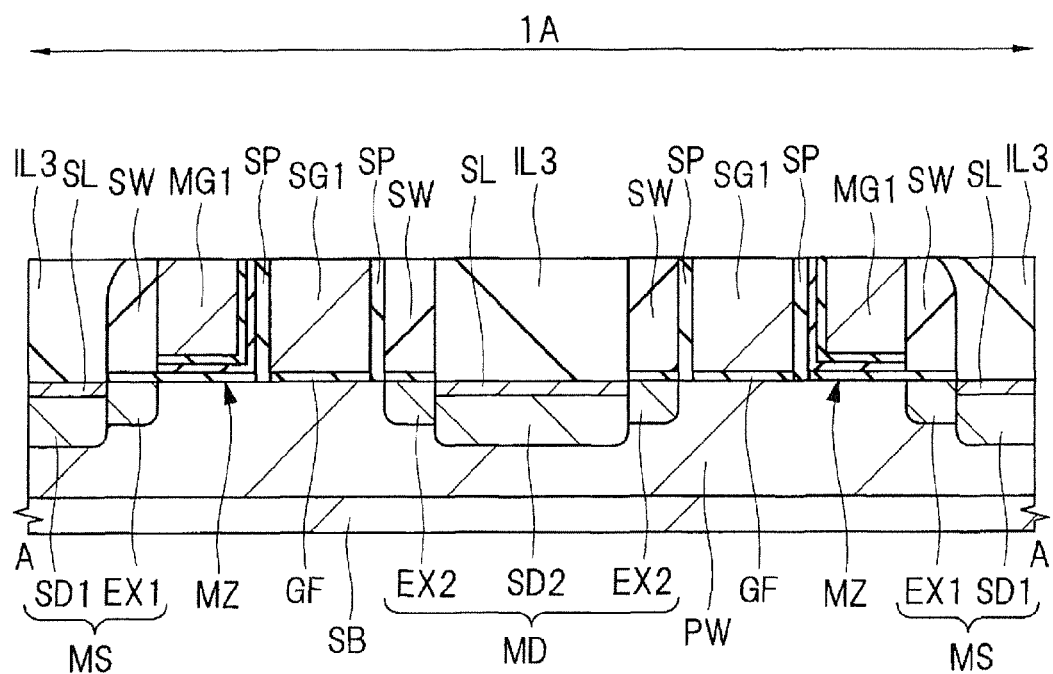
FIG. 48 is an essential part cross sectional view of the semiconductor device during a manufacturing step following FIG. 46.
Figure 49:
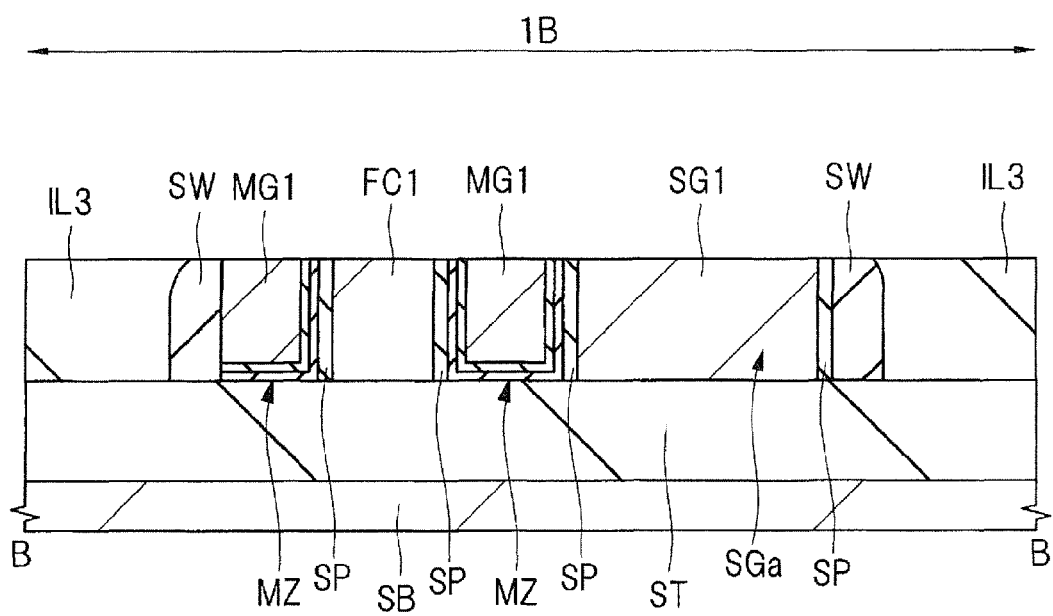
FIG. 49 is an essential part cross sectional view of the same semiconductor device as in FIG. 48 during a manufacturing step.

Then, as shown in FIGS. 48 and 49, the unnecessary portions of the metal film ME outside the trenches TR1, TR2, and TR3 are removed by a polishing treatment such as a a CMP method. As a result, the metal film ME is embedded in the trenches TR1, TR2, and TR3. Namely, the portions of the metal film ME outside the trenches TR1, TR2, and TR3 are removed, so that the metal film ME is left in the trenches TR1, TR2, and TR3. This results in a state in which the metal film ME is left and embedded in the trenches TR1, TR2, and TR3.

The metal film ME embedded in the trench TR1 serves as the memory gate electrode MG1 which is the the gate electrode of the memory transistor. The metal film ME embedded in the trench TR2 serves as the selection gate electrode SG1 which is the gate electrode of the selection transistor. Both of the memory gate electrode MG1 and the selection gate electrode SG1 are metal gate electrodes. Whereas, the metal film ME embedded in the trench TR3 serves as a selection gate electrode FC1. The selection gate electrode FC1 has the same function as that of the selection gate electrode FC in the First Embodiment, and hence does not function as a gate electrode of the transistor.

Whereas, in the present Second Embodiment, the memory gate electrode MG is removed, and is replaced with a memory gate electrode MG1. The memory gate electrode MG1 is used as the gate electrode of the memory transistor. For this reason, in the present Second Embodiment, the memory gate electrode MG is a dummy gate electrode (pseudo gate electrode), and can be regarded as a replacement gate electrode or a gate electrode for substitution. The memory gate electrode MG1 can be regarded as a gate electrode forming the memory transistor.

Further, in the present Second Embodiment, the selection gate electrode SG is removed, and is replaced with a selection gate electrode SG1. The selection gate electrode SG1 is used as the gate electrode of the selection transistor. For this reason, in the present Second Embodiment, the selection gate electrode SG is a dummy gate electrode (pseudo gate electrode), and can be regarded as a replacement gate electrode or a gate electrode for substitution. The selection gate electrode SG1 can be regarded as a gate electrode forming the selection transistor.

The memory gate electrode MG1 and the selection gate electrode SG1 are each formed as a metal gate electrode. This can produce advantages of suppressing the depletion phenomenon of the memory gate electrode MG1 and the selection gate electrode SG1, and being able to eliminate the parasitic capacitance.

Figure 50:
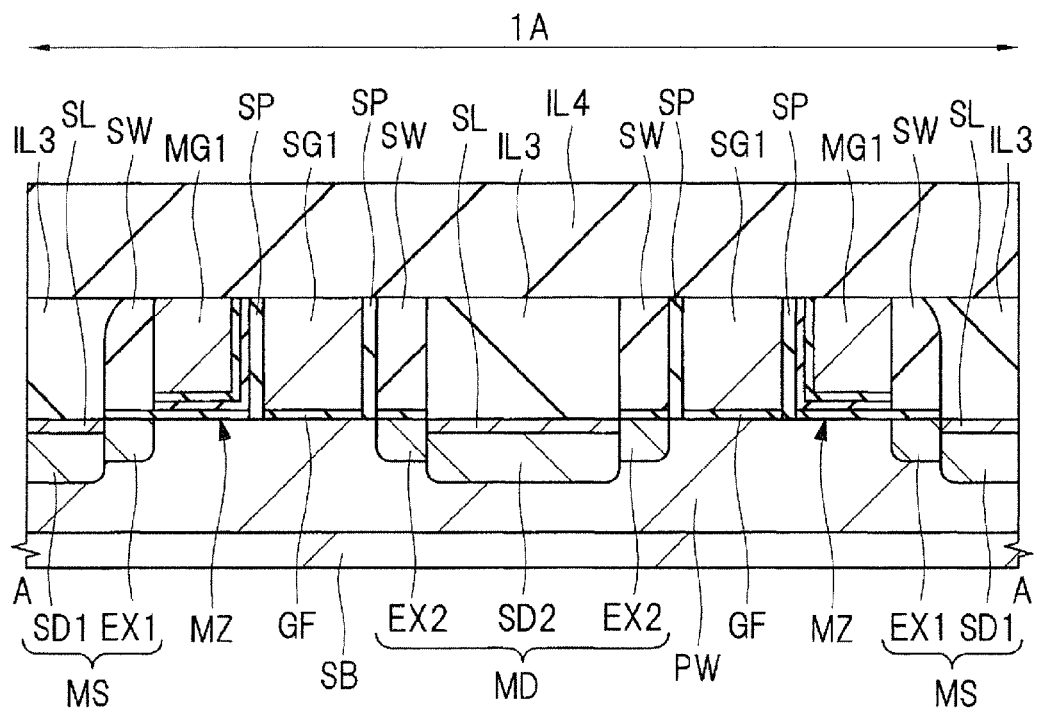
FIG. 50 is an essential part cross sectional view of the semiconductor device during a manufacturing step following FIG. 48.
Figure 51:
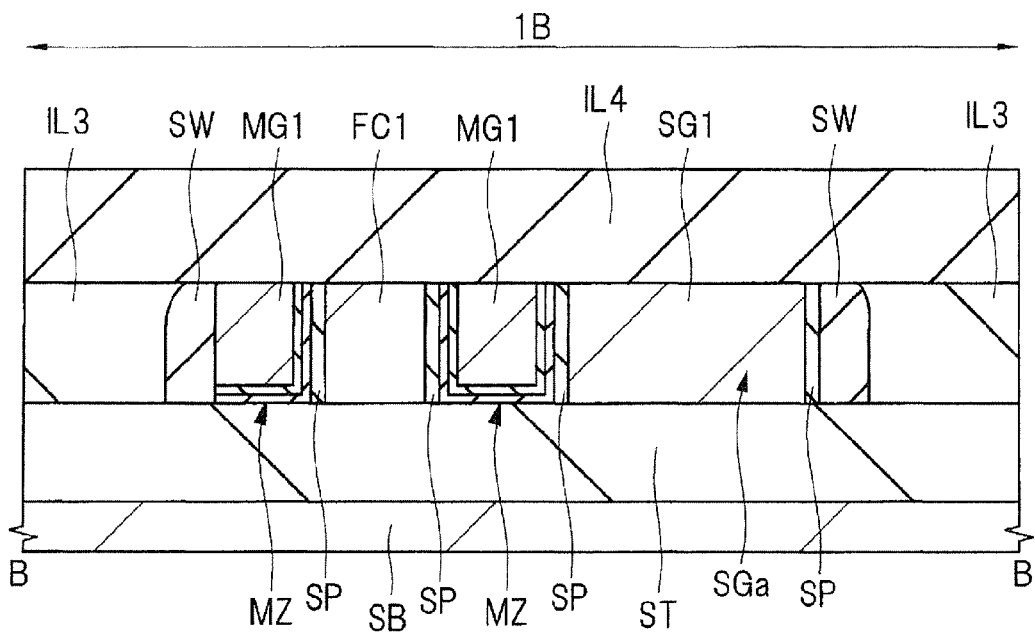
FIG. 51 is an essential part cross sectional view of the same semiconductor device as in FIG. 50 during a manufacturing step.
Figure 52:
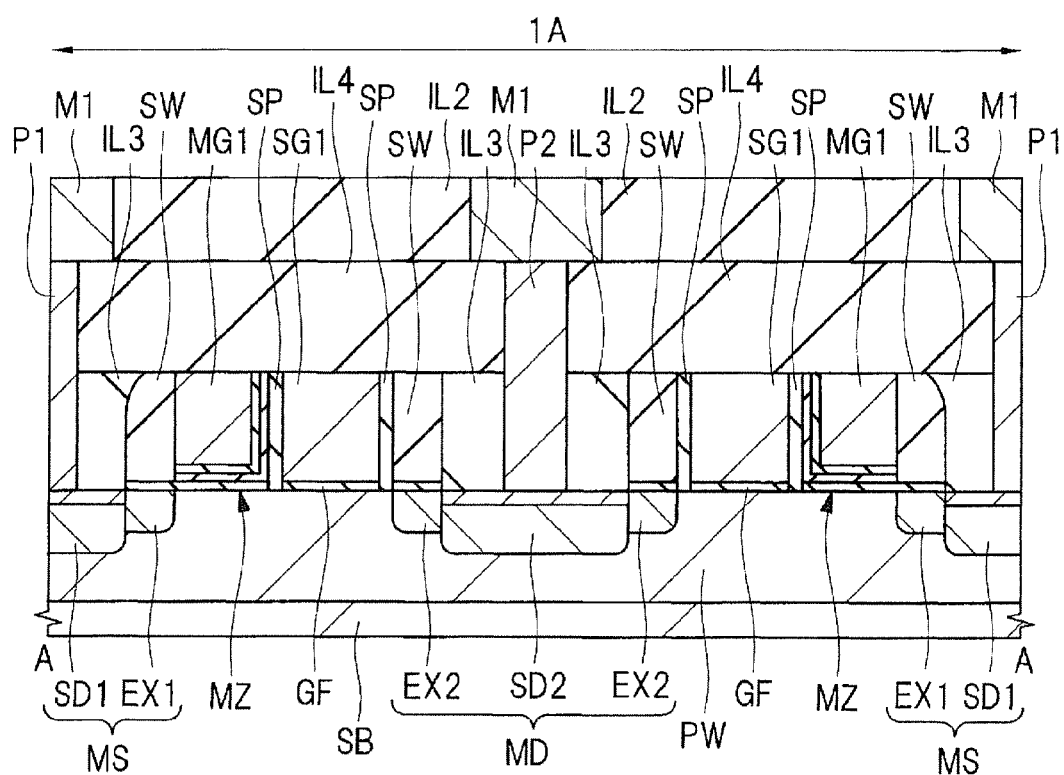
FIG. 52 is an essential part cross sectional view of the semiconductor device during a manufacturing step following FIG. 50.

Then, as shown in FIGS. 50 and 52, entirely over the main surface of the semiconductor substrate SB, namely, over the interlayer insulation film IL3, an interlayer insulation film IL4 is formed (deposited) as an insulation film in such a manner as to cover the memory gate electrode MG1, the selection gate electrode SG1, and the selection gate electrode FC1.

As the interlayer insulation film IL4, for example, a silicon oxide type insulation film mainly including a silicon oxide can be used. After the formation of the interlayer insulation film IL4, the top surface of the interlayer insulation film IL4 is polished by a CMP method, or subjected to other treatments. As a result, the flatness of the top surface of the interlayer insulation film IL4 can be enhanced.

Figure 53:
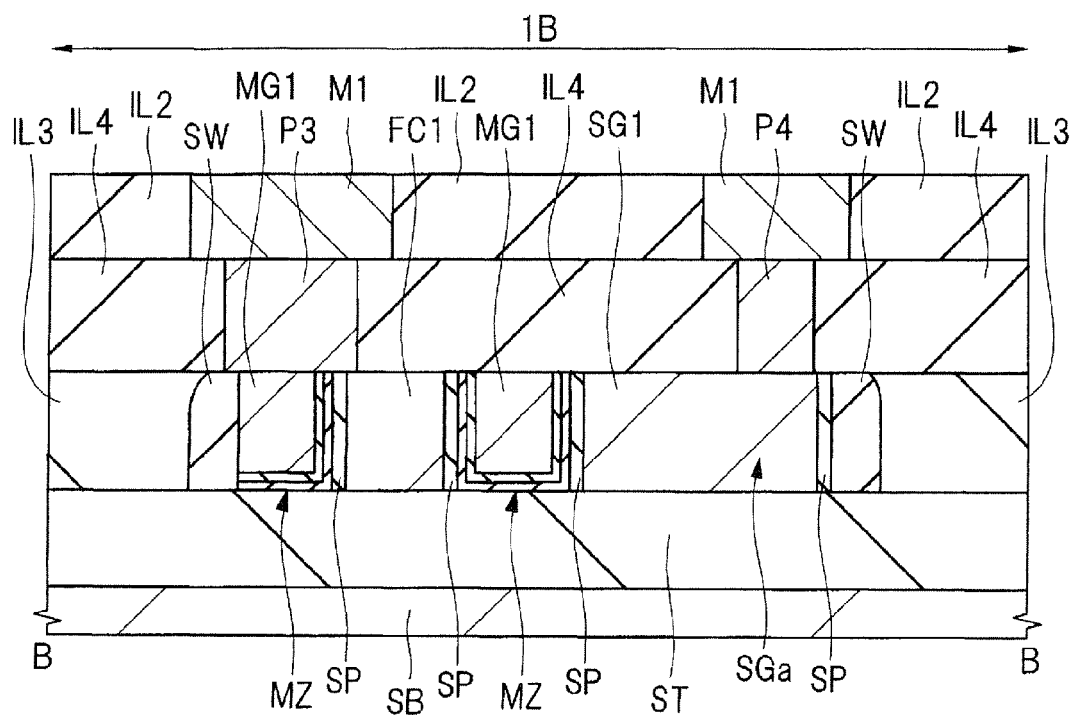
FIG. 53 is an essential part cross sectional view of the same semiconductor device as in FIG. 52 during a manufacturing step.

Then, as shown in FIGS. 52 and 53, using a photolithography method and an etching method, contact holes are formed in the interlayer insulation films IL4 and IL3. The formation method and the formation positions of the contact holes in the present Second Embodiment are also basically the same as those of the First Embodiment.

Then, conductive plugs P1, P2, P3, and P4 are formed in the contact holes, respectively. The formation method and the formation positions of the plugs P1, P2, P3, and P4 in the present Second Embodiment are also basically the same as those of the First Embodiment. The memory gate electrode MG was replaced with the memory gate electrode MG1. For this reason, the plug P3 is electrically coupled with the memory gate electrode MG1. The selection gate electrode SG was replaced with the selection gate electrode SG1. For this reason, the plug P4 is electrically coupled with the selection gate electrode SG1.

Then, also in the present Second Embodiment, as in the First Embodiment, over the interlayer insulation film IL4 including the plugs P1, P2, P3, and P4 embedded therein, an insulation film IL2 is formed. A wire trench is formed in the insulation film IL2, and a wire M1 is formed in the wire trench. Then, interlayer insulation films and wires at still higher layers are formed, but are herein not shown and not described.

The semiconductor device manufactured in the present Second Embodiment is different in the following points from the semiconductor device of the First Embodiment. Namely, in the present Second Embodiment, the memory gate electrode MG is replaced with the memory gate electrode MG1; the selection gate electrode SG is replaced with the selection gate electrode SG1; and the selection gate electrode FC is replaced with the selection gate electrode FC1. Further, in the present Second Embodiment, the cap insulation films CP and CP1 have been removed. Accordingly, over the selection gate electrodes SG1 and FC1, the equivalents of the cap insulation films (CP and CP1) are not formed. Further, in the present Second Embodiment, in place of the interlayer insulation film IL1, a lamination film of the interlayer insulation film IL3 and the interlayer insulation film IL4 is formed. As for others, the semiconductor device of the present Second Embodiment also basically has the same configuration as that of the First Embodiment. Accordingly, a repeated description thereon is herein omitted.

In the present Second Embodiment, in addition to the effects obtainable in the First Embodiment, the following effects can also be further obtained.

Namely, in the present Second Embodiment, in the etching step of FIGS. 44 and 45, the selection gate electrode SG, the memory gate electrode MG, and the selection gate electrode FC are removed. The following case is assumed: at this step, as distinct from the present Second Embodiment, over the side surface of the selection gate electrode SG, and over the side surface of the selection gate electrode FC, the insulation film SP was not formed. In this case, when the selection gate electrode SG, the memory gate electrode MG, and the selection gate electrode FC are removed in the etching step of FIGS. 44 and 45, only the insulation film MZ is interposed between the trench TR1 and the trench TR2; whereas, only the insulation film MZ is interposed between the trench TR1 and the trench TR3. Namely, the insulation film MZ forms the partition wall between the trench TR1 and the trench TR2, and further forms the partition wall between the trench TR1 and the trench TR3. However, when the thickness of the insulation film MZ is small, the insulation films MZ interposed between the trench TR1 and the trench TR2, and between the trench TR1 and the trench TR3 are deformed, and may be collapsed at worst. This results in that the memory gate electrode MG1, the selection gate electrode SG1, and the selection gate electrode FC1 cannot be formed properly subsequently, and hence is required to be prevented.

However, when the thickness of each insulation film MZ interposed between the trench TR1 and the trench TR2, and between the trench TR1 and the trench TR3 is increased, the thickness of the insulation film MZ interposed between the memory gate electrode MG1 and the semiconductor substrate SB also increases. This affects the operation of the nonvolatile memory. Namely, in consideration of the operation of the nonvolatile memory, the thickness of the insulation film MZ interposed between the semiconductor substrate SB and the memory gate electrode MG1 is set at the optimum thickness. This also necessarily defines the thickness of the insulation films MZ interposed between the trench TR1 and the trench TR2, and between the trench TR1 and the trench TR3. For this reason, it is difficult to increase the thickness of each insulation film MZ interposed between the trench TR1 and the trench TR2, and between the trench TR1 and the trench TR3.

In contrast, in the present Second Embodiment, the insulation films SP are formed as sidewall insulation films over the side surface of the selection gate electrode SG, and over the side surface of the selection gate electrode FC. Accordingly, in the etching step of FIGS. 44 and 45, the selection gate electrode SG, the memory gate electrode MG, and the selection gate electrode FC are removed. This results in that a lamination film of the insulation film SP and the insulation film MZ is interposed between the trench TR1 and the trench TR2, and that a lamination film of the insulation film SP and the insulation film MZ is also interposed between the trench TR1 and the trench TR3. Namely, the lamination film of the insulation film SP and the insulation film MZ forms the partition wall between the trench TR1 and the trench TR2, and forms the partition wall between the trench TR1 and the trench TR3. The insulation film SP is present, so that the thickness of each insulation film (herein, the lamination film of the insulation film SP and the insulation film MZ) interposed between the trench TR1 and the trench TR2, and between the trench TR1 and the trench TR3 increases by that much. This can prevent the insulation film (herein, the lamination film of the insulation film SP and the insulation film MZ) interposed between the trench TR1 and the trench TR2, and between the trench TR1 and the trench TR3 from being deformed, or being collapsed. As a result, it becomes possible to form the memory gate electrode MG1, the selection gate electrode SG1, and the selection gate electrode FC1 with more precision. Therefore, it is possible to improve the manufacturing yield of the semiconductor device. Further, the semiconductor device becomes more likely to be manufactured, which facilitates control of the manufacturing steps.

For this reason, also in the present Second Embodiment, as in the First Embodiment, at the stage before performing the etching step of FIGS. 44 and 45, the total thickness T2 of the insulation film SP and the insulation film MZ interposed between the selection gate electrode SG and the memory gate electrode MG is set larger than the thickness T1 of the insulation film MZ interposed between the semiconductor substrate SB and the memory gate electrode MG (T1<T2). Then, this relationship is kept even when the memory gate electrode MG1, the selection gate electrode SG1, and the selection gate electrode FC1 are formed. Namely, the total thickness (T2) of the insulation film SP and the insulation film MZ interposed between the selection gate electrode SG1 and the memory gate electrode MG1 is larger than the thickness (T1) of the insulation film MZ interposed between the semiconductor substrate SB and the memory gate electrode MG1 (T1<T2).

Up to this point, the invention completed by the present inventors was specifically described by way of the embodiments. However, it is naturally understood that the present invention is not limited to the embodiments, and can be variously changed within the scope not departing from the gist thereof.

What is claimed is:

1. A semiconductor device, comprising:
a semiconductor substrate;
a first gate electrode for a memory cell of a nonvolatile memory formed over the semiconductor substrate;
a first sidewall insulation film formed over a first side surface of the first gate electrode;
a second sidewall insulation film formed over a second side surface of the first gate electrode opposite to the first side surface thereof;
a second gate electrode for the memory cell of the nonvolatile memory, formed on the first side surface side of the first gate electrode, and extending together with the first gate electrode over the semiconductor substrate;
a first gate insulation film formed between the first gate electrode and the semiconductor substrate;
a second gate insulation film having a charge accumulation part, formed between the second gate electrode and the semiconductor substrate;
a first sidewall spacer formed over the second side surface of the first gate electrode via the second sidewall insulation film; and
a second sidewall spacer formed over a third side surface of the second gate electrode opposite to the side thereof adjacent to the first gate electrode,
wherein the second gate insulation film is formed between the semiconductor substrate and the second gate electrode, and between the first gate electrode and the second gate electrode,
wherein the first gate electrode and the second gate electrode are adjacent to each other via the first sidewall insulation film and the second gate insulation film,
wherein between the first gate electrode and the second gate electrode, the first sidewall insulation film is situated on the first gate electrode side, and the second gate insulation film is situated on the second gate electrode side,
wherein the first sidewall insulation film is not formed under the second gate electrode,
wherein the first sidewall insulation film and the second sidewall insulation film are integrally formed and coupled to each other,
wherein a total second thickness of the first sidewall insulation film and the second gate insulation film interposed between the first gate electrode and the second gate electrode is larger than a first thickness of the second gate insulation film interposed between the semiconductor substrate and the second gate electrode,
wherein the first and second sidewall insulation films are coupled to each other by additional sidewall insulation films, and
wherein the first and second sidewall insulation films together with the additional sidewall insulation films form a continuous insulation film that surrounds the first gate electrode in plan view.

2. The semiconductor device according to claim 1,
wherein the second gate insulation film at a portion thereof interposed between the second gate electrode and the semiconductor substrate has a first insulation film over the semiconductor substrate, a second insulation film over the first insulation film, and a third insulation film over the second insulation film,
wherein the second insulation film functions as the charge accumulation part, and
wherein respective band gaps of the first insulation film and the third insulation film are larger than the band gap of the second insulation film.

3. The semiconductor device according to claim 2,
wherein the first insulation film, the first sidewall insulation film, and the second sidewall insulation film are formed of the same material.

4. The semiconductor device according to claim 2,
wherein respective band gaps of the first sidewall insulation film and the second sidewall insulation film are larger than the band gap of the second insulation film.

5. The semiconductor device according to claim 2,
wherein the first insulation film, the first sidewall insulation film, and the second sidewall insulation film are each formed of a silicon oxide.

6. The semiconductor device according to claim 2, wherein the first insulation film is also formed between the second sidewall spacer and the semiconductor substrate.

7. The semiconductor device according to claim 1, wherein the first gate electrode is formed of a semiconductor film in contact with the first gate insulation film.

8. The semiconductor device according to claim 7, wherein the second gate electrode is formed of a semiconductor film in contact with the second gate insulation film.

9. The semiconductor device according to claim 8, wherein an uppermost portion of the semiconductor film forming the second gate electrode is higher than an uppermost portion of the semiconductor film forming the first gate electrode with respect to the semiconductor substrate.

10. The semiconductor device according to claim 1,
wherein the second gate insulation film at a portion thereof interposed between the second gate electrode and the semiconductor substrate has a first insulation film over the semiconductor substrate, a second insulation film over the first insulation film, and a third insulation film over the second insulation film,
wherein the first insulation film, the third insulation film, the first sidewall insulation film, and the second sidewall insulation film are each formed of a silicon oxide, and
wherein the second insulation film is formed of a silicon nitride.

11. The semiconductor device according to claim 10,
wherein the second gate insulation film at a portion thereof interposed between the first gate electrode and the second gate electrode has the second insulation film and the third insulation film, and does not have the first insulation film.

12. The semiconductor device according to claim 1, wherein a cap insulation film has a bottom surface in contact with the first gate electrode, and has side surfaces in contact with the first and second sidewall insulation films, respectively.

13. The semiconductor device according to claim 12, wherein the cap insulation film includes silicon nitride.

14. The semiconductor device according to claim 1, further comprising:

a first semiconductor region of a first conductivity type, formed in the semiconductor substrate under the first sidewall spacer;
a second semiconductor region with a higher impurity concentration than that of the first semiconductor region, and of the first conductivity type, formed adjacent to the first semiconductor region in the semiconductor substrate;
a third semiconductor region of the first conductivity type, formed in the semiconductor substrate under the second sidewall spacer; and
a fourth semiconductor region with a higher impurity concentration than that of the third semiconductor region, and of the first conductivity type, formed adjacent to the third semiconductor region in the semiconductor substrate.

15. A semiconductor device, comprising:
a semiconductor substrate;
a first gate electrode for a memory cell of a nonvolatile memory formed over the semiconductor substrate;
a first sidewall insulation film formed over a first side surface of the first gate electrode;
a second sidewall insulation film formed over a second side surface of the first gate electrode opposite to the first side surface thereof;
a second gate electrode for the memory cell of the nonvolatile memory, formed on the first side surface side of the first gate electrode, and extending together with the first gate electrode over the semiconductor substrate;
a first gate insulation film formed between the first gate electrode and the semiconductor substrate;
a second gate insulation film having a charge accumulation part, formed between the second gate electrode and the semiconductor substrate;
a first sidewall spacer formed over the second side surface of the first gate electrode via the second sidewall insulation film;
a second sidewall spacer formed over a third side surface of the second gate electrode opposite to the side thereof adjacent to the first gate electrode;
a dummy gate electrode arranged apart from the first gate electrode, and on the side facing the first side surface of the first gate electrode over the semiconductor substrate; and
a third sidewall insulation film formed over a fourth side surface of the dummy gate electrode facing the first gate electrode,
wherein the second gate insulation film is formed between the semiconductor substrate and the second gate electrode, and between the first gate electrode and the second gate electrode,
wherein the first gate electrode and the second gate electrode are adjacent to each other via the first sidewall insulation film and the second gate insulation film,
wherein between the first gate electrode and the second gate electrode, the first sidewall insulation film is situated on the first gate electrode side, and the second gate insulation film is situated on the second gate electrode side,
wherein the first sidewall insulation film is not formed under the second gate electrode,
wherein the first sidewall insulation film and the second sidewall insulation film are integrally formed,
wherein a total second thickness of the first sidewall insulation film and the second gate insulation film interposed between the first gate electrode and the second gate electrode is larger than a first thickness of the second gate insulation film interposed between the semiconductor substrate and the second gate electrode, wherein the second gate electrode is formed in a region between the first gate electrode and the dummy gate electrode, and surrounds the dummy gate electrode in plan view, wherein the third sidewall insulation film and the second gate insulation film are interposed between the dummy gate electrode and the second gate electrode, and wherein the third sidewall insulation film is not formed under the second gate electrode.

16. The semiconductor device according to claim 15, wherein the dummy gate electrode and the first gate electrode are separated from each other, but are formed of a common conductive film, and wherein the third sidewall insulation film and the first sidewall insulation film are separated from each other, but are formed of a common insulation film.

17. The semiconductor device according to claim 16, further comprising:

an interlayer insulation film formed over the semiconductor substrate in such a manner as to cover the first gate electrode, the second gate electrode, the dummy gate electrode, the first sidewall insulation film, the second sidewall insulation film, the third sidewall insulation film, the first sidewall spacer, and the second sidewall spacer; and a first conductive plug embedded in the interlayer insulation film, wherein the first conductive plug is arranged over the second gate electrode at a portion thereof formed around the dummy gate electrode, and is electrically coupled with the second gate electrode.

18. The semiconductor device according to claim 17, further comprising:

an element isolation region formed in the semiconductor substrate, wherein the dummy gate electrode is formed over the element isolation region.

19. The semiconductor device according to claim 17, wherein the first and second sidewall insulation films are coupled to each other by additional sidewall insulation films, and the first and second sidewall insulation films together with the additional sidewall insulation films surround the first gate electrode in plan view.

20. The semiconductor device according to claim 9, wherein the first and second sidewall insulation films are coupled to each other by additional sidewall insulation films, and the first and second sidewall insulation films together with the additional sidewall insulation films surround the first gate electrode in plan view.

* * * * *